United States Patent
Chiang et al.

(10) Patent No.: US 6,699,780 B1
(45) Date of Patent: Mar. 2, 2004

(54) METHOD OF CONNECTING A CONDUCTIVE TRACE TO A SEMICONDUCTOR CHIP USING PLASMA UNDERCUT ETCHING

(75) Inventors: Cheng-Lien Chiang, Taipei (TW); Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 10/302,642

(22) Filed: Nov. 23, 2002

Related U.S. Application Data

(63) Continuation-in-part of application No. 10/261,419, filed on Sep. 30, 2002, which is a continuation-in-part of application No. 09/878,626, filed on Jun. 11, 2001, which is a continuation-in-part of application No. 09/687,619, filed on Oct. 13, 2000, now Pat. No. 6,440,835.

(51) Int. Cl.$^7$ .................................................. H01L 21/44
(52) U.S. Cl. ........................ 438/612; 438/106; 438/618
(58) Field of Search .................................. 438/106, 107, 438/118, 125, 611, 612, 613, 617, 618

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

(List continued on next page.)

*Primary Examiner*—Phuc T. Dang
(74) *Attorney, Agent, or Firm*—David M. Sigmond

(57) ABSTRACT

A method of connecting a conductive trace to a semiconductor chip includes providing a semiconductor chip with upper and lower surfaces, wherein the upper surface includes a conductive pad, providing a conductive trace, then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another, then removing the adhesive between the conductive trace and the pad, and then forming a connection joint that contacts and electrically connects the conductive trace and the pad. Preferably, the adhesive is removed by laser ablation then plasma etching.

200 Claims, 51 Drawing Sheets

U.S. PATENT DOCUMENTS

| | | | |
|---|---|---|---|
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/705 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,258,704 B1 * | 7/2001 | Turner | |
| 6,334,942 B1 | 1/2002 | Haba et al. | 205/122 |

OTHER PUBLICATIONS

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips And Via–Fill".

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before And After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

Schmid et al., "Advantages of Low Pressure Plasma Etching in Addition to the Formation of Microvias," six pages, publication and date unknown.

\* cited by examiner

METHOD OF CONNECTING A CONDUCTIVE TRACE TO A SEMICONDUCTOR CHIP USING PLASMA UNDERCUT ETCHING

CROSS-REFERENCE TO RELATED APPLICATIONS

This application is a continuation-in-part of U.S. application Ser. No. 10/261,419 filed Sep. 30, 2002, which is a continuation-in-part of U.S. application Ser. No. 09/878,626 filed Jun. 11, 2001, which is a continuation-in-part of U.S. application Ser. No. 09/687,619 filed Oct. 13, 2000 (now U.S. Pat. No. 6,440,835), each of which is incorporated by reference.

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed.

Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

In view of the various development stages and limitations in currently available connection joint techniques, there is a need for a method of connecting a conductive trace to a semiconductor chip that is cost-effective, manufacturable, versatile, and makes advantageous use the particular connection joint technique best suited for a given application.

SUMMARY OF THE INVENTION

An object of the present invention is to provide a semiconductor chip assembly with a chip and a conductive trace that provides a low cost, high performance, high reliability package.

Another object of the present invention is to provide a convenient, cost-effective method for manufacturing semiconductor chip assemblies as chip scale packages, chip size packages, grid arrays or other structures.

In accordance with an aspect of the invention, a method of connecting a conductive trace to a semiconductor chip includes providing a semiconductor chip with upper and lower surfaces, wherein the upper surface includes a conductive pad, providing a conductive trace, then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another, then removing the adhesive between the conductive trace and the pad, and then forming a connection joint that contacts and electrically connects the conductive trace and the pad.

The method may include removing the adhesive that covers the pad, thereby forming a gap between the conductive trace and the pad and exposing the pad such that the adhesive covers none of the pad but still contacts and is sandwiched between the conductive trace and the chip.

The method may include removing the adhesive by applying a plasma that etches the adhesive, thereby removing substantially all of the adhesive that covers the pad. Alternatively, the method may include removing the adhesive by applying a laser that ablates the adhesive, thereby removing substantially all of the adhesive that covers the pad and is not sandwiched between the conductive trace and the pad, and then applying a plasma that etches the adhesive, thereby removing substantially all of the adhesive that is sandwiched between the conductive trace and the pad. Preferably, the laser anisotropically etches the adhesive, thereby exposing the pad and providing little or no undercut into the adhesive between the conductive trace and the pad, and then the plasma isotropically etches the adhesive, thereby further exposing the pad and providing complete undercut and removal of the adhesive between the conductive trace and the pad.

The method may include forming the connection joint by depositing the connection joint on the conductive trace and the pad, in which case the connection joint can be an electroplated metal, an electrolessly plated metal, a ball bond, solder or conductive adhesive. Alternatively, the method may include forming the connection joint by advancing the conductive trace towards the pad and welding the conductive trace to the pad, in which case the welding can be performed by thermocompression bonding, thermosonic bonding or ultrasonic bonding.

The method may include attaching the conductive trace to a metal base, then disposing the adhesive between the conductive trace and the chip, then etching the metal base to expose the conductive trace and the adhesive, then removing the adhesive between the conductive trace and the pad, and then forming the connection joint.

An advantage of the present invention is that the semiconductor chip assembly can be manufactured conveniently and cost effectively. Another advantage is that the assembly can include a connection joint made from a wide variety of materials and processes, thereby making advantageous use of mature connection joint technologies in a unique and improved manufacturing approach. Another advantage is that the assembly need not include wire bonds, TAB leads or solder joints, although the process is flexible enough to accommodate these techniques if desired. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
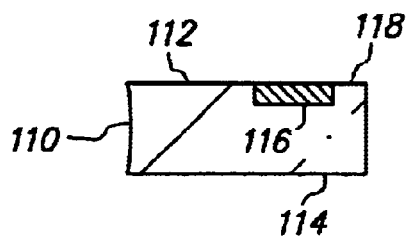
FIGS. 1A–1M are cross-sectional views showing a method of connecting a conductive trace to a semiconductor chip in accordance with a first embodiment of the present invention.
Figure 2A:
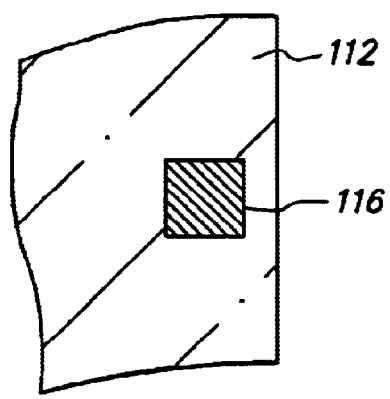
FIGS. 2A–2M are top plan views corresponding to FIGS. 1A–1M, respectively.
Figure 3A:
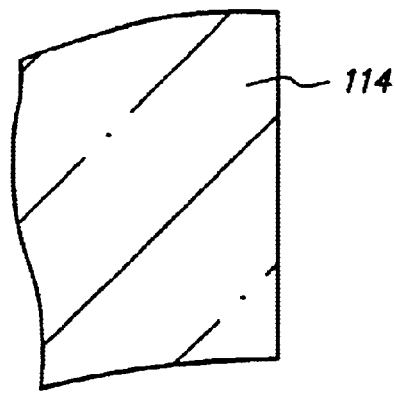
FIGS. 3A–3M are bottom plan views corresponding to FIGS. 1A–1M, respectively.
Figure 1B:
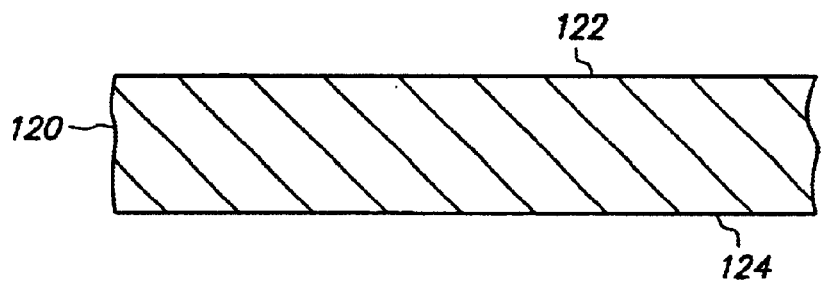
Figure 2B:
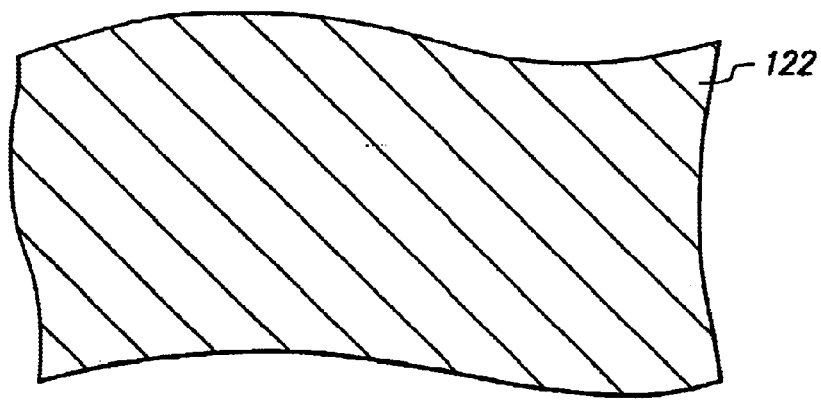
Figure 3B:
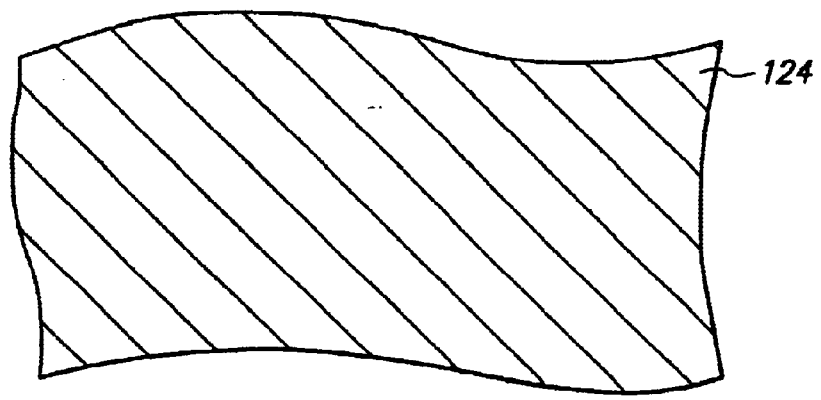
Figure 1C:
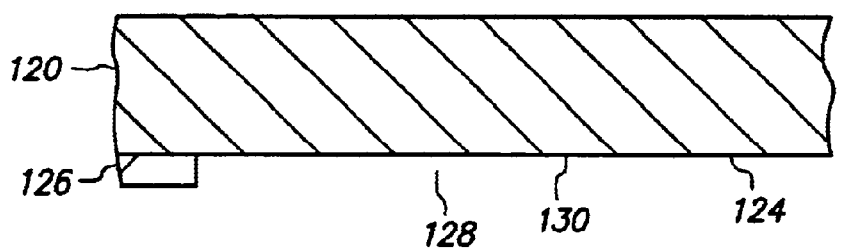
Figure 2C:
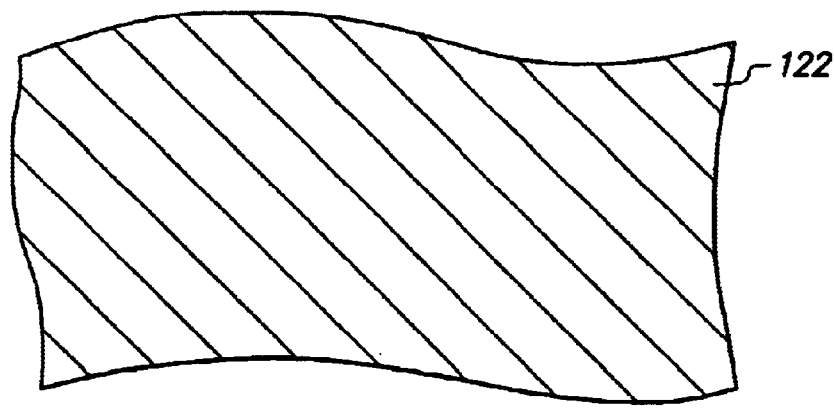
Figure 3C:
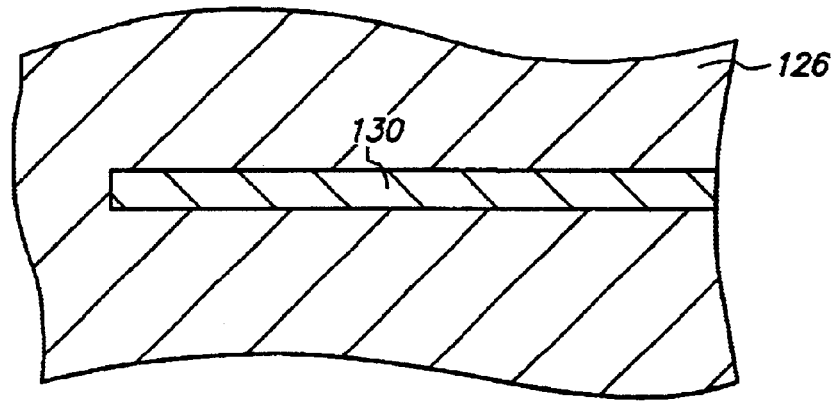
Figure 1D:
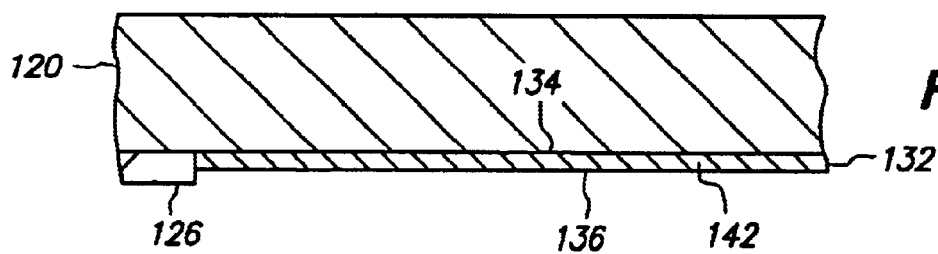
Figure 2D:
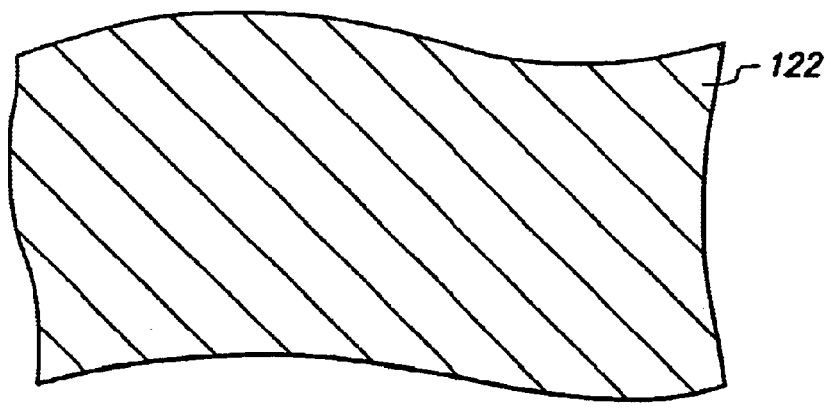
Figure 3D:
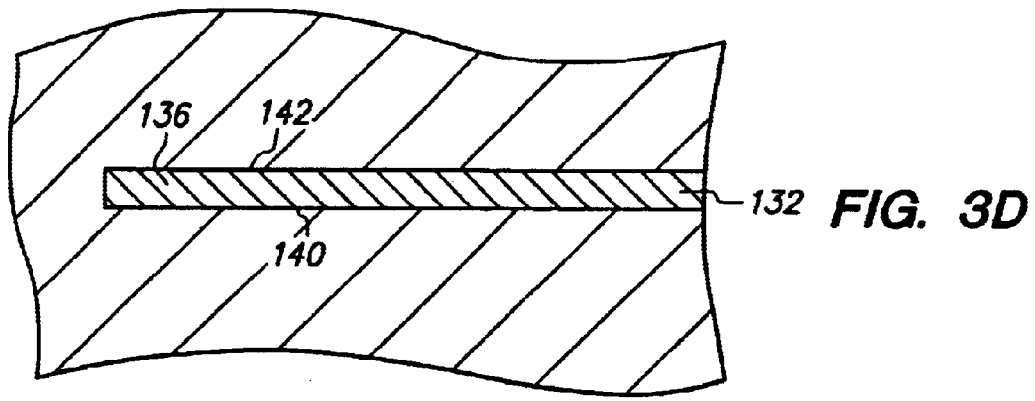
Figure 1E:
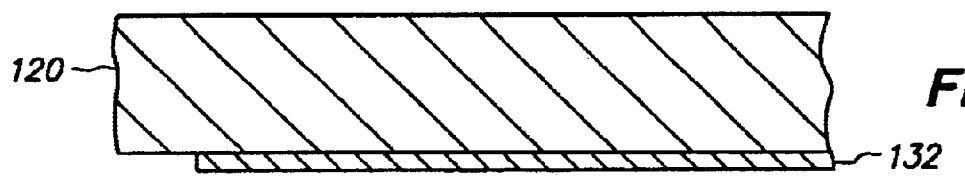
Figure 2E:
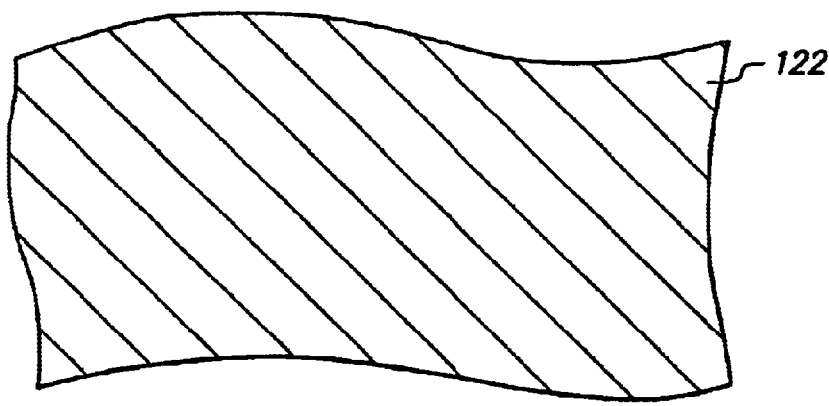
Figure 3E:
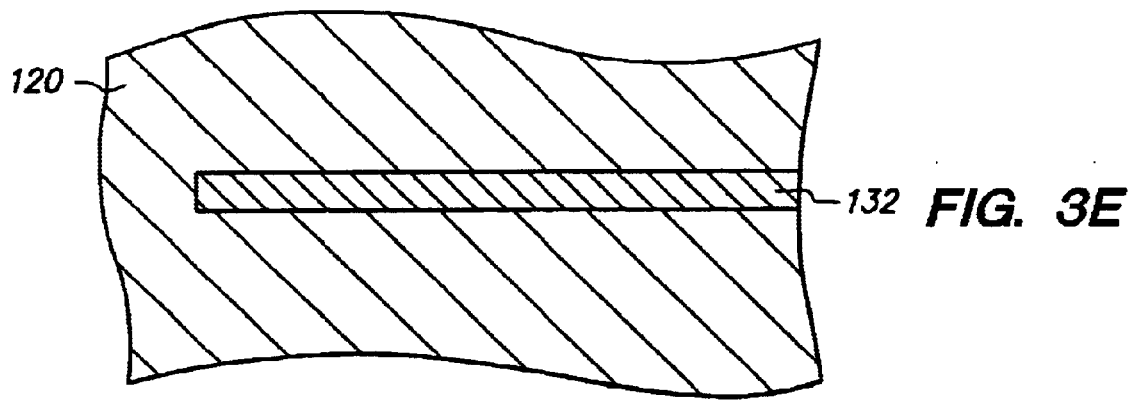
Figure 1F:
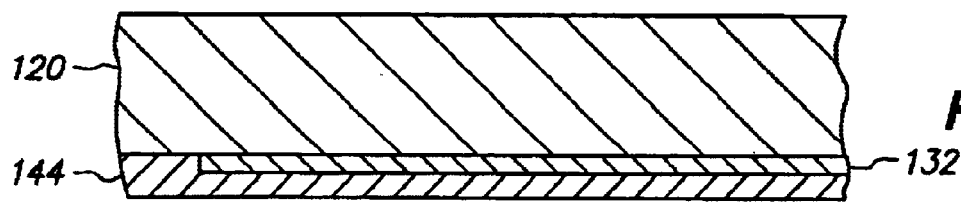
Figure 2F:
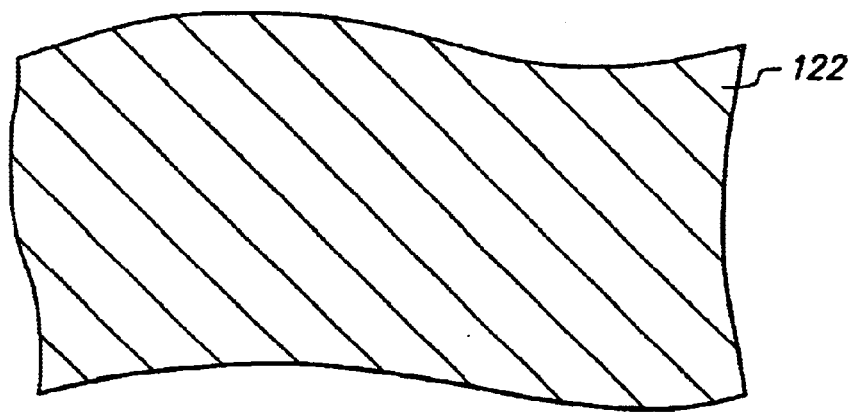
Figure 3F:
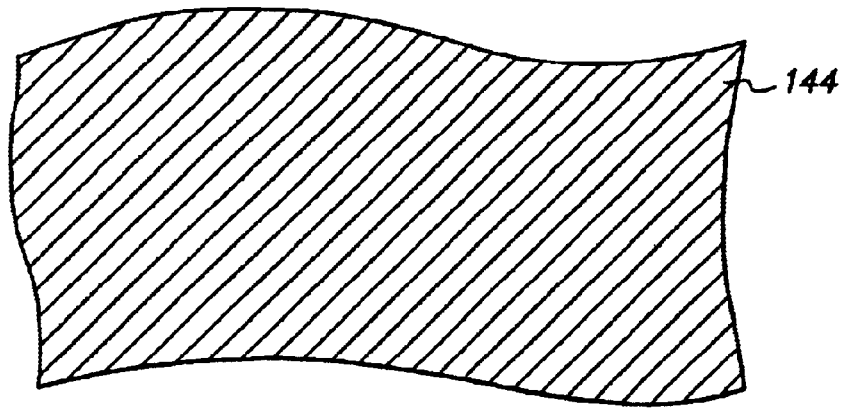
Figure 1G:
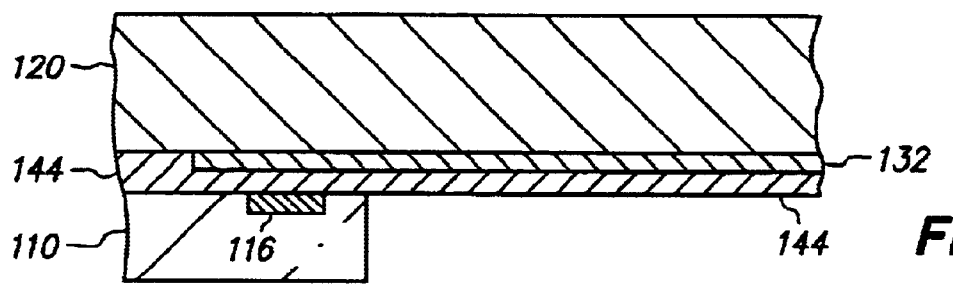
Figure 2G:
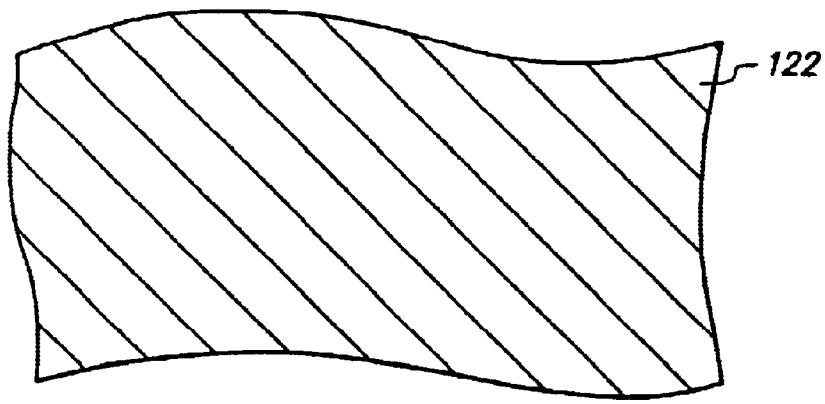
Figure 3G:
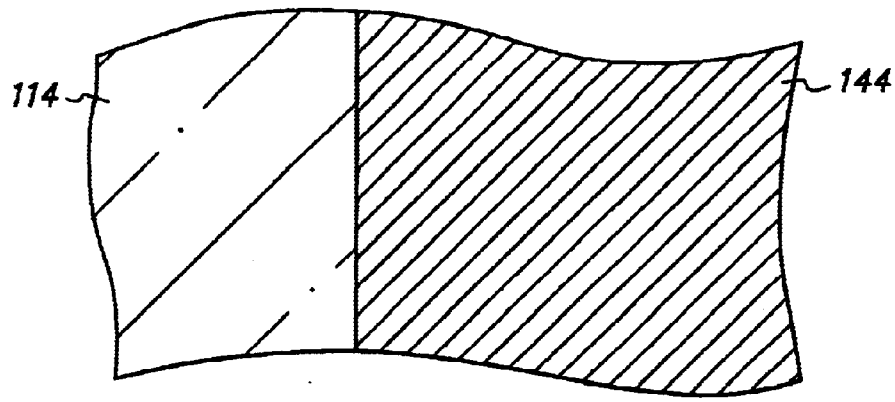
Figure 1H:
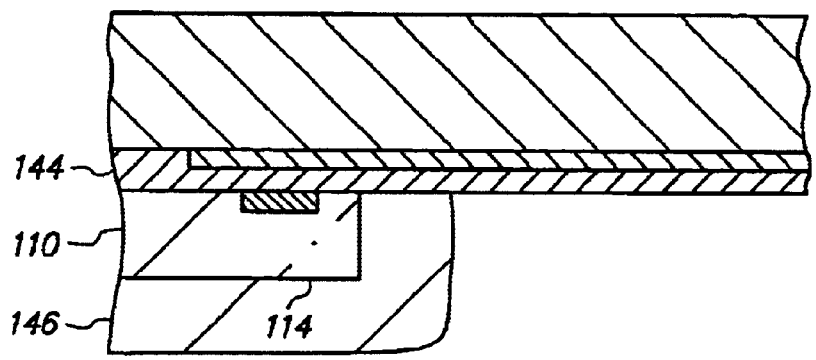
Figure 2H:
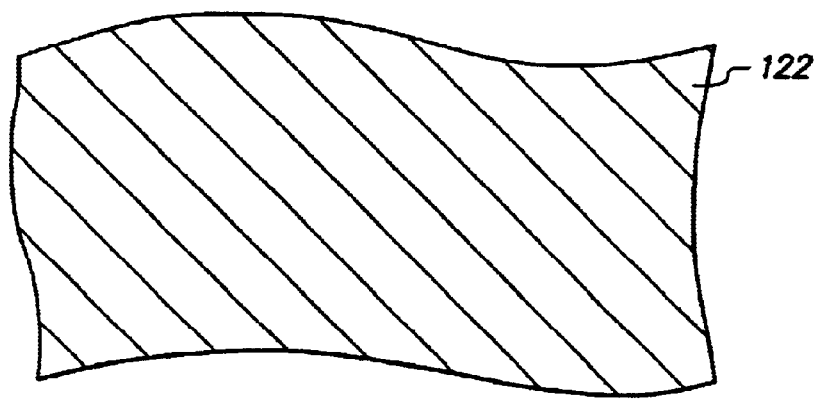
Figure 3H:
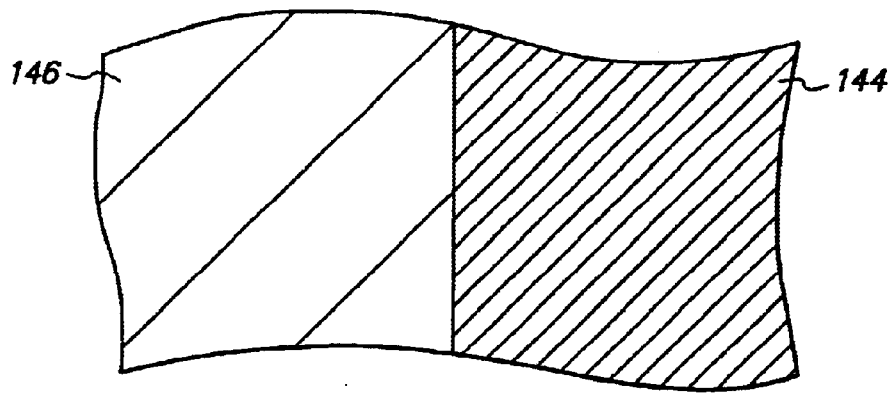
Figure 1I:
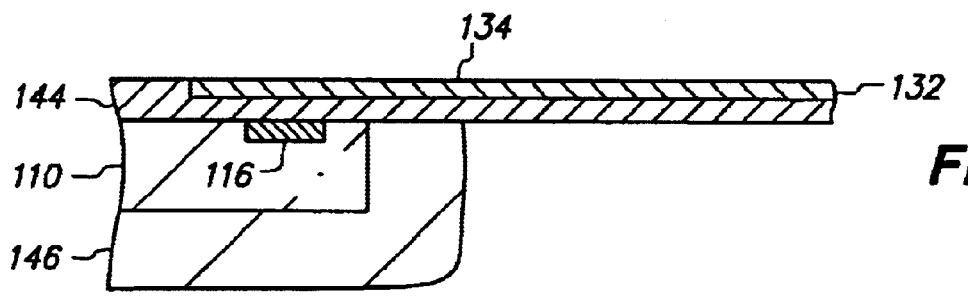
Figure 2I:
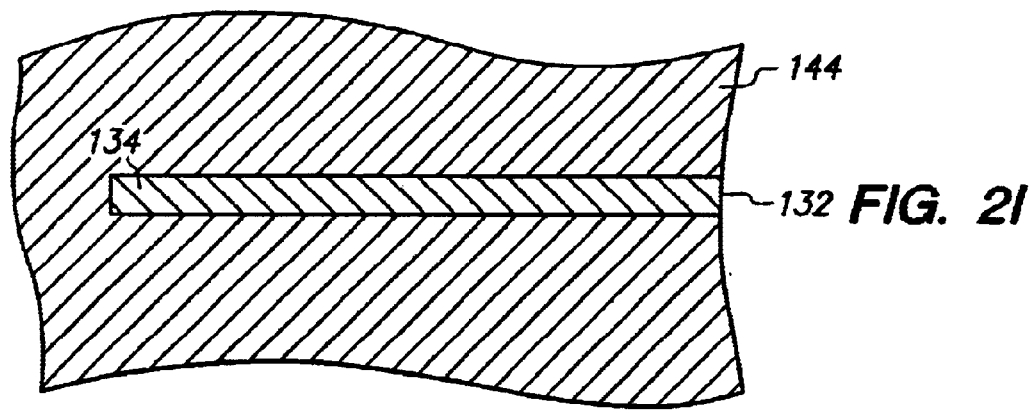
Figure 3I:
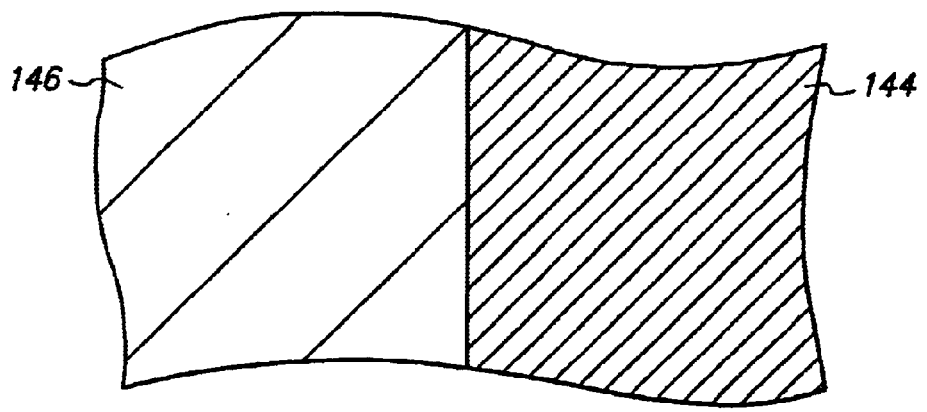
Figure 1J:
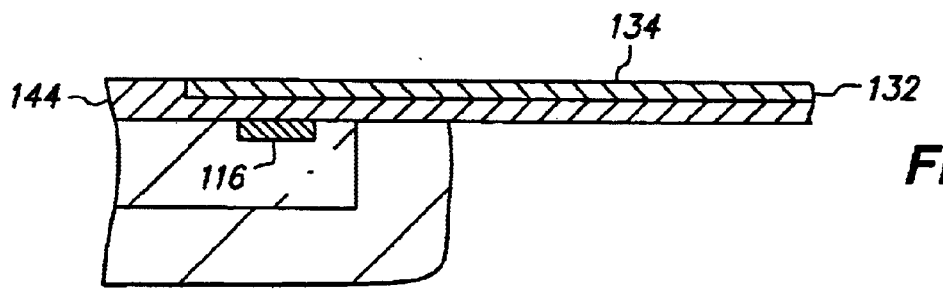
Figure 2J:
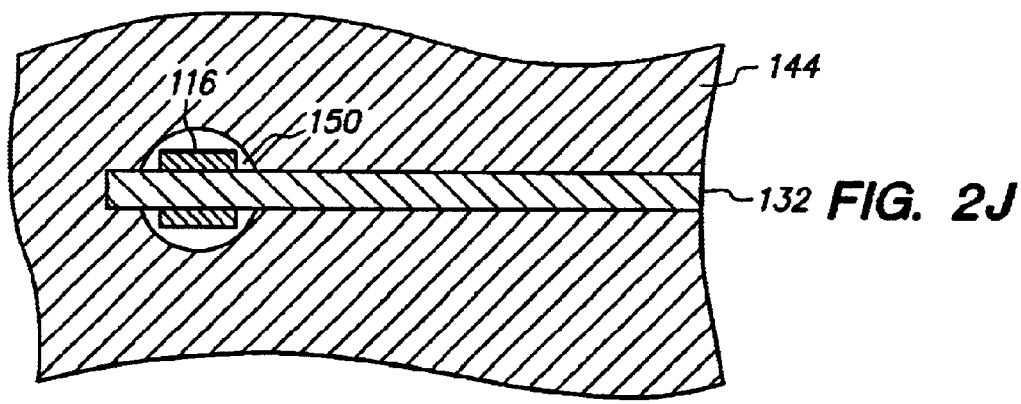
Figure 3J:
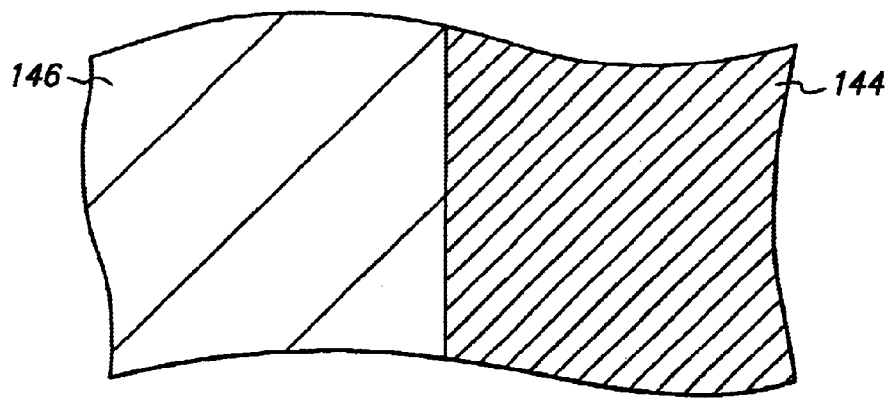
Figure 1K:
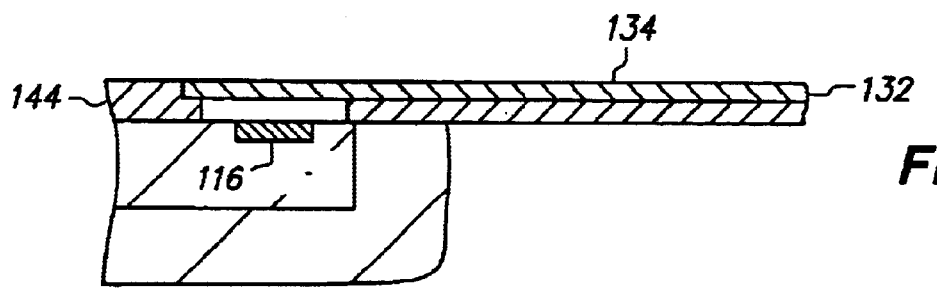
Figure 2K:
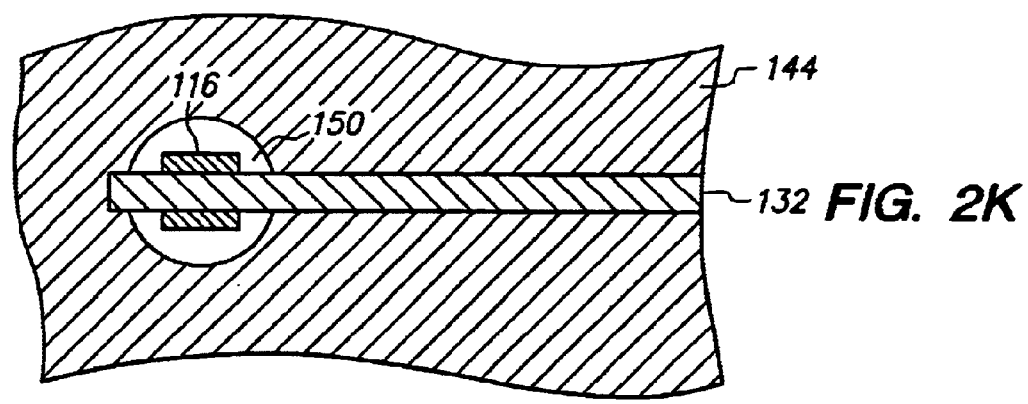
Figure 3K:
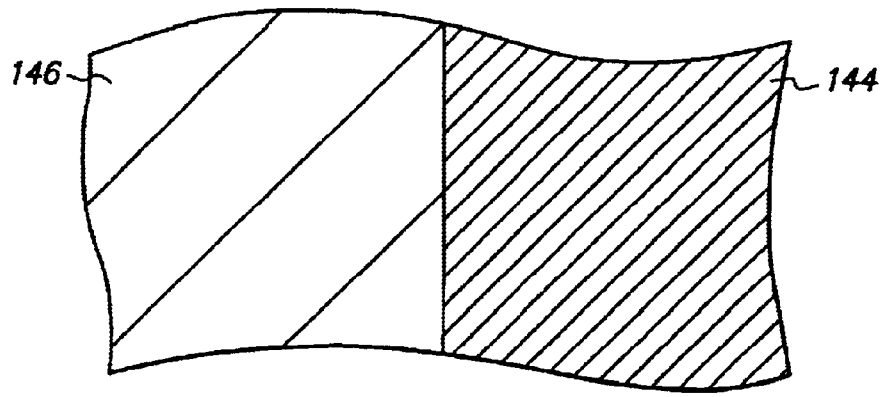
Figure 1L:
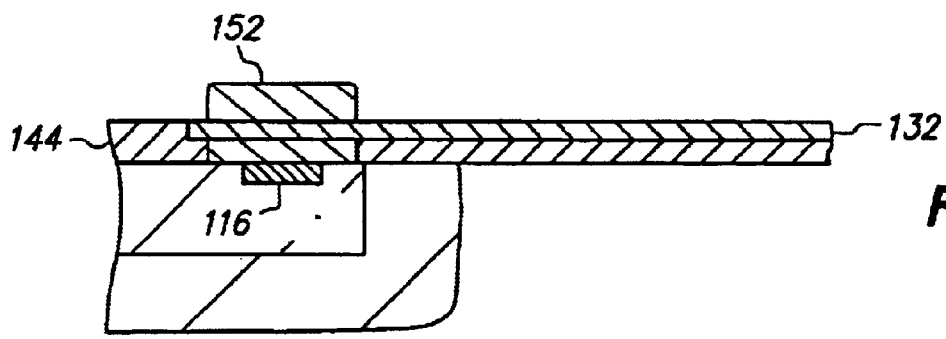
Figure 2L:
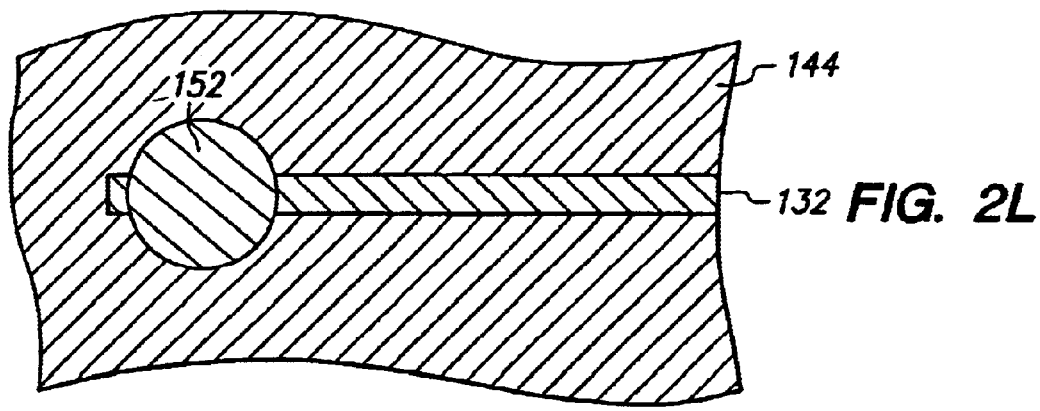
Figure 3L:
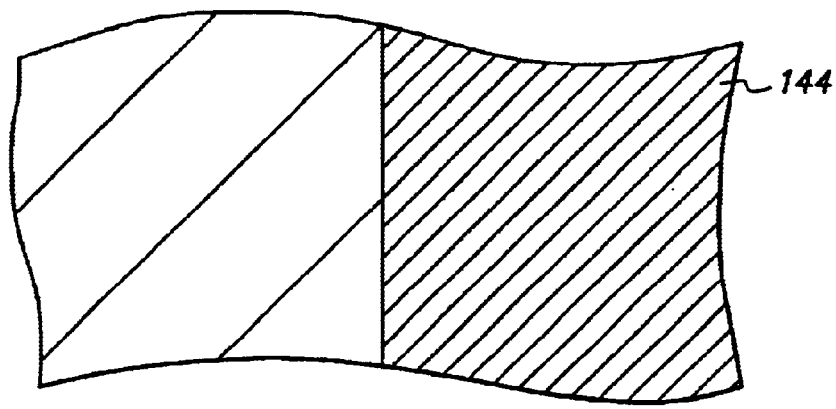
Figure 1M:
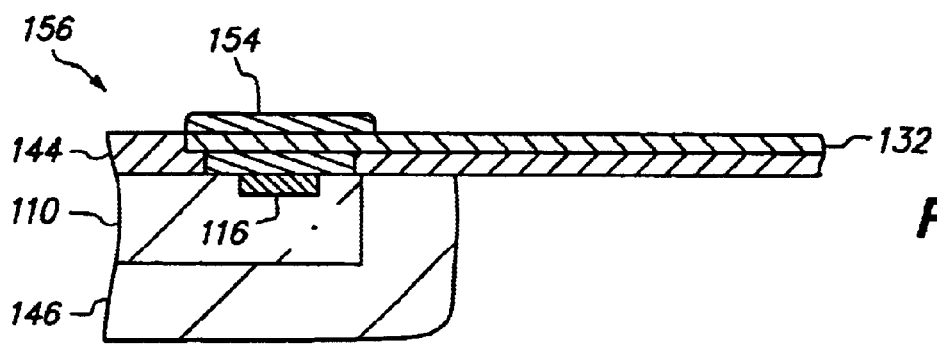
Figure 2M:
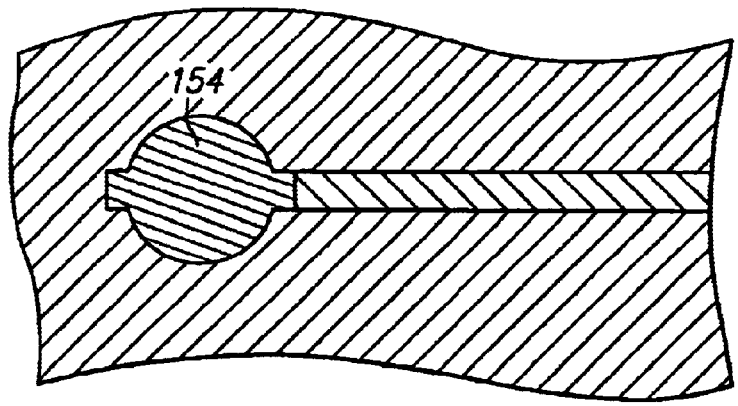
Figure 3M:
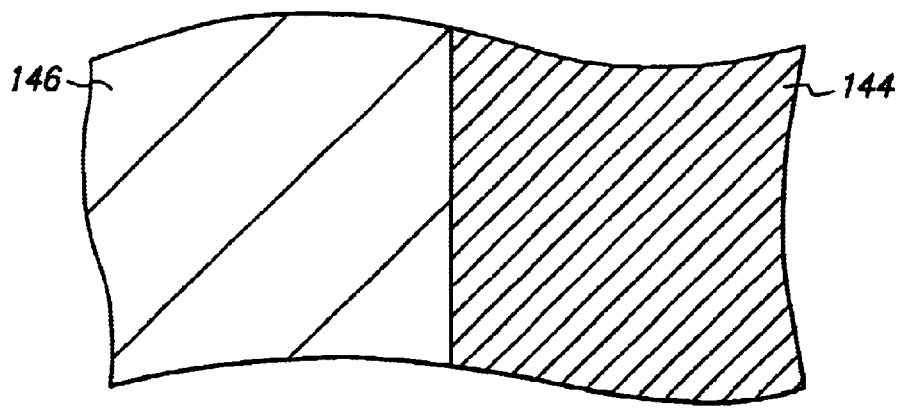
Figure 4A:
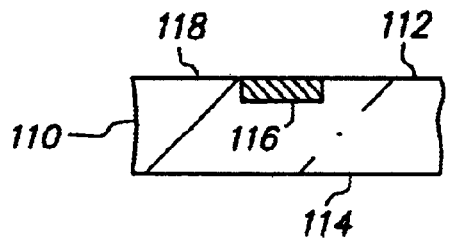
FIGS. 4A–4M are cross-sectional views corresponding to FIGS. 1A–1M, respectively.
Figure 4B:
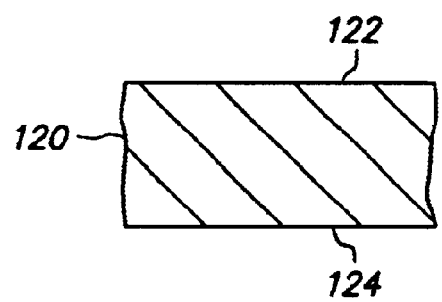
Figure 4C:
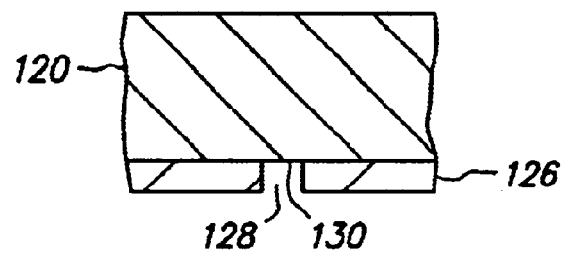
Figure 4D:
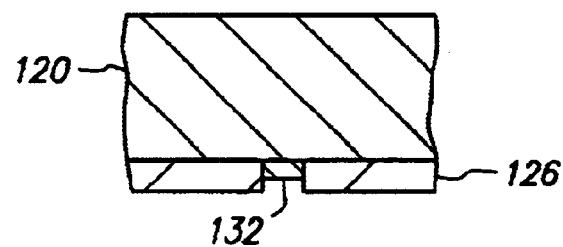
Figure 4E:
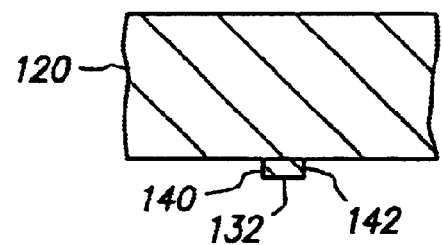
Figure 4F:
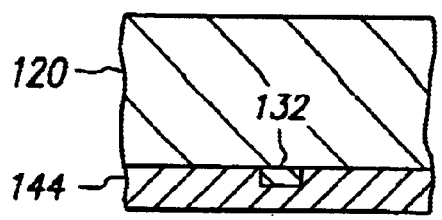
Figure 4G:
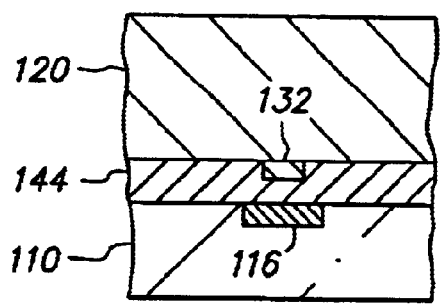
Figure 4H:
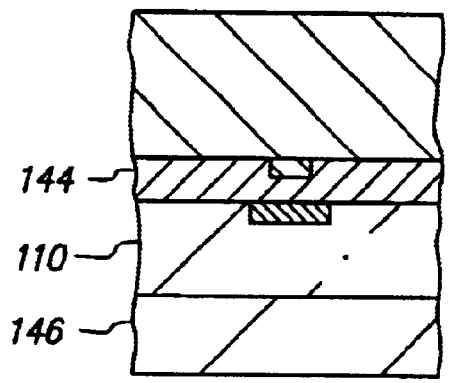
Figure 4I:
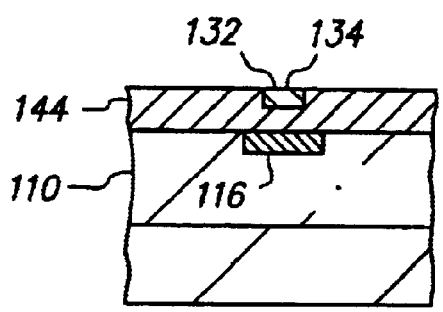
Figure 4J:
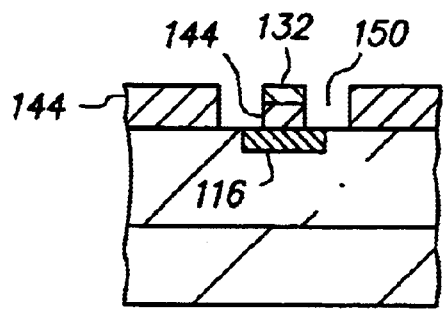
Figure 4K:
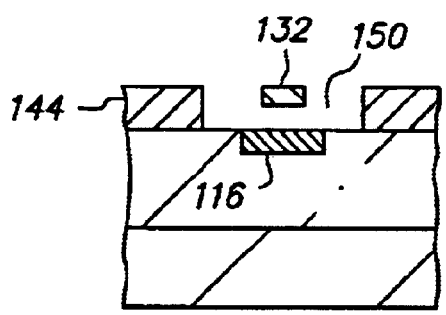
Figure 4L:
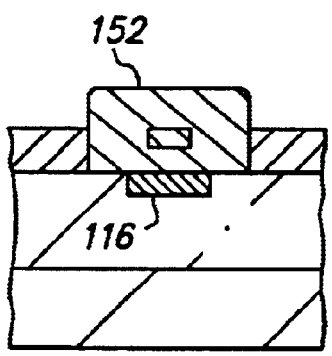
Figure 4M:
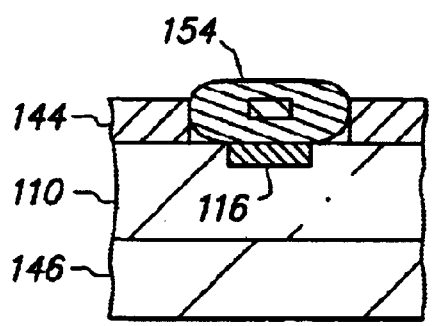
Figure 5A:
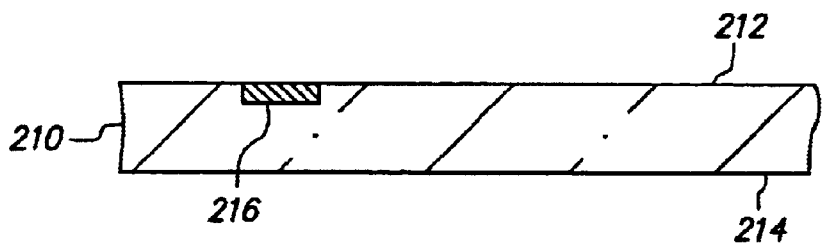
FIGS. 5A–5L are cross-sectional views showing a method of connecting a conductive trace to a semiconductor chip in accordance with a second embodiment of the present invention.
Figure 6A:
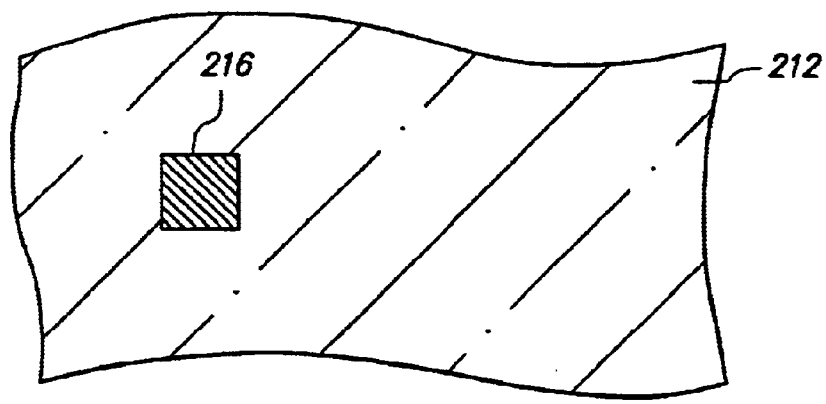
FIGS. 6A–6L are top plan views corresponding to FIGS. 5A–5L, respectively.
Figure 7A:
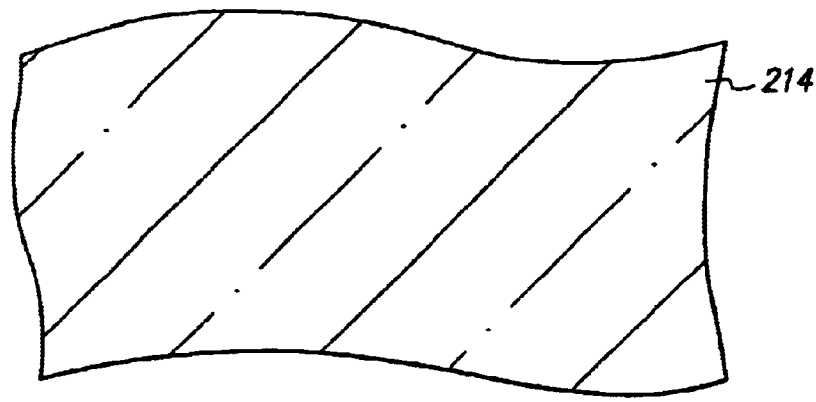
FIGS. 7A–7L are bottom plan views corresponding to FIGS. 5A–5L, respectively.
Figure 5B:
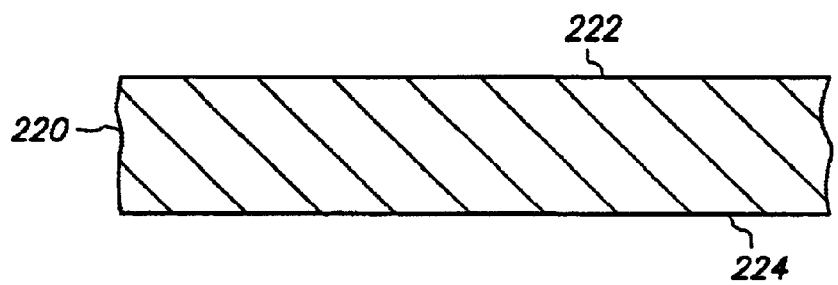
Figure 6B:
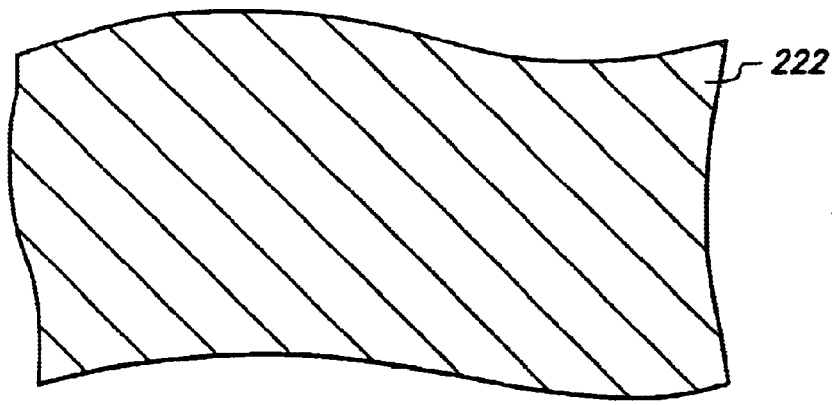
Figure 7B:
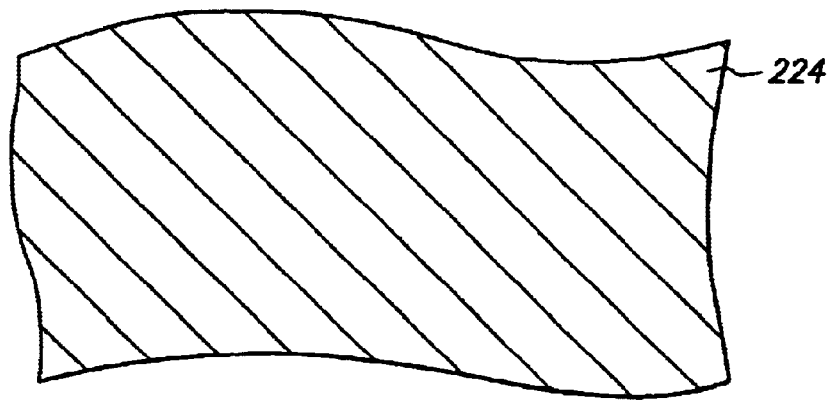
Figure 5C:
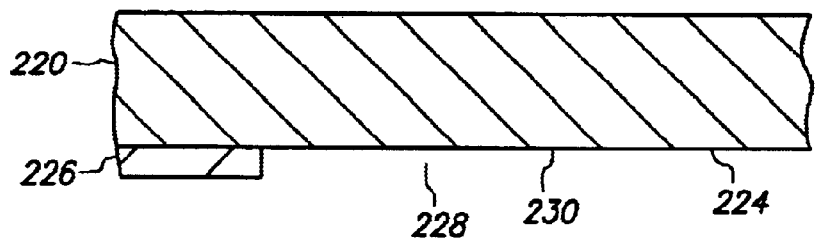
Figure 6C:
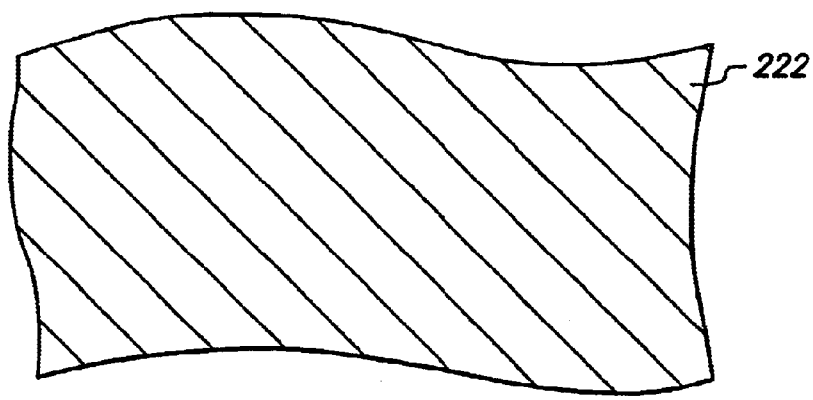
Figure 7C:
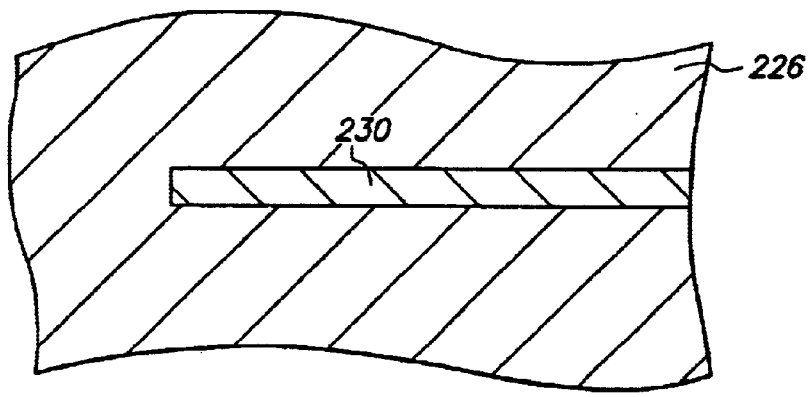
Figure 5D:
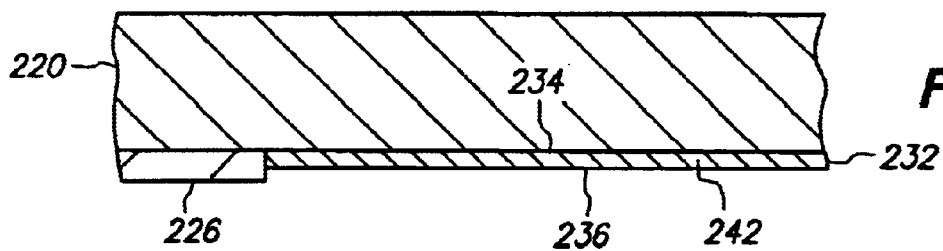
Figure 6D:
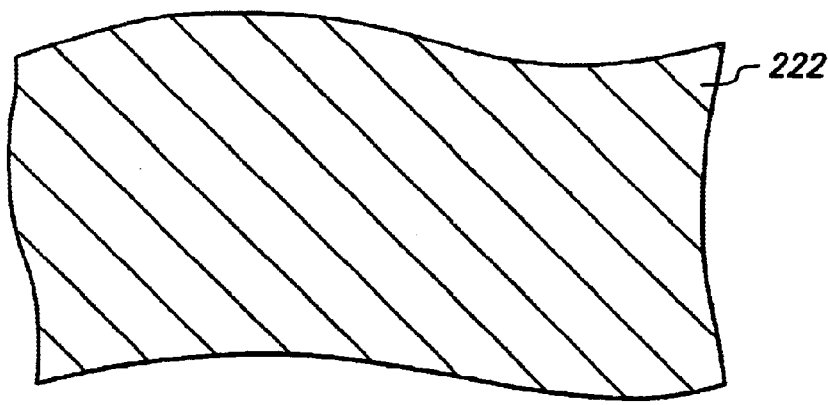
Figure 7D:
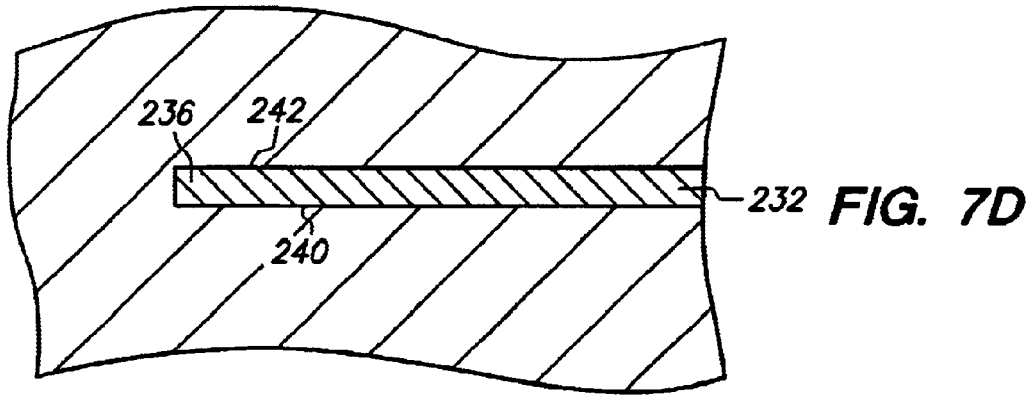
Figure 5E:
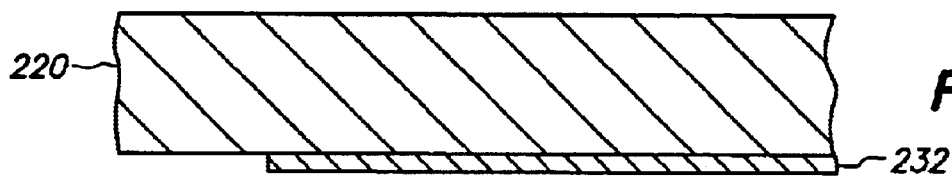
Figure 6E:
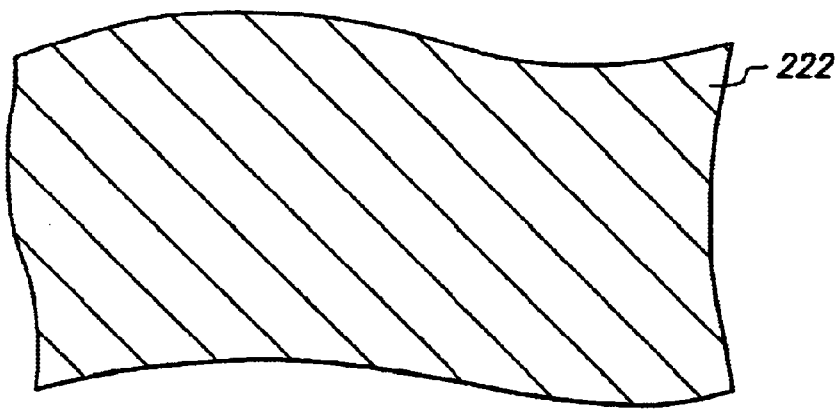
Figure 7E:
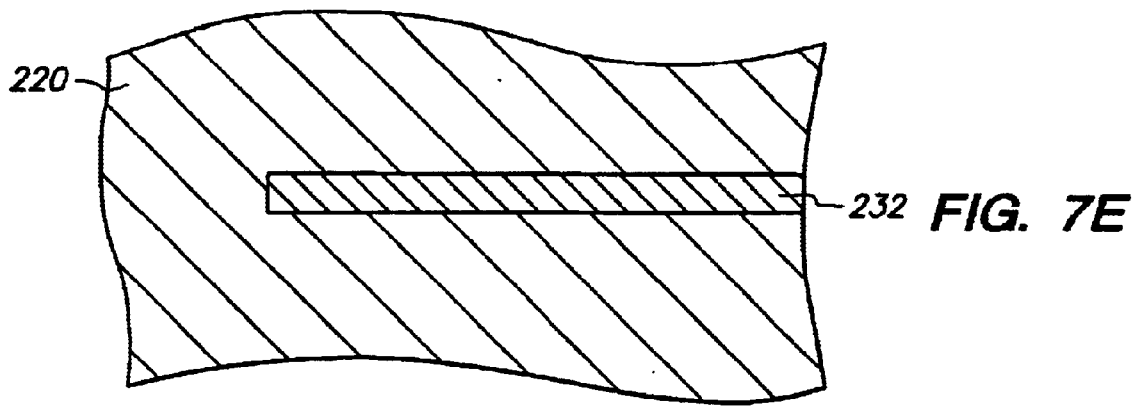
Figure 5F:
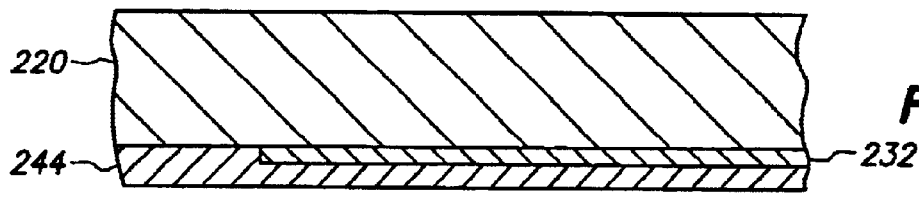
Figure 6F:
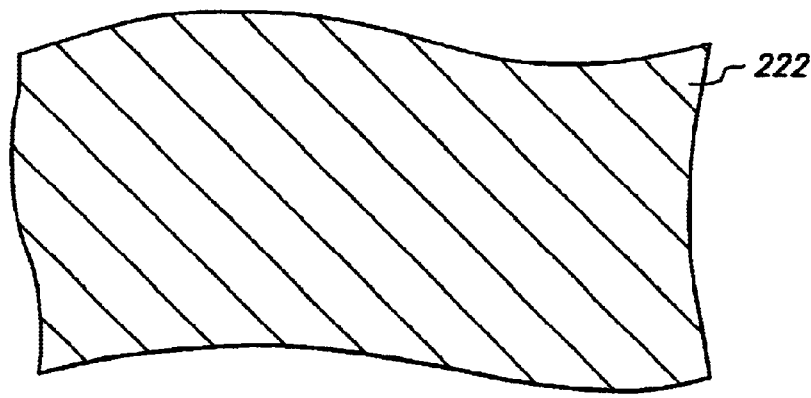
Figure 7F:
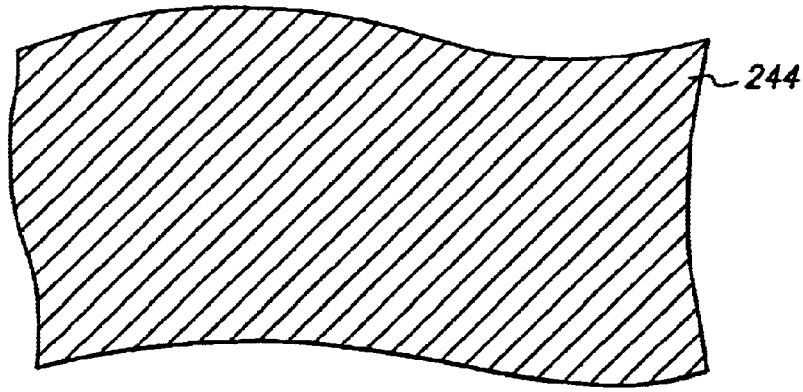
Figure 5G:
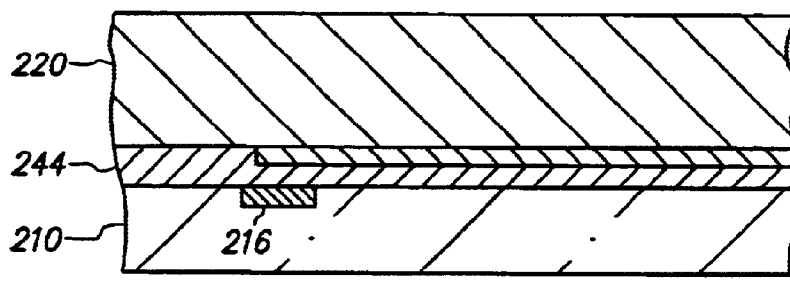
Figure 6G:
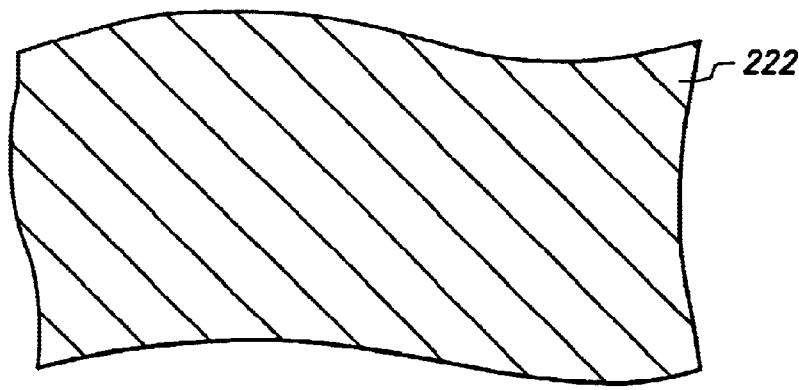
Figure 7G:
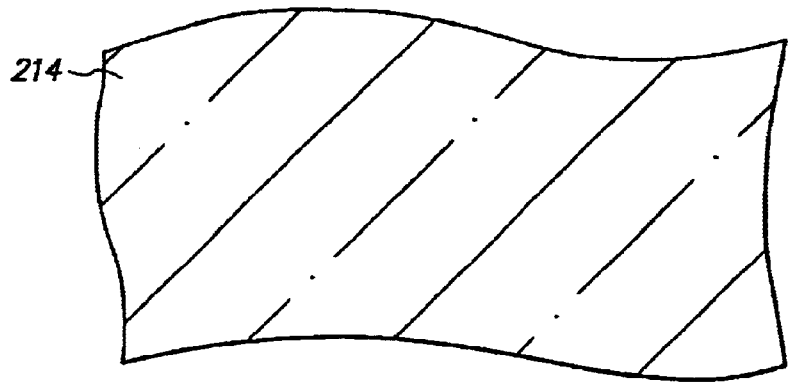
Figure 5H:
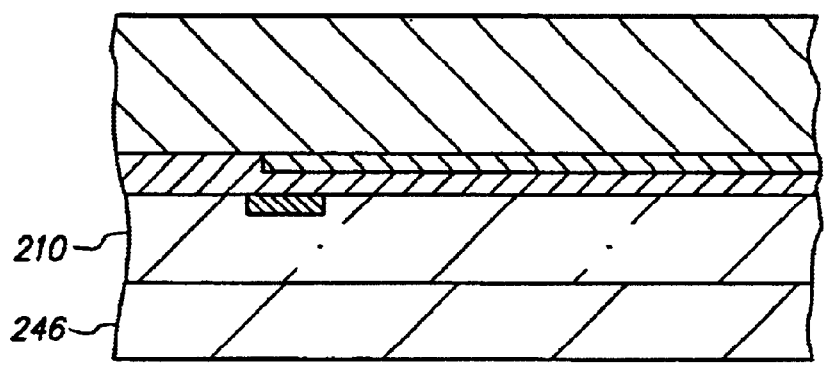
Figure 6H:
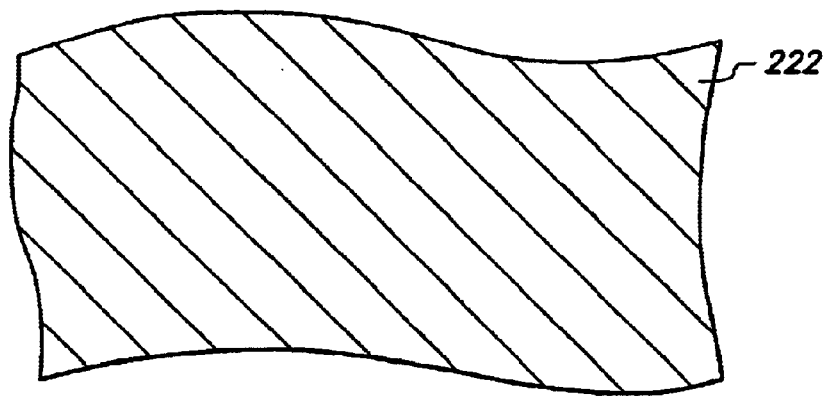
Figure 7H:
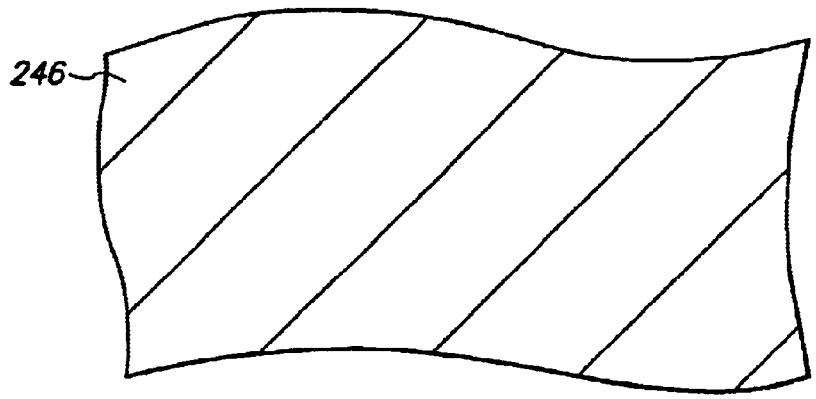
Figure 5I:
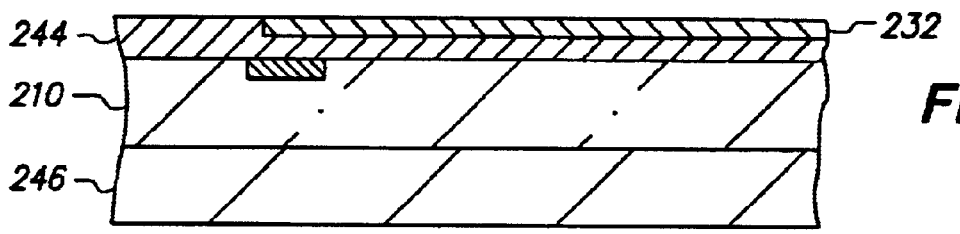
Figure 6I:
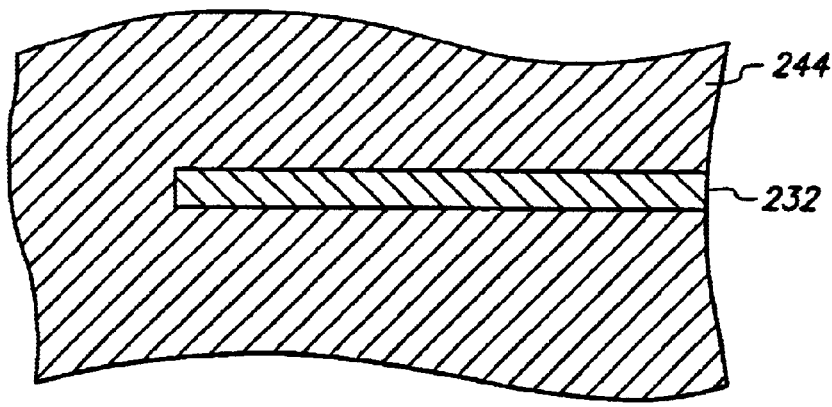
Figure 7I:
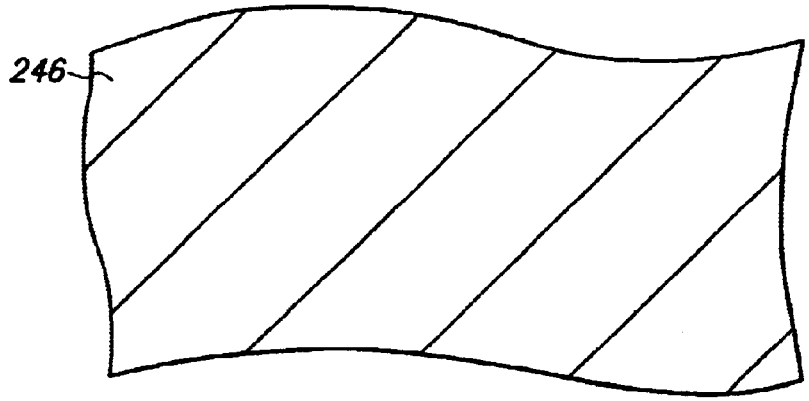
Figure 5J:
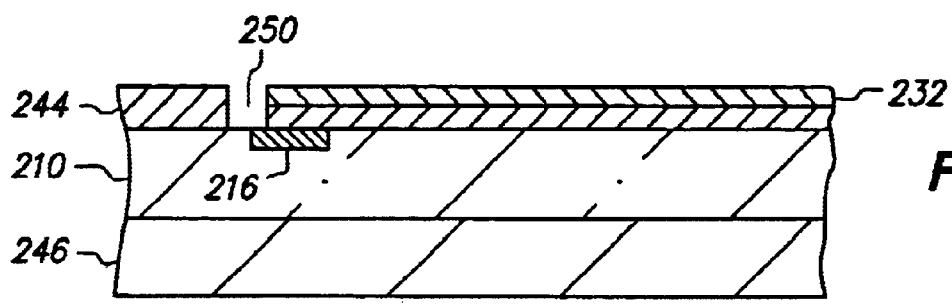
Figure 6J:
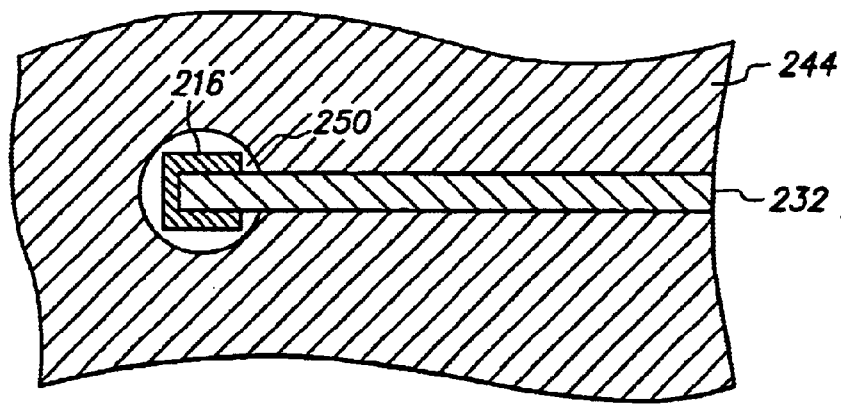
Figure 7J:
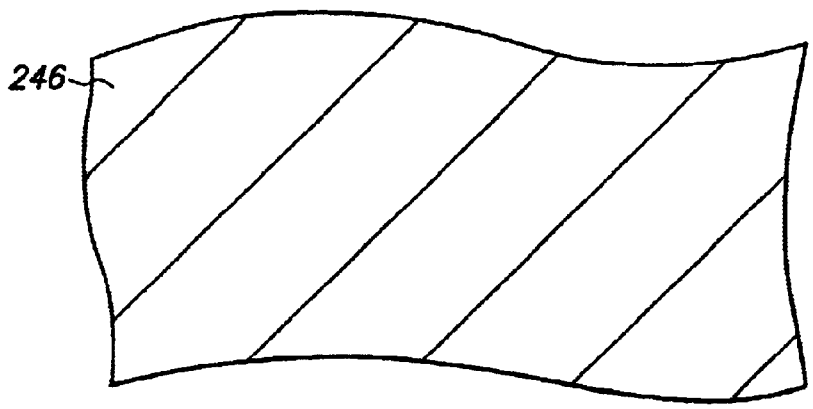
Figure 5K:
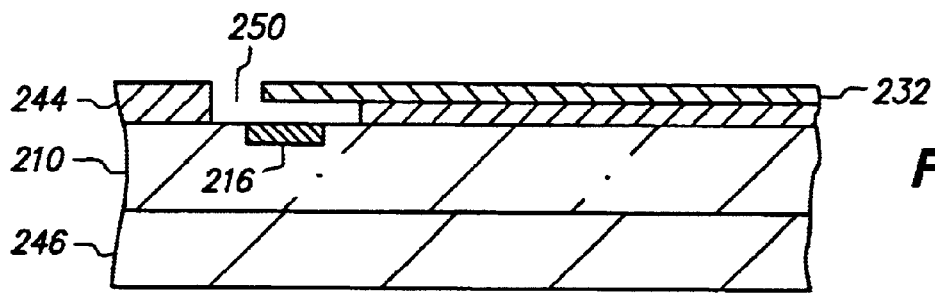
Figure 6K:
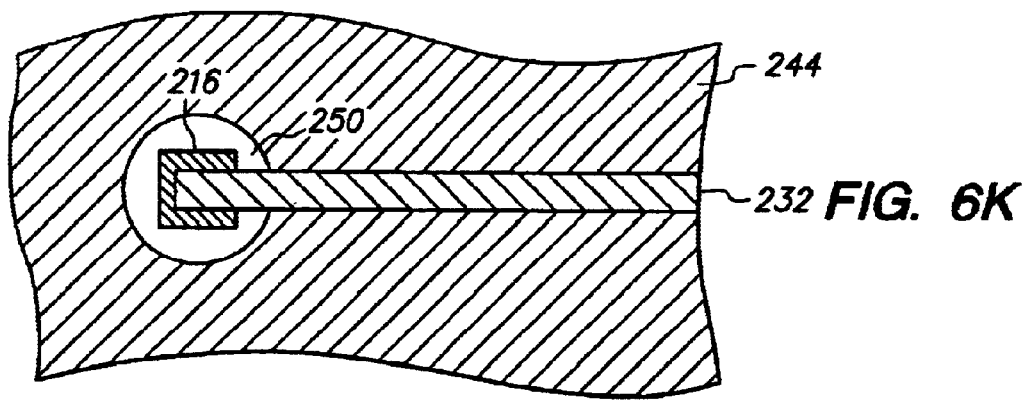
Figure 7K:
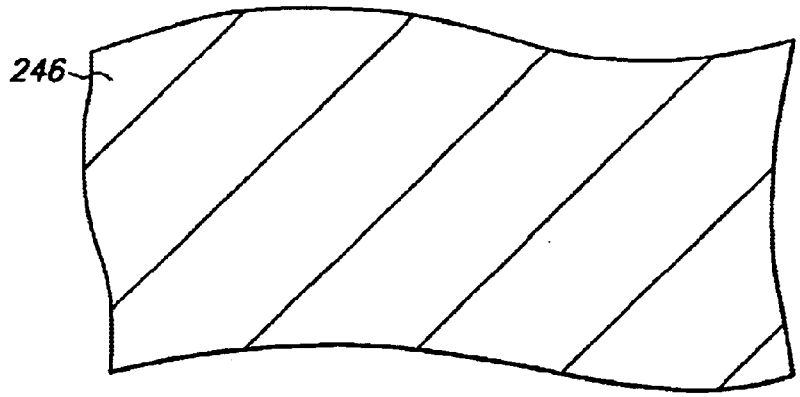
Figure 5L:
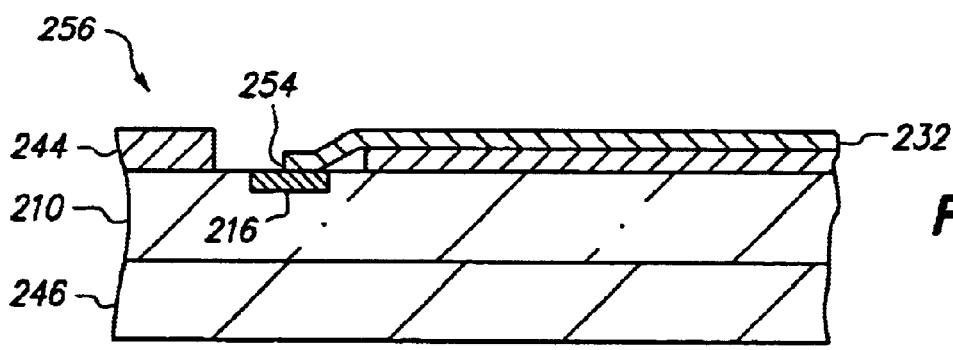
Figure 6L:
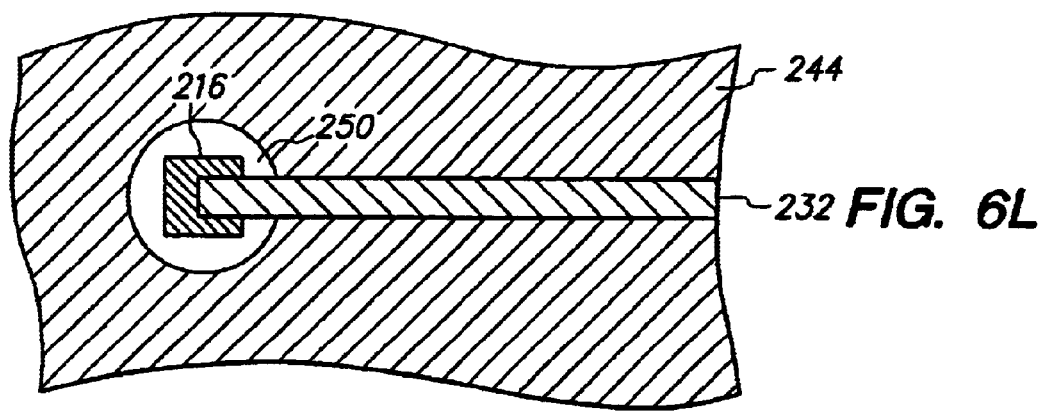
Figure 7L:
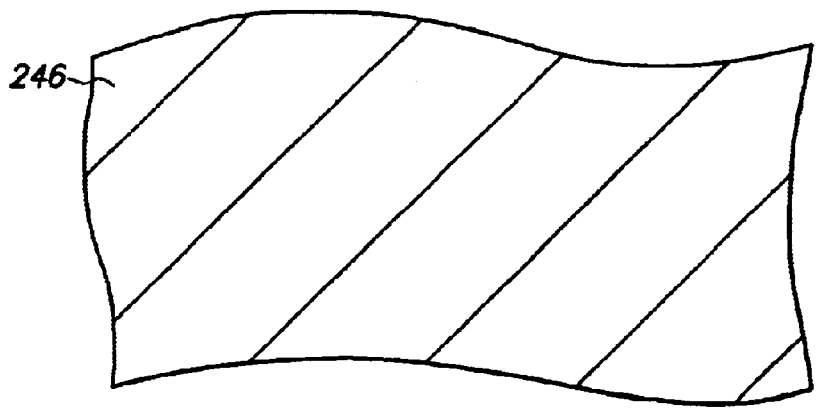
Figure 8A:
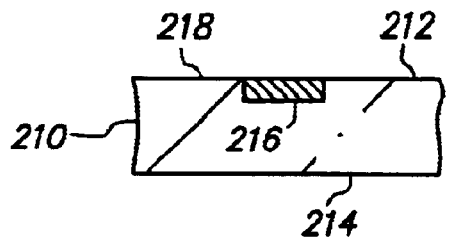
FIGS. 8A–8L are cross-sectional views corresponding to FIGS. 5A–5L, respectively.
Figure 8B:
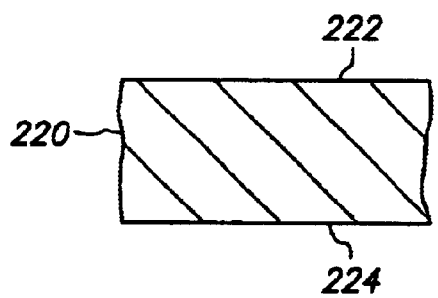
Figure 8C:
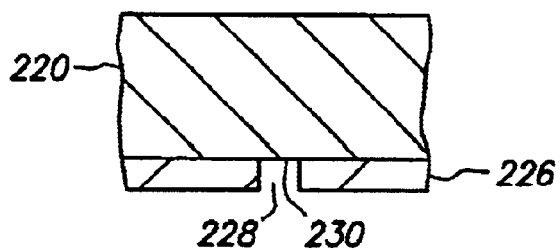
Figure 8D:
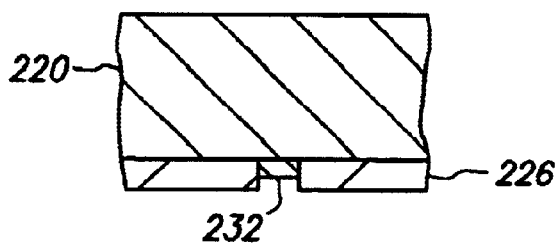
Figure 8E:
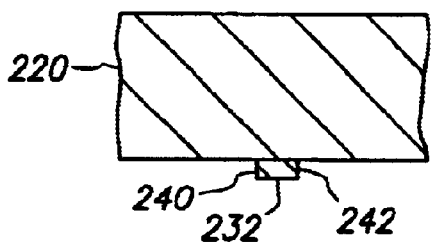
Figure 8F:
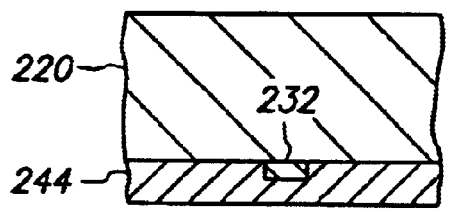
Figure 8G:
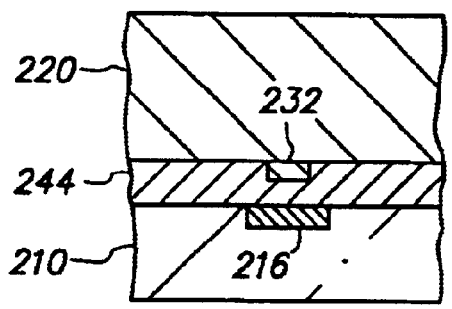
Figure 8H:
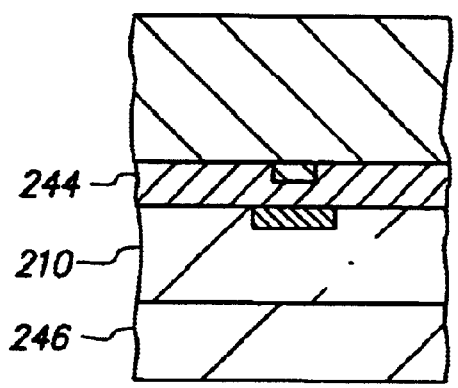
Figure 8I:
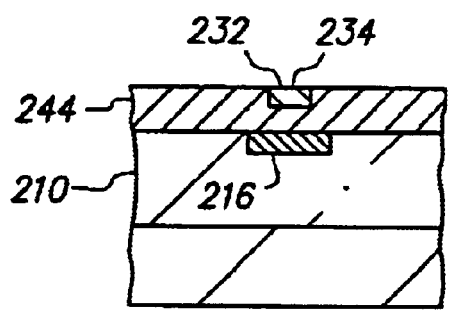
Figure 8J:
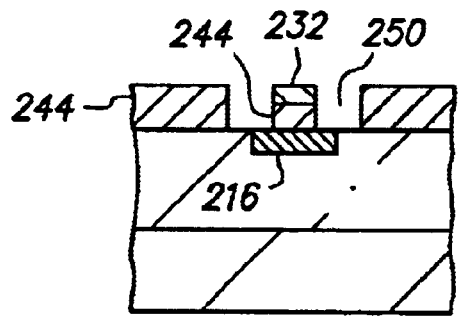
Figure 8K:
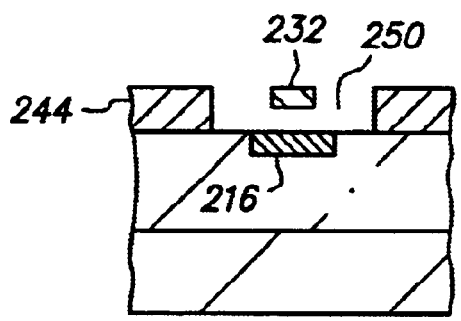
Figure 8L:
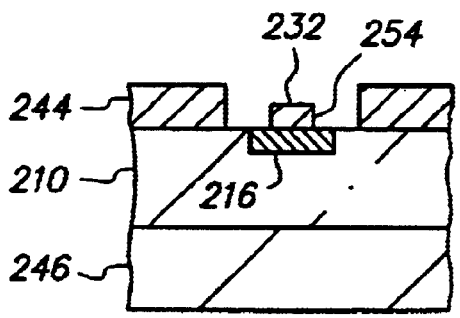
Figure 9A:
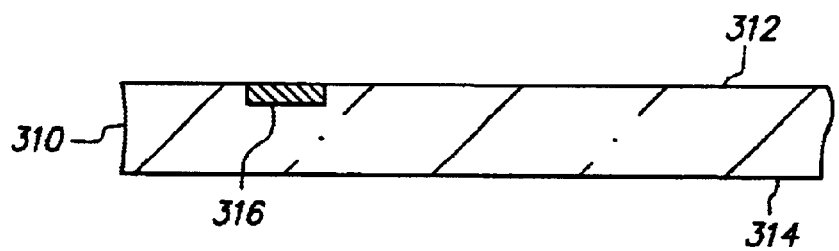
FIGS. 9A–9M are cross-sectional views showing a method of connecting a conductive trace to a semiconductor chip in accordance with a third embodiment of the present invention.
Figure 11A:
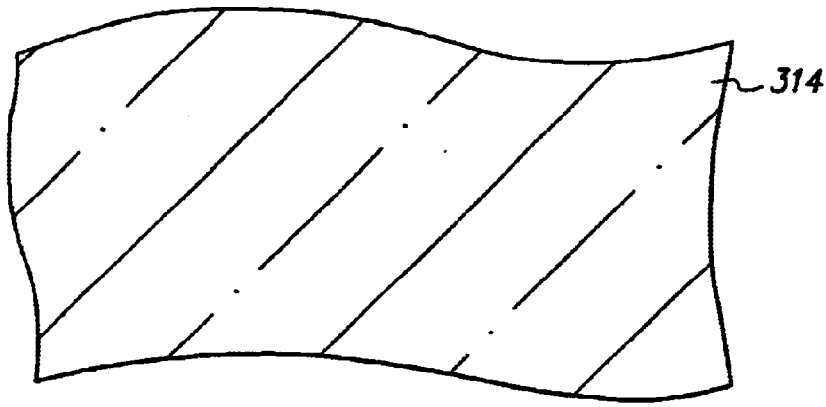
FIGS. 11A–11M are bottom plan views corresponding to FIGS. 9A–9M, respectively.
Figure 9B:
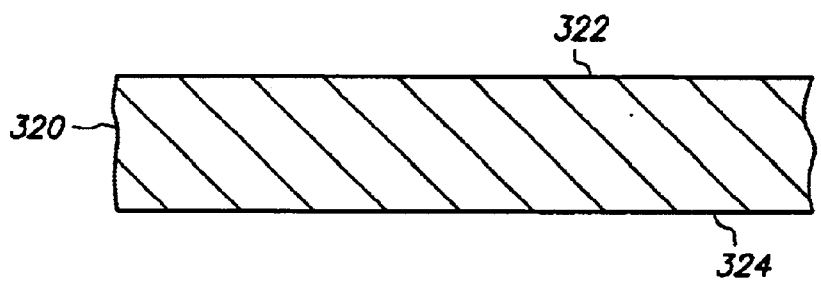
Figure 11B:
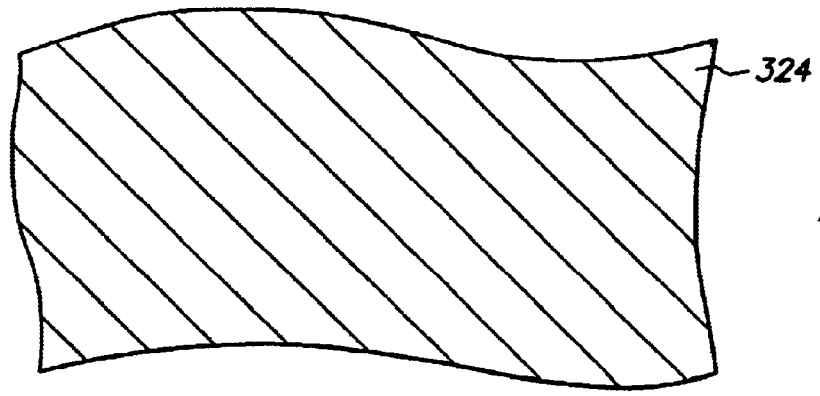
Figure 9C:
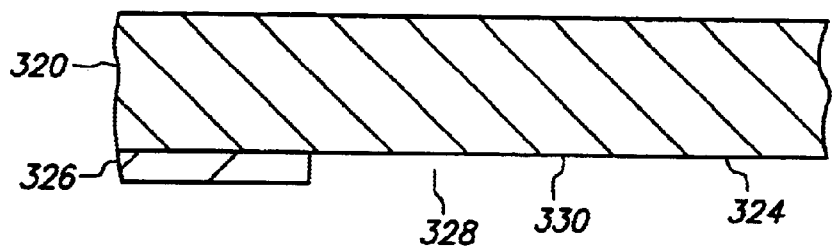
Figure 11C:
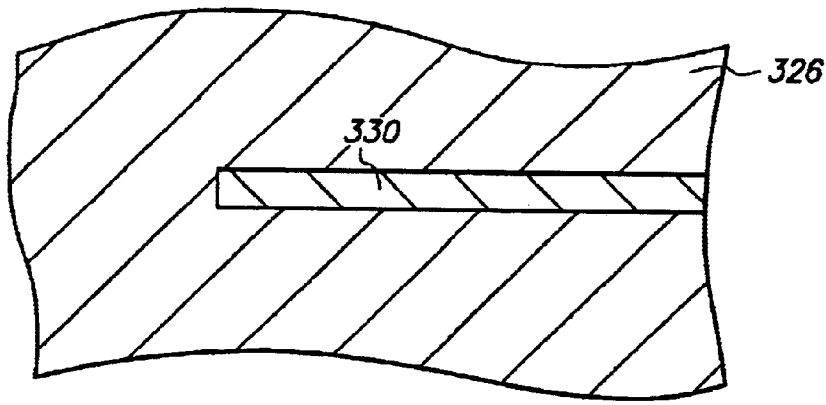
Figure 9D:
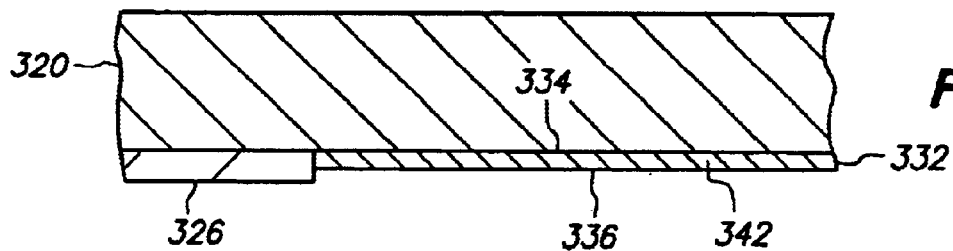
Figure 11D:
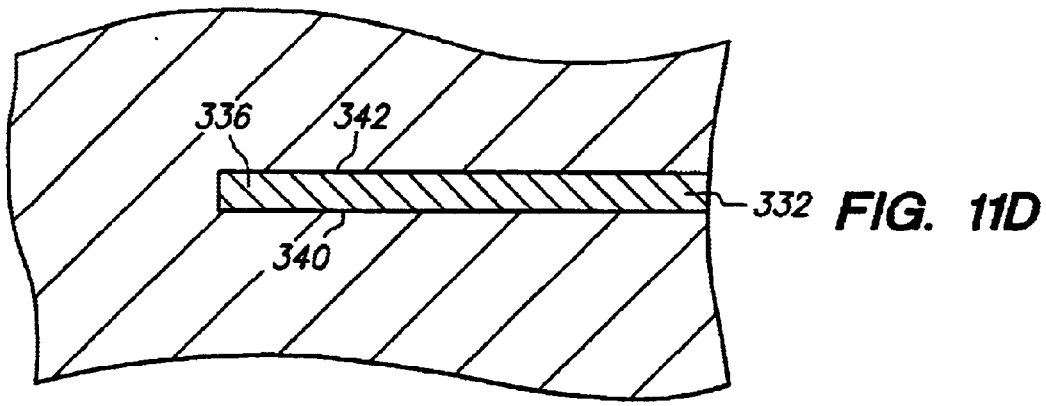
Figure 9E:
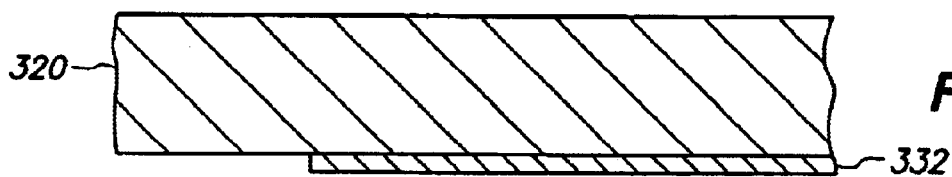
Figure 11E:
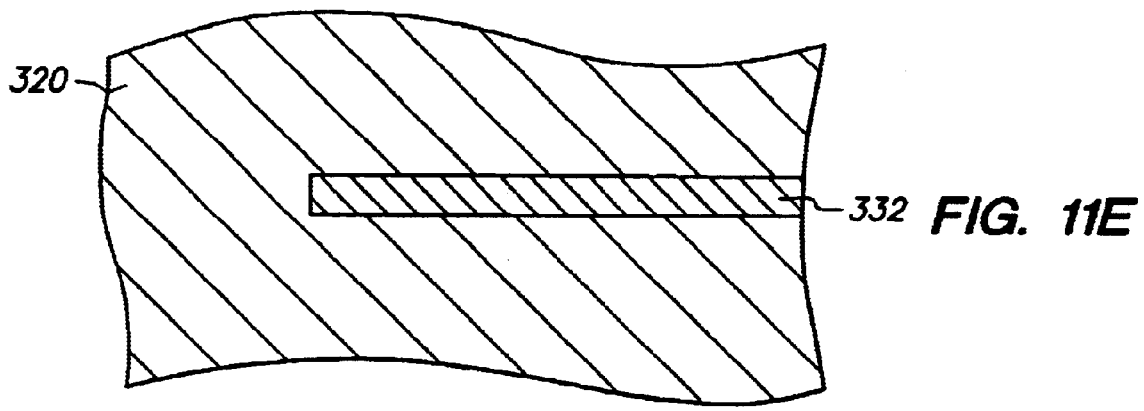
Figure 9F:
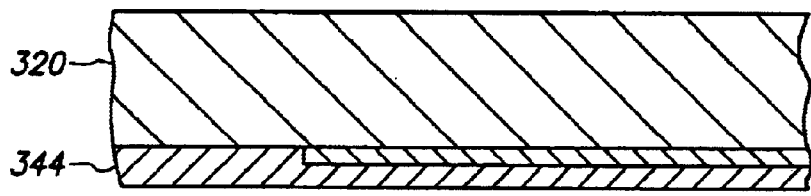
Figure 11F:
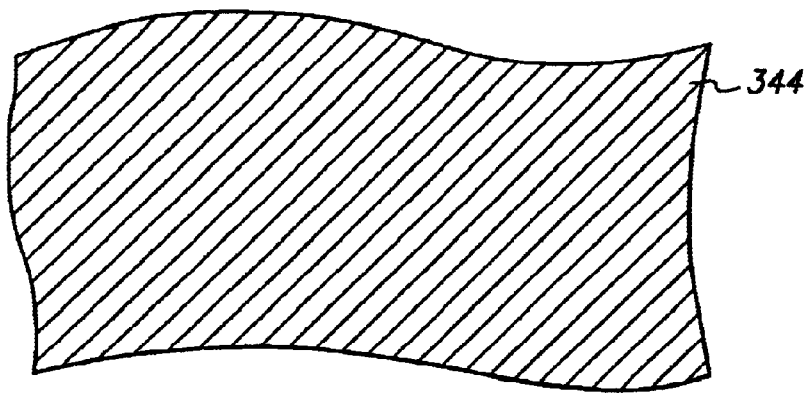
Figure 9G:
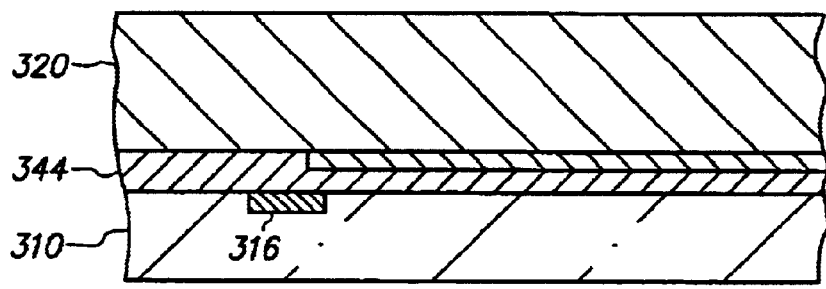
Figure 11G:
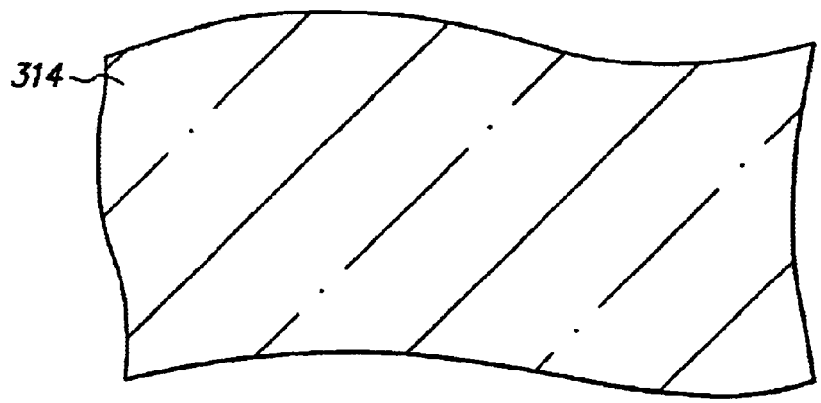
Figure 9H:
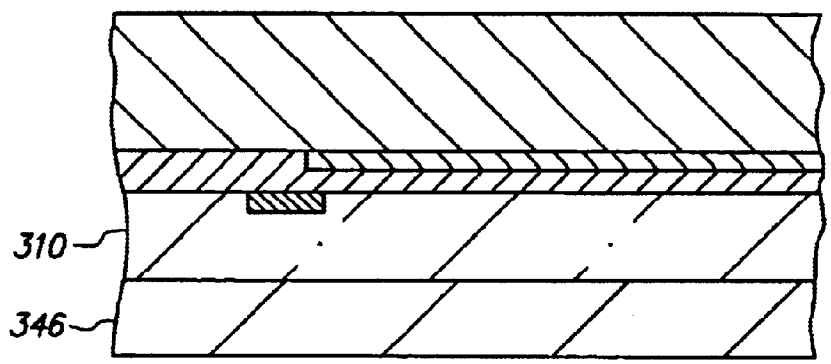
Figure 11H:
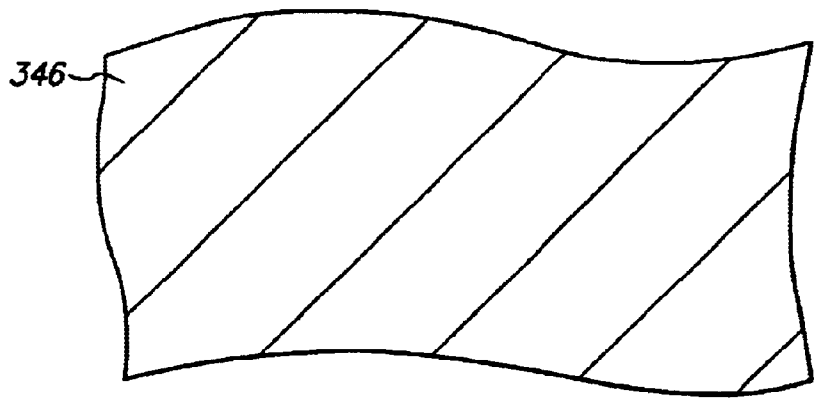
Figure 9I:
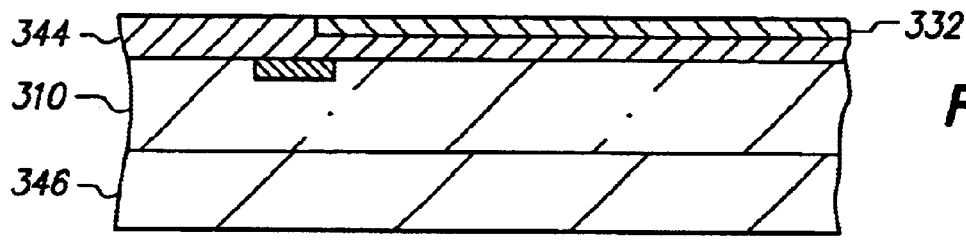
Figure 11I:
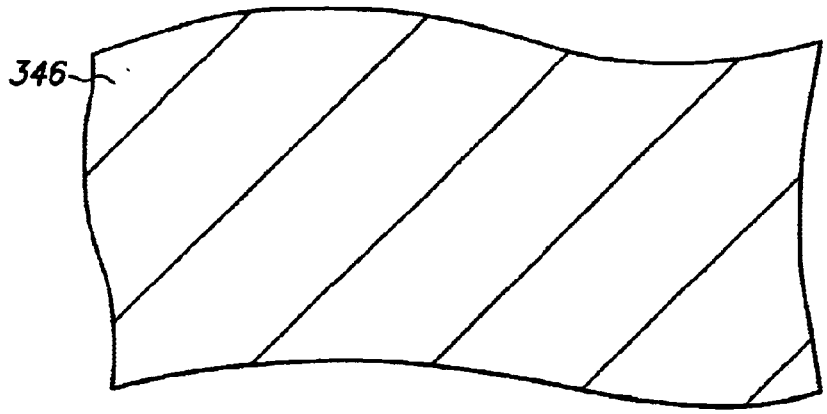
Figure 9J:
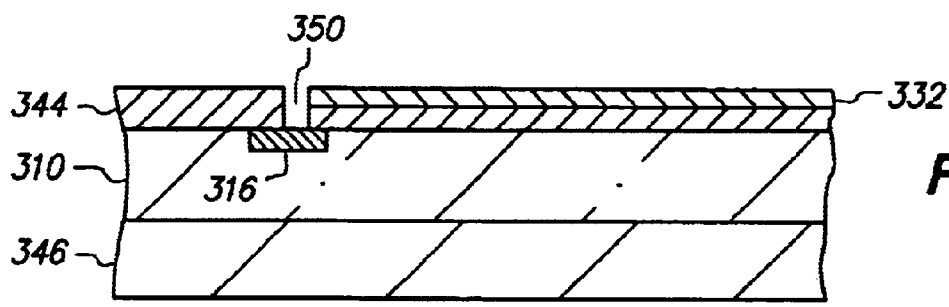

FIGS. 1A–1M, 2A–2M, 3A–3M and 4A–4M are cross-sectional, top, bottom and cross-sectional views, respectively, of a method of connecting a conductive trace to a semiconductor chip in accordance with a first embodiment of the present invention. FIGS. 4A–4M are oriented orthogonally with respect to FIGS. 1A–1M and depict FIGS. 1A–1M as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes upper surface 112 and lower surface 114 which are opposing major surfaces. Upper surface 112 includes conductive pad 116 and passivation layer 118. Pad 116 is substantially aligned with passivation layer 118 so that upper surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, the aluminum base covered by a surface layer, depending on the nature of a connection joint that shall subsequently contact the pad. In this embodiment, a solder connection joint is used. Pad 116 can be rendered wettable for solder reflow by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 can be rendered wettable to solder reflow by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, a nickel surface layer is electrolessly deposited on the zincated aluminum base, and the nickel surface layer wets reflowed solder. A suitable electroless nickel plating solution is Enthone Enplate NI-424 at 85° C.

Chip 110 includes many other pads on upper surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of base 120 which includes top surface 122 and bottom surface 124. Base 120 is a copper foil with a thickness of 200 microns.

FIGS. 1C, 2C, 3C and 4C are cross-sectional, top, bottom and cross-sectional views, respectively, of photoresist layer 126 formed on bottom surface 124 of base 120.

Photoresist layer 126 is deposited as a continuous layer and then patterned by selectively applying light through a reticle (not shown), applying a developer solution to remove the photoresist portions rendered soluble by the light, and then hard baking, as is conventional. As a result, photoresist layer 126 contains opening 128 that selectively exposes portion 130 of bottom surface 124. Photoresist layer 126 has a thickness of 25 microns.

FIGS. 1D, 2D, 3D and 4D are cross-sectional, top, bottom and cross-sectional views, respectively, of conductive trace 132 formed on base 120. Conductive trace 132 includes top surface 134, bottom surface 136, and peripheral sidewalls 140 and 142 therebetween. Top surface 134 faces towards and contacts and is covered by base 120, bottom surface 136 faces away from base 120 and is exposed, and peripheral sidewalls 140 and 142 extend orthogonally from base 120 and are covered by photoresist layer 126. Conductive trace 132 includes a first nickel layer deposited on base 120, a copper layer deposited on the first nickel layer, a second nickel layer deposited on the copper layer, and a gold layer deposited on the second nickel layer. The first nickel layer is 1 micron thick, the copper layer is 10 microns thick, the second nickel layer is 1 micron thick, and the gold layer is 0.5 microns thick. Conductive trace 132 has a thickness of 12.5 microns and a width of 50 microns. For convenience of illustration, the first nickel layer, the copper layer, the second nickel layer and the gold layer are shown as a single layer.

Conductive trace 132 is formed by an electroplating operation. Thus, conductive trace 132 is formed additively on exposed portion 130 of bottom surface 124 of base 120. Initially, base 120 is connected to a plating bus (not shown), current is applied to the plating bus from an external power source, and the structure is submerged in an electrolytic nickel plating solution such as Technic Techni Nickel "S" at room temperature to electroplate the first nickel layer on base 120. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. Thereafter, the structure is removed from the electrolytic nickel plating solution and submerged in an electrolytic gold plating solution such as Technic Orotemp at room temperature while current is applied to the plating bus to electroplate the gold layer on the second nickel layer. Thereafter, the structure is removed from the electrolytic gold plating solution and rinsed in distilled water to remove contaminants.

FIGS. 1E, 2E, 3E and 4E are cross-sectional, top, bottom and cross-sectional views, respectively, of base 120 and conductive trace 132 after photoresist layer 126 is stripped. Photoresist layer 126 is removed using a solvent, such as a mild alkaline solution with a pH of 9, that is highly selective of photoresist with respect to copper, nickel and gold.

Therefore, no appreciable amount of base 120 or conductive trace 132 is removed. At this stage, conductive trace 132 remains attached to base 120, top surface 134 remains covered by base 120, and bottom surface 136 and peripheral sidewalls 140 and 142 are exposed.

FIGS. 1F, 2F, 3F and 4F are cross-sectional, top, bottom and cross-sectional views, respectively, of adhesive 144 formed on base 120 and conductive trace 132. Adhesive 144 is an insulative thermosetting polyimide film. Adhesive 144 is applied to portions of bottom surface 124 of base 120 and bottom surface 136 of conductive trace 132 as a liquid resin (A stage) such as polyamic acid using stencil printing. As a result, the liquid resin flows over peripheral sidewalls 140 and 142. However, the liquid resin does not contact top surface 122.

For convenience of illustration, adhesive 144 is shown below base 120 to retain a single orientation throughout the figures for ease of comparison between the figures, although in this step the structure would be inverted so that gravitational force would assist the liquid resin flow.

FIGS. 1G, 2G, 3G and 4G are cross-sectional, top, bottom and cross-sectional views, respectively, of chip 110 mechanically attached to conductive trace 132 by adhesive 144. Adhesive 144 is disposed between and contacts upper surface 112 of chip 110 and bottom surface 124 of base 120, and likewise, adhesive 144 is disposed between and contacts upper surface 112 of chip 110 and bottom surface 136 of conductive trace 132. Thus, chip 110 and base 120 do not contact one another, and chip 110 and conductive trace 132 do not contact one another.

Preferably, adhesive 144 is sandwiched between upper surface 112 and bottom is surface 124, and between upper surface 112 and bottom surface 136, using relatively low pressure while a pick-up head that places chip 110 on adhesive 144 is heated to a relatively low temperature such as 150° C. so that adhesive 144 is partially polymerized (B stage) and forms a gel but is not fully cured. In addition, chip 110 and conductive trace 132 are positioned relative to one another so that conductive trace 132 is disposed above and overlaps and is electrically isolated from pad 116. In particular, conductive trace 132 overlaps the center of pad 116 and two opposing peripheral edges of pad 116 (but not the other two opposing peripheral edges of pad 116), and peripheral sidewalls 140 and 142 overlap pad 116. Chip 110 and conductive trace 132 can be aligned using an automated pattern recognition system. Thereafter, the structure is placed in an oven and adhesive 144 is fully cured (C stage) at relatively low temperature in the range of 200 to 250° C. to form a solid adhesive insulative polyimide layer that is 10 microns thick between upper surface 112 and bottom surface 136 and mechanically fastens chip 110 to conductive trace 132.

At this stage, conductive trace 132 is covered from above by base 120 and covered from below by adhesive 144, peripheral sidewalls 140 and 142 are covered by adhesive 144, pad 116 is covered from above by adhesive 144, and pad 116 is separated from conductive trace 132 by the thickness of adhesive 144.

FIGS. 1H, 2H, 3H and 4H are cross-sectional, top, bottom and cross-sectional views, respectively, of encapsulant 146 formed on lower surface 114 of chip 110. Preferably, encapsulant 146 is initially an epoxy in paste form that includes an epoxy resin, a curing agent, an accelerator and a filler. The filler is an inert material such as silica (powdered fused quartz) that provides thermal coefficient of expansion matching. The epoxy paste is coated onto the outer edges (one shown) and lower surface 114 of chip 110 as well as the surface of adhesive 144 opposite to conductive trace 132 and outside chip 110. Thereafter, the epoxy paste is cured or hardened at relatively low temperature in the range of 100 to 250° C. to form a solid adherent protective layer. Encapsulant 146 provides back-side environmental protection such as moisture resistance and particle protection for chip 110 and has a thickness of 100 microns beyond lower surface 114.

FIGS. 1I, 2I, 3I and 4I are cross-sectional, top, bottom and cross-sectional views, respectively, of chip 110, conductive trace 132, adhesive 144 and encapsulant 146 after base 120 is removed. A "front-side" wet chemical etch is applied to top surface 122 of base 120. For instance, the wet chemical etch can be sprayed on top surface 122, or the structure can be dipped in the wet chemical etch since chip 110 is protected by encapsulant 146. The wet chemical etch is highly selective of copper with respect to nickel, polyimide and epoxy. In addition, the copper layer of conductive trace 132 is protected from the wet chemical etch by the first nickel layer of conductive trace 132 and adhesive 144. Therefore, no appreciable amount of conductive trace 132, adhesive 144 or encapsulant 146 is removed. A suitable wet chemical etch can be provided by a solution containing alkaline ammonia. The optimal etch time for exposing base 120 to the wet chemical etch in order to completely remove base 120 without excessively exposing the nickel surface layer of conductive trace 132 to the wet chemical etch can be established through trial and error.

The wet chemical etch completely removes base 120. As a result, top surface 134 of conductive trace 132 is exposed. At this stage, adhesive 144 continues to cover pad 116 and peripheral sidewalls 140 and 142 and provides critical mechanical support for conductive trace 132.

FIGS. 1J, 2J, 3J and 4J are cross-sectional, top, bottom and cross-sectional views, respectively, of opening 150 formed in adhesive 144 that exposes pad 116 and peripheral sidewalls 140 and 142 without exposing bottom surface 136. Opening 150 can be provided by applying a suitable anisotropic etch that is highly selective of adhesive 144 with respect to pad 116 and conductive trace 132.

In this instance, a selective TEA $CO_2$ laser etch is applied. Using projection laser ablation, a metal mask (not shown) is positioned above top surface 134 such that an opening in the metal mask is aligned with pad 116, and a laser is directed to the side of the metal mask opposite top surface 134. Accordingly, the metal mask targets the laser at pad 116. The laser removes a portion of adhesive 144 above pad 116 and outside conductive trace 132. That is, conductive trace 132 shields the underlying adhesive 144 from the laser etch so that the portion of adhesive 144 sandwiched between conductive trace 132 and pad 116 remains intact. The laser etch is anisotropic, and therefore little or none of adhesive 144 sandwiched between conductive trace 132 and pad 116 is undercut or removed and bottom surface 136 remains covered by adhesive 144. Adhesive 144 may be slightly undercut between conductive trace 132 and pad 116 due to thermal effects. However, the portion of adhesive 144 above pad 116, outside conductive trace 132 and adjacent to peripheral sidewalls 140 and 142 is removed. The laser also removes a portion of adhesive 144 slightly outside the periphery of pad 116 and outside conductive trace 132.

Opening 150 has a diameter of 100 microns and pad 116 (with a length and width of 70 microns) is axially centered within opening 150. Opening 150 is formed in adhesive 144 without damaging pad 116, passivation layer 118 or conductive trace 132.

FIGS. 1K, 2K, 3K and 4K are cross-sectional, top, bottom and cross-sectional views, respectively, of the structure after the portion of adhesive 144 sandwiched between pad 116 and conductive trace 132 is removed. This can be provided by applying a suitable isotropic etch that is highly selective of adhesive 144 with respect to pad 116 and conductive trace 132.

In this instance, a selective oxygen plasma etch is applied. In particular, a metal mask (not shown) is positioned above top surface 134 such that an opening in the metal mask is aligned with pad 116, and a plasma is directed to the side of the metal mask opposite top surface 134. Accordingly, the metal mask targets the plasma at pad 116. The plasma etch is isotropic and therefore undercuts and removes the portion of adhesive 144 between pad 116 and conductive trace 132, thereby removing the remaining portion of adhesive 144 that covers pad 116, creating a gap between pad 116 and conductive trace 132, and fully exposing pad 116 and the portion of bottom surface 136 that overlaps pad 116. As a result, adhesive 144 covers none of pad 116. In addition, the plasma etch increases the diameter of opening 150 by 50 microns.

Opening 150 has a diameter of 150 microns and pad 116 (with a length and width of 70 microns) remains axially centered within opening 150. The remaining is adhesive 144 over pad 116 is removed without damaging pad 116, passivation layer 118 or conductive trace 132.

Plasma etching of polymers to form microvias in printed circuit boards, high density interconnects and multichip modules is well-known in the art. Generally speaking, a simple plasma reactor contains two plate electrodes and a low pressure chamber. The electrodes are connected to a high frequency voltage source so that a current flows forming a plasma which emits a characteristic glow, and reactive radicals are generated by this discharge. The reactive radicals react with the polymer to form volatile products that evaporate to etch the polymer and the end products are pumped away and evacuated.

The plasma is an ionized gas with equal numbers of free positive and negative charges. The free charges are produced through the energy admitted by the electric field of the excitation frequency. The negative particles are predominantly electrons. Various types of discharges can occur depending on electron density and energy.

Glow discharge is the most important discharge for etching purposes. Glow discharge can be generated by an applied frequency between 0 Hz (DC discharge) up to 2.45 GHz (microwave discharge). Glow discharge produces radio frequency (RF) discharge at an applied frequency of 13.56 MHz.

Radio frequency discharge can etch a polymer exposed to the plasma. The diffusion of charged particles (positive ions and electrons) to the walls and their recombination leads to the formation of a sheath, a boundary layer near surfaces and walls of depleted charges. Electrons diffuse faster than positive ions due to their light weight and high energy, leaving a positive plasma potential relative to the walls. Positive ions are accelerated through the sheath and strike the walls at near-normal incidence. This operational etching mode in which ion bombardment provides directional etching is known as reactive ion etching (RIE). In addition, chemically reactive neutral radicals travelling independent of the accelerating field cause isotropic etching. The degree of isotropy is influenced by process conditions. For instance, increasing the operating pressure in a reactive ion etching plasma with oxygen increases the density of reactive oxygen atoms which increases the isotropic etching.

To elaborate, reactive neutral radicals move in all directions and form isotropic profiles without directional preference, whereas positively charged ions are accelerated vertically towards the electrode and form anisotropic profiles with vertical directional preference. As a result, concentration differences between reactive neutral radicals and positive ions changes the profile formation. High reactive neutral radical concentrations result in isotropic profiles, whereas high positive ion concentrations result in anisotropic profiles.

Microwave discharge can also etch a polymer. The field is launched via a microwave transport window such as quartz or sapphire into a vacuum vessel. A high concentration of reactive neutral radicals together with a high density of low energy positive ions causes isotropic etching even if the polymer is directly exposed to the discharge. A remote microwave discharge, where only reactive neutral radicals with long lifetimes are able to react with the polymer, causes pure isotropic etching.

The optimal plasma etching parameters, such as the power level, excitation frequency, electrode structure, plasma-forming gas, pressure, flow rate and exposure time, in order to remove the remaining portion of adhesive 144 that covers pad 116 without excessively etching or degrading other portions of adhesive 144, which remain intact and contact and are sandwiched between chip 110 and conductive trace 132, or damaging chip 110, can be established through trial and error.

Preferably, the plasma is an RF discharge applied in a low pressure chamber between 0.001 to 1 Torr. The excitation frequency can be between 40 KHz to 100 MHz, with 13.56 MHz a commonly employed ISM frequency allocated by radio communications authorities for industrial process equipment. The plasma-forming gas is preferably an oxygen-containing gas that attacks polymers to form CO, $CO_2$ and $H_2O$ as the final end products. For example, the plasma-forming gas can be pure oxygen or 10–20% $CF_4$ and 70–80% $O_2$. The plasma-forming gas can also include an oxygen-containing gas mixed with a fluorine-containing gas such as $CF_4$ or $C_2F_6$ to increase the etch rate. This occurs because the fluorine atoms extract hydrogen from the polymer to form HF, which produces sites that react more rapidly with molecular oxygen. The plasma-forming gas can also include an oxygen-containing gas mixed with an inert gas such as argon to stabilize the plasma. Preferably, the applied electric field converts the plasma-forming gas to a plasma which includes highly reactive species such as molecular oxygen or molecular oxygen and fluorine that isotropically etch polymer. In addition, the vacuum pump and gas supply source should be arranged to move the gasses through the chamber at a rate sufficient to remove the end products and limit redeposit of the end products back onto the structure. Advantageously, once the plasma etching parameters are established for a given application, the plasma etching tends to be highly controllable and repeatable, and the same conditions can be used repeatedly in volume manufacturing.

FIGS. 1L, 2L, 3L and 4L are cross-sectional, top, bottom and cross-sectional views, respectively, of solder paste 152 deposited on pad 116 and conductive trace 132. Solder paste 152 includes finely powdered tin-lead solder particles mixed in a viscous organic resin containing a fluxing agent. Solder paste 152 is deposited into opening 150 using stencil printing. During the stencil printing process, a stencil (not shown) is placed on adhesive 144 and a stencil opening is aligned with opening 150, and then a squeegee (not shown) pushes solder paste 152 along the surface of the stencil opposite adhesive 144, through the stencil opening and into opening 150.

Solder paste 152 fills opening 150 and extends above opening 150 by the 30 micron thickness of the stencil. Solder paste 152 is compliant enough at room temperature to conform to virtually any shape. Thus, solder paste 152 contacts and covers pad 116 and the portions of top surface 134, bottom surface 136 and peripheral sidewalls 140 and 142 that overlap pad 116.

FIGS. 1M, 2M, 3M and 4M are cross-sectional, top, bottom and cross-sectional views, respectively, of connection joint 154 formed by solder reflow. Connection joint 154 is formed in opening 150 in adhesive 144 and contacts and electrically connects pad 116 and conductive trace 132. In particular, connection joint 154 contacts and covers portions of top surface 134, bottom surface 136 and peripheral sidewalls 140 and 142 that overlap pad 116, extends continuously between pad 116 and top surface 134, bottom surface 136 and peripheral sidewalls 140 and 142, and contacts and covers pad 116. Thus, connection joint 154 provides an electrical connection between pad 116 and conductive trace 132. Connection joint 154 is the only electrical conductor external to chip 110 that contacts pad 116.

Connection joint 154 is formed by heating solder paste 152 to a temperature of about 210° C. The heat causes the flux in solder paste 152 to react with and remove oxides from pad 116 and conductive trace 132 and the solder particles in solder paste 152, renders the solder particles in solder paste 152 molten such that they coalesce and wet pad 116 and conductive trace 132, and vaporizes the organic resin in solder paste 152. As a result, solder paste 152 is reduced to roughly one-half its original size and solder reflow occurs. Thereafter, the heat is removed and the molten solder particles cool and solidify into a hardened solder joint that provides connection joint 154. In this manner, the heat transforms non-solidified solder paste 152 into hardened connection joint 154.

Solder paste 152 has a mass that falls within a narrow tolerance such that there is enough solder to wet pad 116 and conductive trace 132 during the reflow operation and form connection joint 154 with a sufficiently large contact area to provide a robust mechanical and electrical connection between pad 116 and conductive trace 132 without providing so much solder as to create bridges or electrical shorts with the adjacent connection joints (not shown).

At this stage, the manufacture of semiconductor chip assembly 156 that includes chip 110, conductive trace 132, adhesive 144, encapsulant 146 and connection joint 154 can be considered complete. Conductive trace 132 is mechanically and electrically coupled to chip 110 by adhesive 144 and connection joint 154, respectively.

Conductive trace 132 extends beyond an outer edge of chip 110 and provides horizontal fan-out routing between pad 116 and external circuitry. Advantageously, conductive trace 132 is a single continuous low-profile metal segment.

The semiconductor chip assembly includes other conductive traces embedded in adhesive 144, and only a single conductive trace 132 is shown for convenience of illustration. The conductive traces are each connected to a respective pad on chip 110 by a respective connection joint. Furthermore, the conductive traces each extend across an outer edge of chip 110 near their respective pads to provide horizontal fan-out routing for their respective pads. The conductive traces are electrically isolated from one another by adhesive 144 after base 120 is removed. Advantageously, since base 120 provides a plating bus for forming the conductive traces, and the connection joints are formed by solder paste deposition and solder reflow, there is no plating bus or related circuitry that need be disconnected or severed from chip 110 or the conductive traces after base 120 is removed and the connection joints are formed.

FIGS. 5A–5L, 6A–6L, 7A–7L and 8A–8L are cross-sectional, top, bottom and cross-sectional views, respectively, of a method of connecting a conductive trace to a semiconductor chip in accordance with a second embodiment of the present invention. FIGS. 8A–8L are oriented orthogonally with respect to FIGS. 5A–5L and depict FIGS. 5A–5L as viewed from left-to-right. In the second embodiment, the conductive trace is welded to the pad using thermosonic bonding. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, base 220 corresponds to base 120, etc.

FIGS. 5A, 6A, 7A and 8A are cross-sectional, top, bottom and cross-sectional views, respectively, of semiconductor chip 210 which includes upper surface 212 and lower surface 214. Upper surface 212 includes conductive pad 216 and passivation layer 218. Pad 216 has the aluminum base serve as a surface layer.

FIGS. 5B, 6B, 7B and 8B are cross-sectional, top, bottom and cross-sectional views, respectively, of base 220 which includes top surface 222 and bottom surface 224.

FIGS. 5C, 6C, 7C and 8C are cross-sectional, top, bottom and cross-sectional views, respectively, of photoresist layer 226 formed on bottom surface 224 of base 220. Photoresist layer 226 contains opening 228 that selectively exposes portion 230 of bottom surface 224.

FIGS. 5D, 6D, 7D and 8D are cross-sectional, top, bottom and cross-sectional views, respectively, of conductive trace 232 formed on base 220 by electroplating. Conductive trace 232 includes top surface 234, bottom surface 236, and peripheral sidewalls 240 and 242.

FIGS. 5E, 6E, 7E and 8E are cross-sectional, top, bottom and cross-sectional views, respectively, of base 220 and conductive trace 232 after photoresist layer 226 is stripped.

FIGS. 5F, 6F, 7F and 8F are cross-sectional, top, bottom and cross-sectional views, respectively, of adhesive 244 formed on base 220 and conductive trace 232.

FIGS. 5G, 6G, 7G and 8G are cross-sectional, top, bottom and cross-sectional views, respectively, of chip 210 mechanically attached to conductive trace 232 by adhesive 244. Chip 210 and conductive trace 232 are positioned relative to one another so that conductive trace 232 is disposed above and overlaps and is electrically isolated from pad 216. However, conductive trace 232 overlaps only one peripheral edge of pad 216. In addition, conductive trace 232 provides fan-in (rather than fan-out) routing for pad 216.

FIGS. 5H, 6H, 7H and 8H are cross-sectional, top, bottom and cross-sectional views, respectively, of encapsulant 246 formed on chip 21 0.

FIGS. 5I, 6I, 7I and 8I are cross-sectional, top, bottom and cross-sectional views, respectively, of chip 210, conductive trace 232, adhesive 244 and encapsulant 246 after base 220 is removed by wet chemical etching.

FIGS. 5J, 6J, 7J and 8J are cross-sectional, top, bottom and cross-sectional views, respectively, of opening 250 formed in adhesive 244 by laser ablation. Opening 250 exposes pad 216 and peripheral sidewalls 240 and 242 without exposing bottom surface 236, and adhesive 244 remains in contact with and sandwiched between pad 216 and conductive trace 232.

FIGS. 5K, 6K, 7K and 8K are cross-sectional, top, bottom and cross-sectional views, respectively, of the structure after adhesive 244 between pad 216 and conductive trace 232 is removed and opening 250 is enlarged by isotropic plasma etching.

FIGS. 5L, 6L, 7L and 8L are cross-sectional, top, bottom and cross-sectional views, respectively, of connection joint 254 formed by welding pad 216 to conductive trace 232.

Connection joint 254 is formed using a conventional TAB inner lead bonding tool (not shown). The bonding tool is initially positioned above conductive trace 232, axially aligned with pad 216 and axially centered relative to opening 250. The bonding tool then moves downward towards pad 216 and contacts the portion of conductive trace 232 that overlaps pad 216. Conductive trace 232 is relatively thin (12.5 microns thick) and flexible (composed of copper, nickel and gold) and has a floating distal end that overlaps pad 216 and is spaced from pad 216 by a 10 micron gap. The bonding tool continues to move downward towards pad 216 after contacting conductive trace 232, and as a result, conductive trace 232 bends inside opening 250 and advances towards pad 216. However, conductive trace 232 outside opening 250 remains embedded in and securely affixed to adhesive 244, and the bonding tool has no appreciable affect on conductive trace 232 outside opening 250. The bonding tool continues to bend and advance conductive trace 232 towards pad 216, and conductive trace 232 contacts and is pressed against pad 216. The bonding tool also applies heat and ultrasonic vibration to conductive trace 232. The combination of heat, pressure and ultrasonic vibration causes metallurgical welding between pad 216 and conductive trace 232. Thus, the bonding tool welds pad 216 to conductive trace 232 by applying thermosonic bonding, and connection joint 254 is the resultant weld that contacts and electrically connects pad 216 and conductive trace 232. Thereafter, the bond tool moves upward and away from pad 216 and retracts from the structure without exerting upward pressure on connection joint 254.

After connection joint 254 is formed, conductive trace 232 remains embedded in and securely affixed to adhesive 244 outside opening 250 and is bent towards and electrically connected to pad 216 inside opening 250.

At this stage, the manufacture of semiconductor chip assembly 256 that includes chip 210, conductive trace 232, adhesive 244, encapsulant 246 and connection joint 254 can be considered complete.

FIGS. 9A–9M, 10A–10M, 1A–11M and 12A–12M are cross-sectional, top, bottom and cross-sectional views, respectively, of a method of connecting a conductive trace to a semiconductor chip in accordance with a third embodiment of the present invention.

FIGS. 12A–12M are oriented orthogonally with respect to FIGS. 9A–9M and depict FIGS. 9A–9M as viewed from left-to-right. In the third embodiment, the opening in the adhesive is formed by laser ablation followed by plasma etching, and the laser ablation is provided by multiple laser direct writes that are focused within the periphery of the pad and offset relative to one another. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, base 320 corresponds to base 120, etc.

FIGS. 9A, 1A, 11A and 12A are cross-sectional, top, bottom and cross-sectional views, respectively, of semiconductor chip 310 which includes upper surface 312 and lower surface 314. Upper surface 312 includes conductive pad 316 and passivation layer 318.

FIGS. 9B, 10B, 11B and 12B are cross-sectional, top, bottom and cross-sectional views, respectively, of base 320 which includes top surface 322 and bottom s surface 324.

FIGS. 9C, 10C, 11C and 12C are cross-sectional, top, bottom and cross-sectional views, respectively, of photoresist layer 326 formed on bottom surface 324 of base 320. Photoresist layer 326 contains opening 328 that selectively exposes portion 330 of bottom surface 324.

FIGS. 9D, 10D, 11D and 12D are cross-sectional, top, bottom and cross-sectional views, respectively, of conductive trace 332 formed on base 320 by electroplating. Conductive trace 332 includes top surface 334, bottom surface 336, and peripheral sidewalls 340 and 342.

FIGS. 9E, 10E, 11E and 12E are cross-sectional, top, bottom and cross-sectional views, respectively, of base 320 and conductive trace 332 after photoresist layer 326 is stripped.

FIGS. 9F, 10F, 11F and 12F are cross-sectional, top, bottom and cross-sectional views, respectively, of adhesive 344 formed on base 320 and conductive trace 332.

FIGS. 9G, 10G, 11G and 12G are cross-sectional, top, bottom and cross-sectional views, respectively, of chip 310 mechanically attached to conductive trace 332 by adhesive 344. Chip 310 and conductive trace 332 are positioned relative to one another so that conductive trace 332 is disposed above and overlaps and is electrically isolated from pad 316. However, conductive trace 332 overlaps only one peripheral edge of pad 316 and does not overlap the center of pad 316. In addition, conductive trace 332 provides fan-in (rather than fan-out) routing for pad 316.

FIGS. 9H, 10H, 11H and 12H are cross-sectional, top, bottom and cross-sectional views, respectively, of encapsulant 346 formed on chip 310.

FIGS. 9I, 10I, 11I and 12I are cross-sectional, top, bottom and cross-sectional views, respectively, of chip 310, conductive trace 332, adhesive 344 and encapsulant 346 after base 320 is removed by wet chemical etching.

FIGS. 9J, 10J, 11J and 12J are cross-sectional, top, bottom and cross-sectional views, respectively, of opening 350 formed in adhesive 344 by laser ablation. Opening 350 exposes pad 316 and peripheral sidewalls 340 and 342 without exposing bottom surface 336, and adhesive 344 remains in contact with and sandwiched between pad 316 and conductive trace 332.

In this instance, a selective TEA $CO_2$ laser etch is applied using multiple laser direct writes that are focused within the periphery of pad 316 and offset relative to one another. The laser has a spot size of 50 microns and pad 316 has a length and width of 70 microns. The laser is aimed at a central portion of pad 316 within the periphery of pad 316 and does not strike passivation layer 318. The laser removes a portion of adhesive 344 above pad 316 and outside and adjacent to conductive trace 332.

However, the portion of adhesive 344 that overlaps the peripheral edges of pad 316 remains intact, and likewise, the portion of adhesive 344 slightly outside the periphery of pad 316 remains intact. In addition, the portion of adhesive 344 sandwiched between pad 316 and conductive trace 332 remains intact.

Figure 10A:
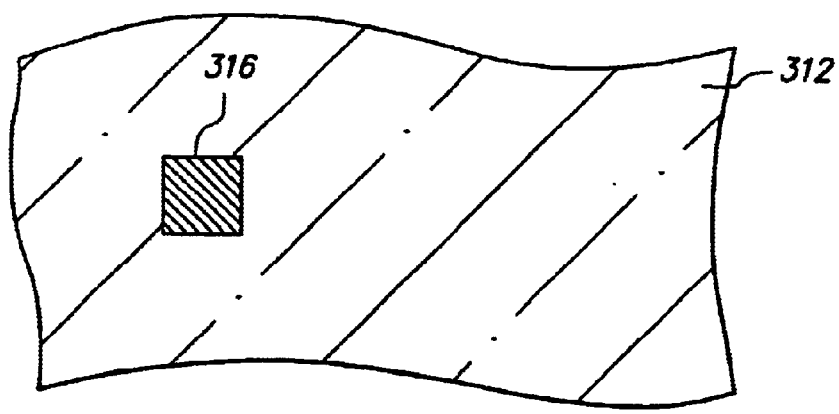
FIGS. 10A–10M are top plan views corresponding to FIGS. 9A–9M, respectively.
Figure 10B:
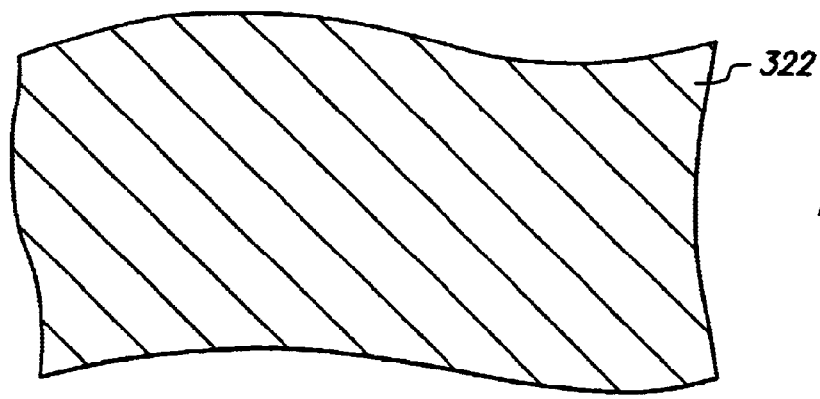
Figure 10C:
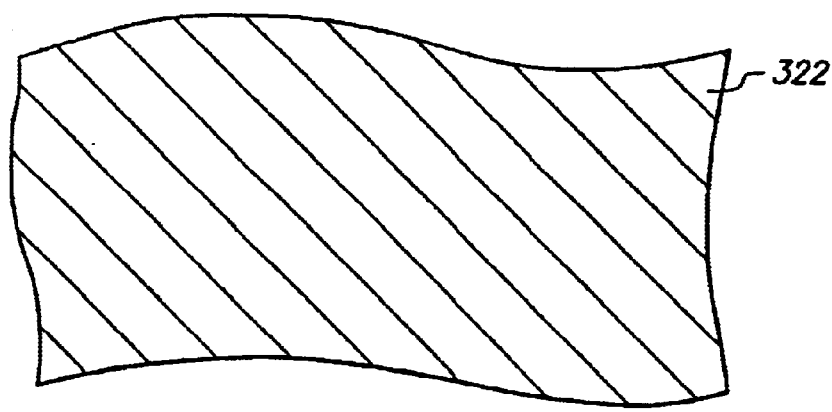
Figure 10D:
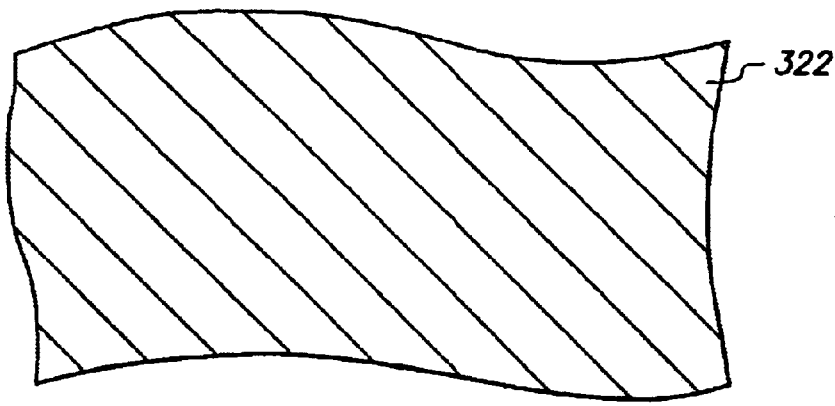
Figure 10E:
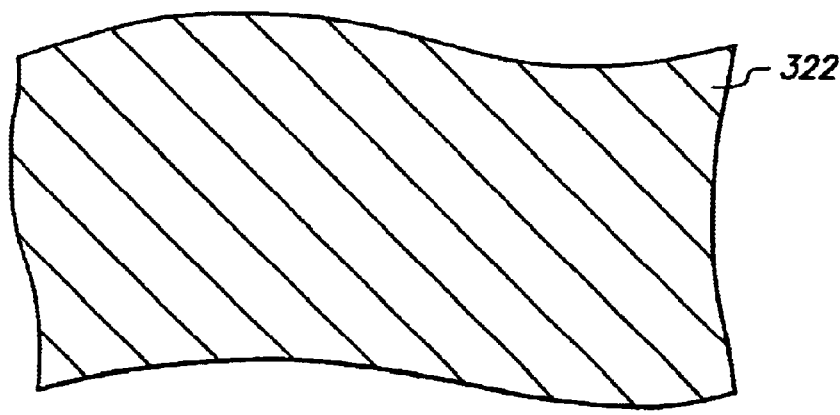
Figure 10F:
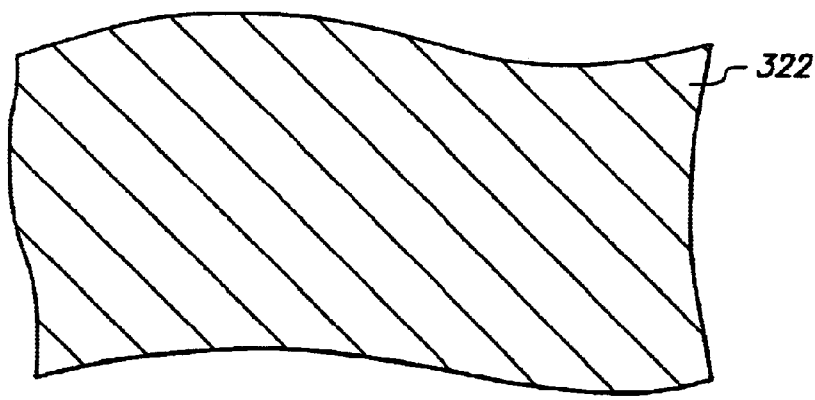
Figure 10G:
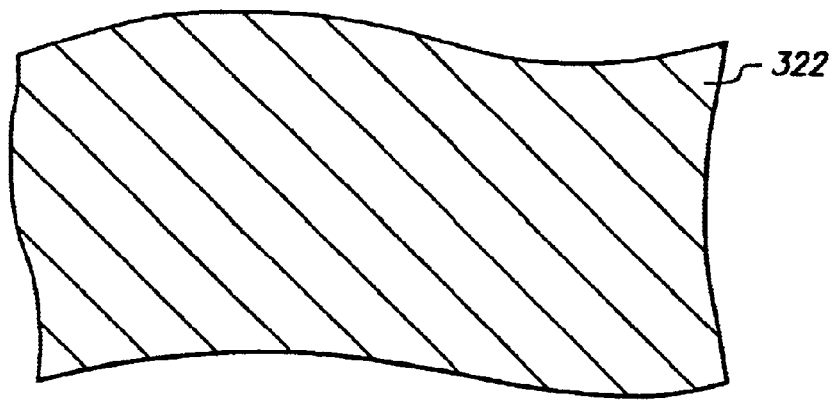
Figure 10H:
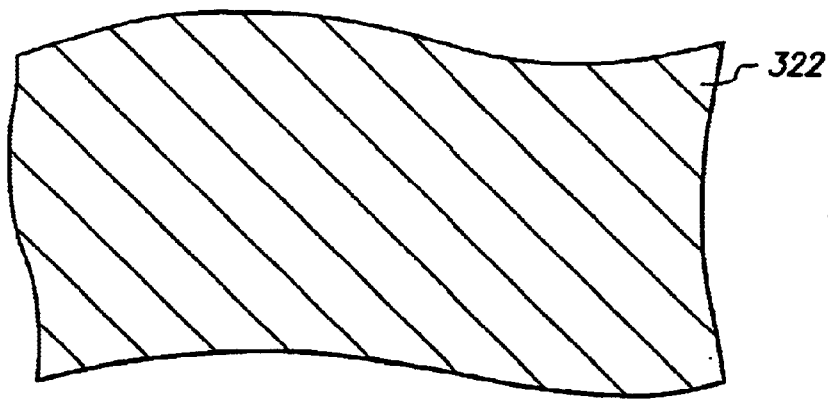
Figure 10I:
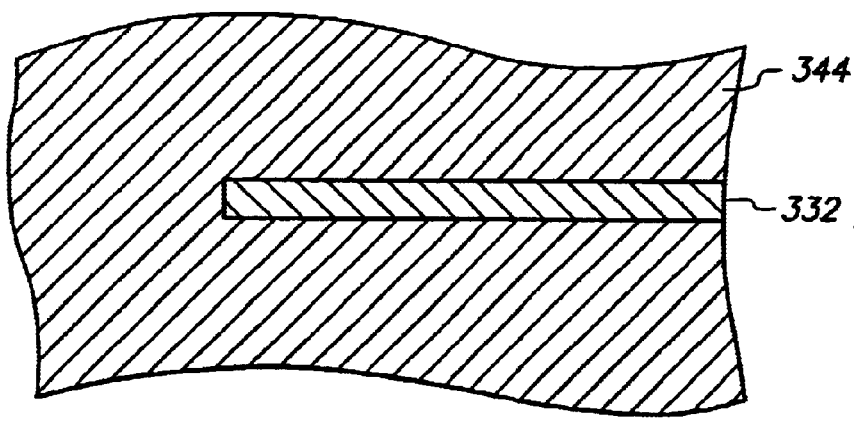
Figure 10J:
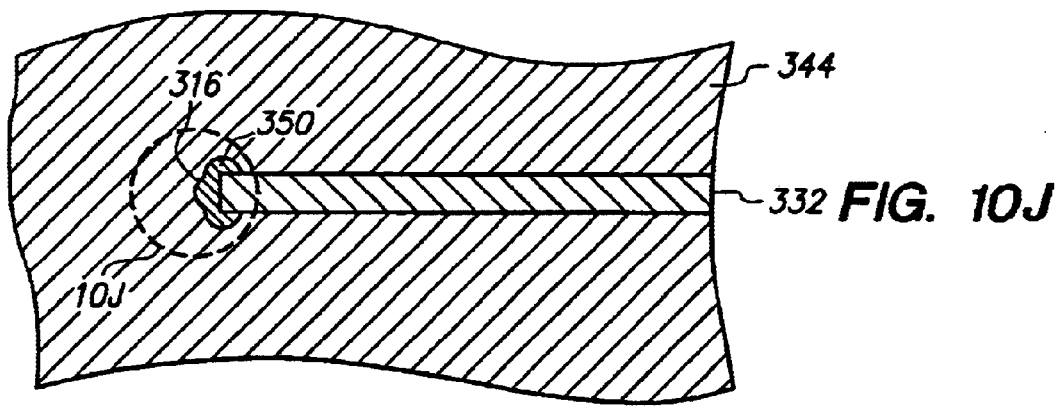
Figure 11J:
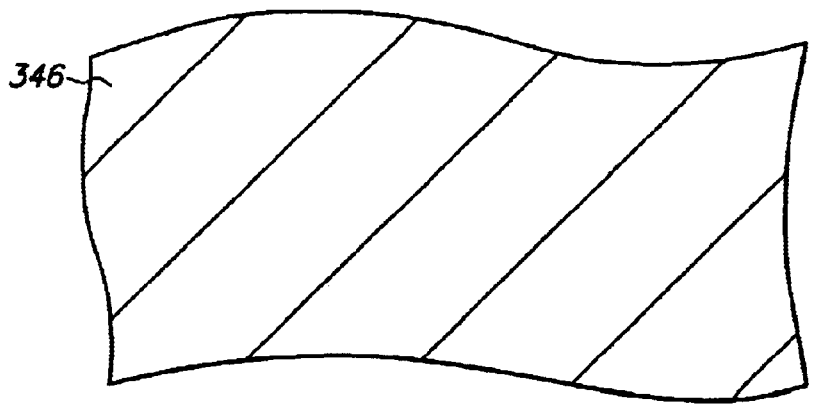
Figure 9K:
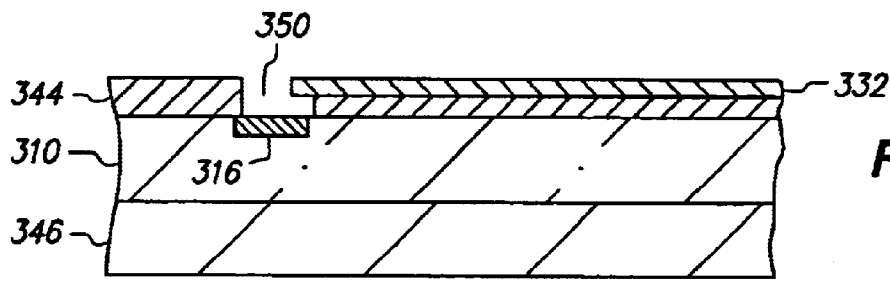
Figure 10K:
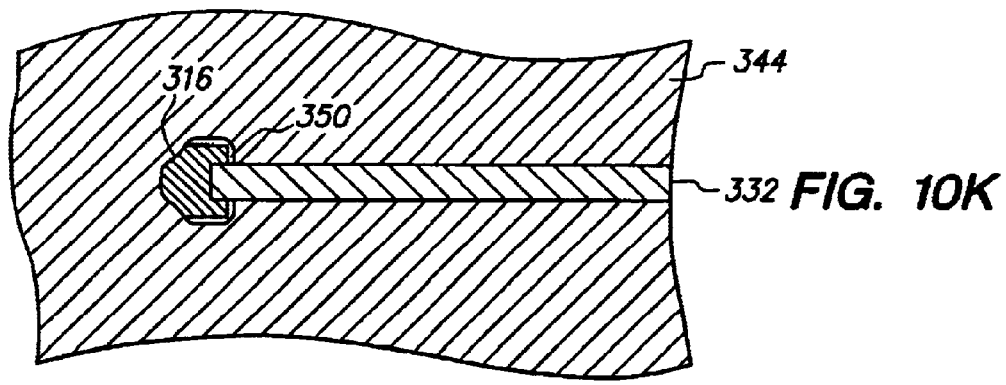
Figure 11K:
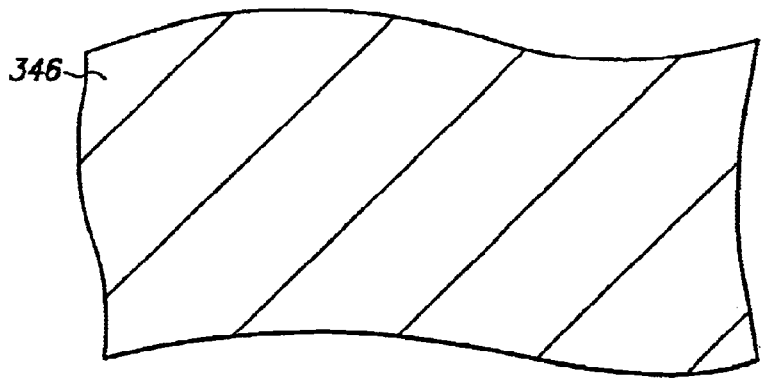
Figure 9L:
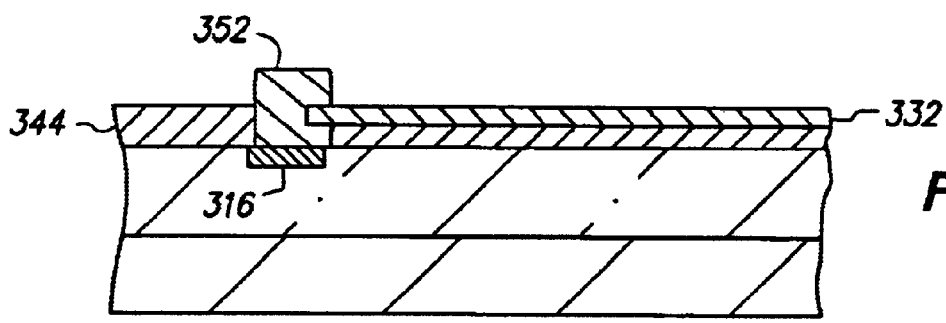
Figure 10L:
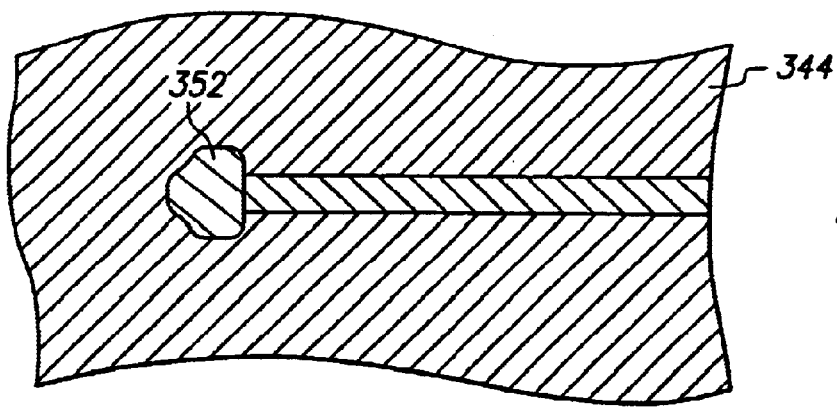
Figure 11L:
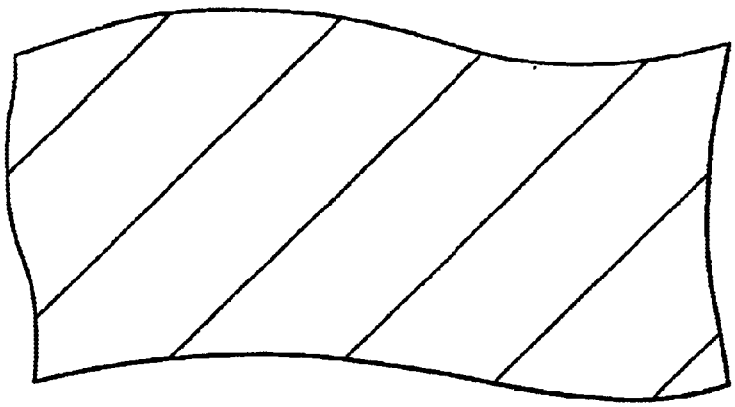
Figure 9M:
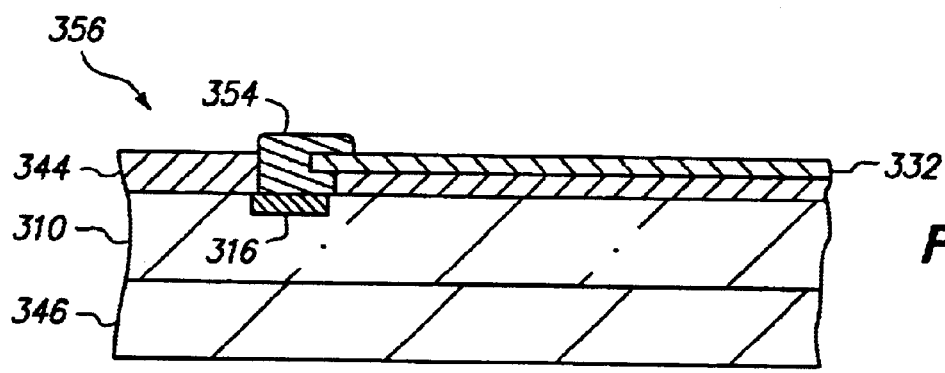
Figure 10M:
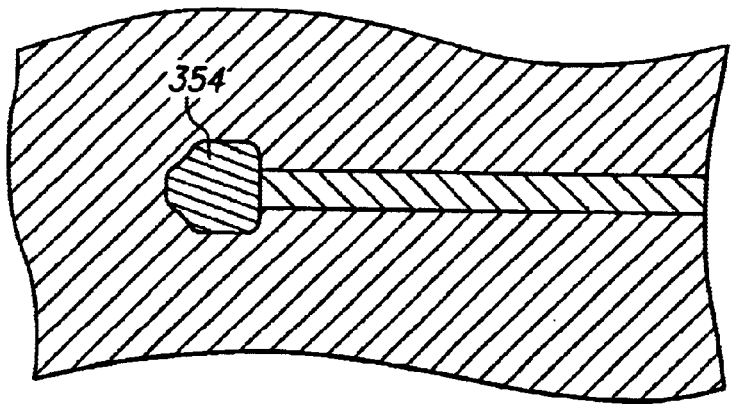
Figure 11M:
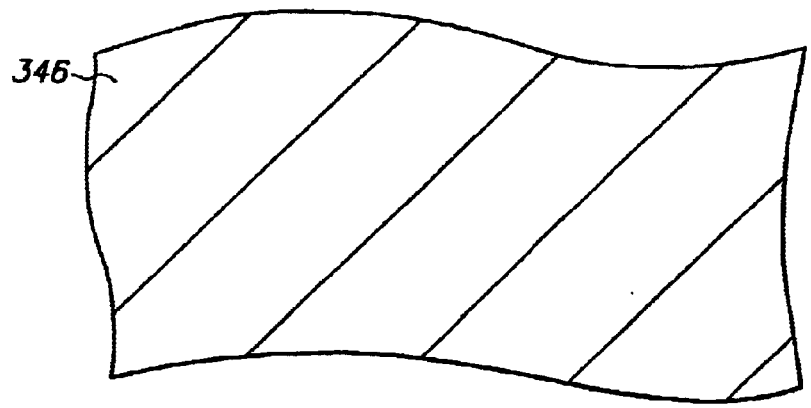
Figure 12A:
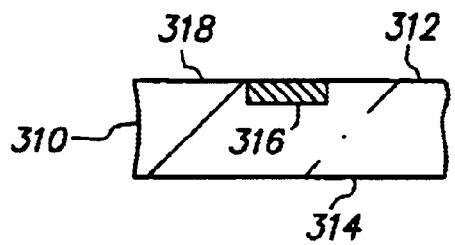
FIGS. 12A–12M are cross-sectional views corresponding to FIGS. 9A–9M, respectively.
Figure 12B:
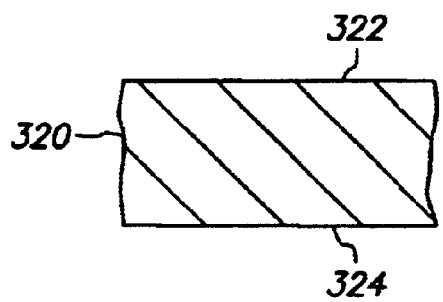
Figure 12C:
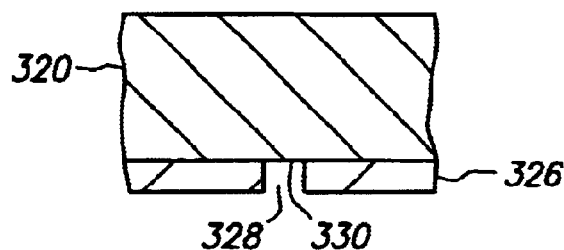
Figure 12D:
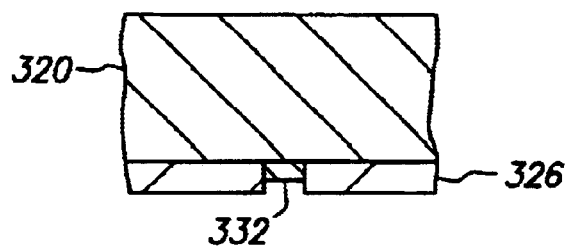
Figure 12E:
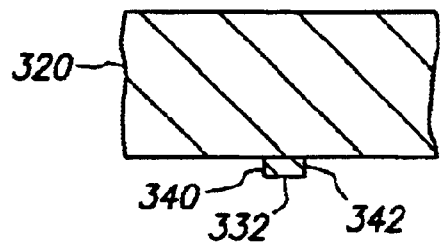
Figure 12F:
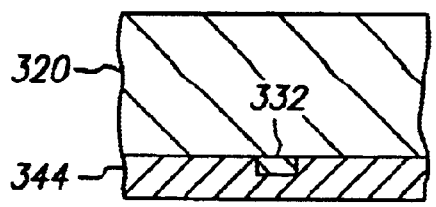
Figure 12G:
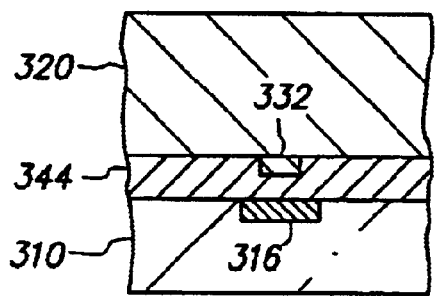
Figure 12H:
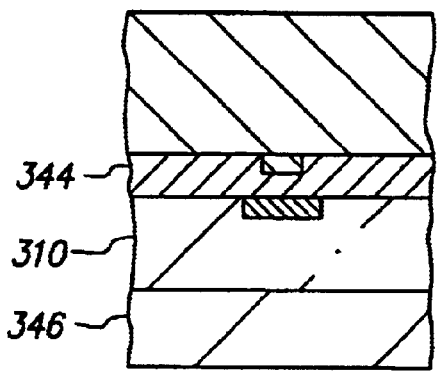
Figure 12I:
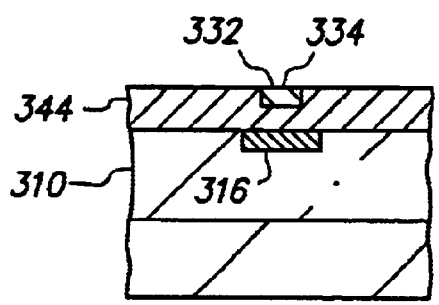
Figure 12J:
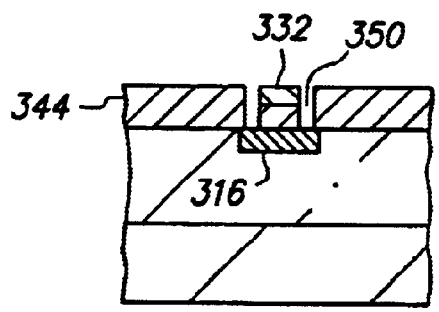
Figure 12K:
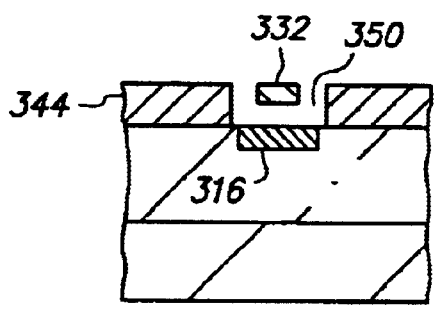
Figure 12L:
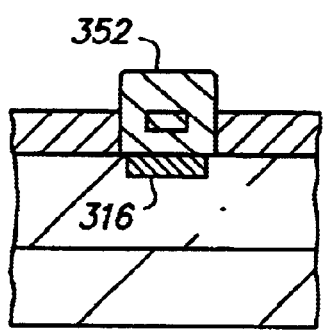
Figure 12M:
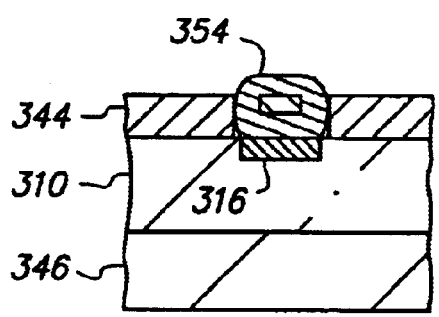
Figure 13A:
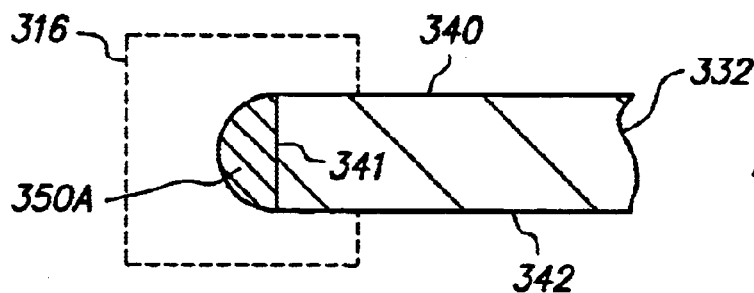
FIGS. 13A–13E are enlarged top plan views taken of encircled detail 10J in FIG. 10J showing the formation of the opening in the adhesive in greater detail.

FIGS. 13A–13E are enlarged top plan views taken of encircled detail 10J in FIG. 10J showing the formation of opening 350 by multiple laser direct writes in greater detail. For convenience of illustration, the peripheral edges of pad 316 outside conductive trace 332 and beneath adhesive 344 are shown in phantom. FIG. 13A shows opening 350A formed in adhesive 344 by a first laser direct write. Opening 350A exposes substantially all of peripheral sidewall 341 of conductive trace 332 and exposes substantially none of peripheral sidewalls 340 and 342 of conductive trace 332.

Figure 13B:
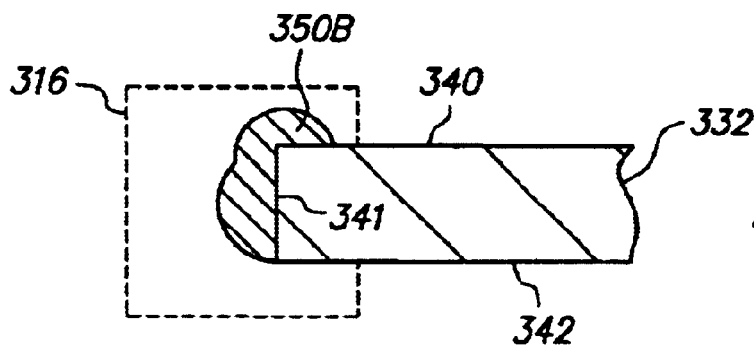

FIG. 13B shows opening 350B formed in adhesive 344 by a second laser direct write. Opening 350B exposes most but not all of the portion of peripheral sidewall 340 that overlaps pad 316 and exposes substantially none of peripheral sidewalls 341 and 342.

Figure 13C:
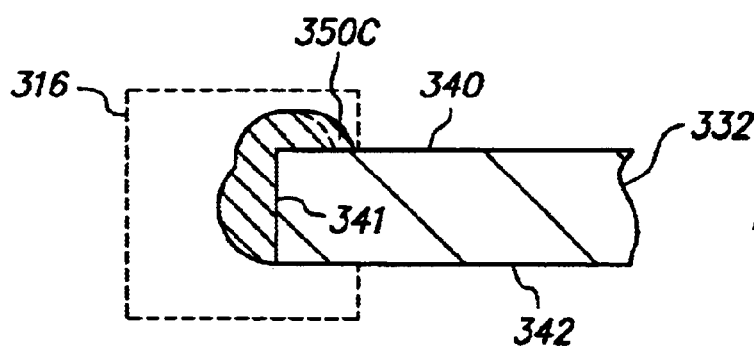

FIG. 13C shows opening 350C formed in adhesive 344 by a third laser direct write. Opening 350C exposes more of the portion of peripheral sidewall 340 that overlaps pad 316 and exposes substantially none of peripheral sidewalls 341 and 342.

For convenience of illustration, the boundary of opening 350B that is expanded by opening 350C is shown in phantom.

Figure 13D:
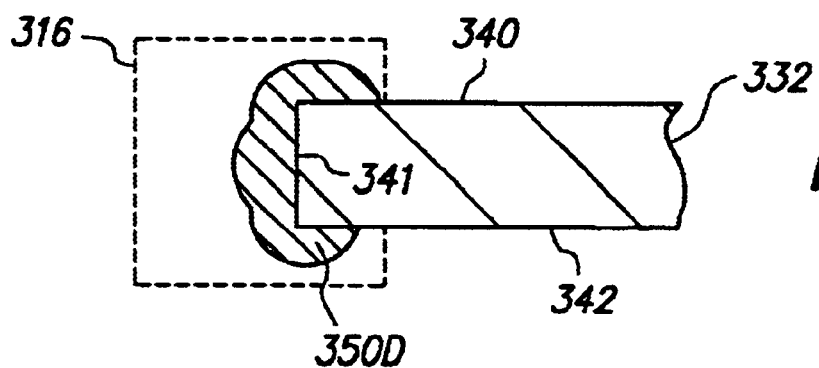

FIG. 13D shows opening 350D formed in adhesive 344 by a fourth laser direct write. Opening 350D exposes most but not all of the portion of peripheral sidewall 342 that overlaps pad 316 and exposes substantially none of peripheral sidewalls 340 and 341.

Figure 13E:
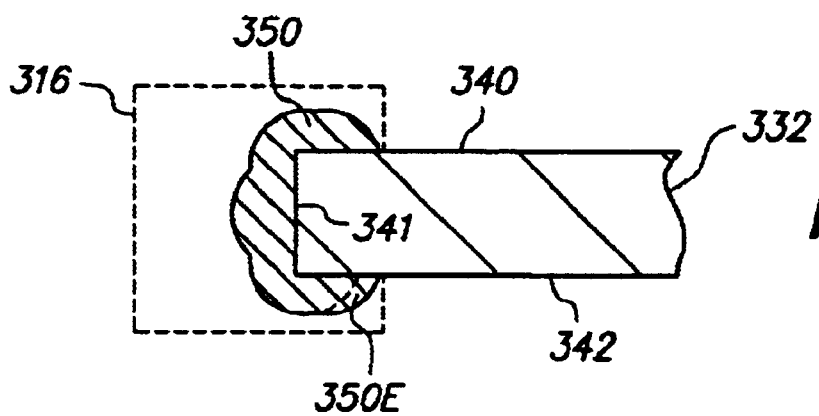

FIG. 13E shows opening 350E formed in adhesive 344 by a fifth laser direct write. Opening 350E exposes more of the portion of peripheral sidewall 342 that overlaps pad 316 and exposes substantially none of peripheral sidewalls 340 and 341. For convenience of illustration, the boundary of opening 350D that is expanded by opening 350E is shown in phantom.

Opening 350 is provided by openings 350A, 350B, 350C, 350D and 350E.

FIGS. 9K, 10K, 11K and 12K are cross-sectional, top, bottom and cross-sectional views, respectively, of the structure after adhesive 344 between pad 316 and is conductive trace 332 is removed and opening 350 is enlarged by isotropic plasma etching.

FIGS. 9L, 10L, 11L and 12L are cross-sectional, top, bottom and cross-sectional views, respectively, of solder paste 352 deposited into opening 350 and on pad 316 and conductive trace 332. FIGS. 9M, 10M, 11M and 12M are cross-sectional, top, bottom and cross-sectional views, respectively, of connection joint 354 formed by solder reflow.

At this stage, the manufacture of semiconductor chip assembly 356 that includes chip 310, conductive trace 332, adhesive 344, encapsulant 346 and connection joint 354 can be considered complete.

The semiconductor chip assemblies described above are merely exemplary. Numerous other embodiments are contemplated.

Figure 14:
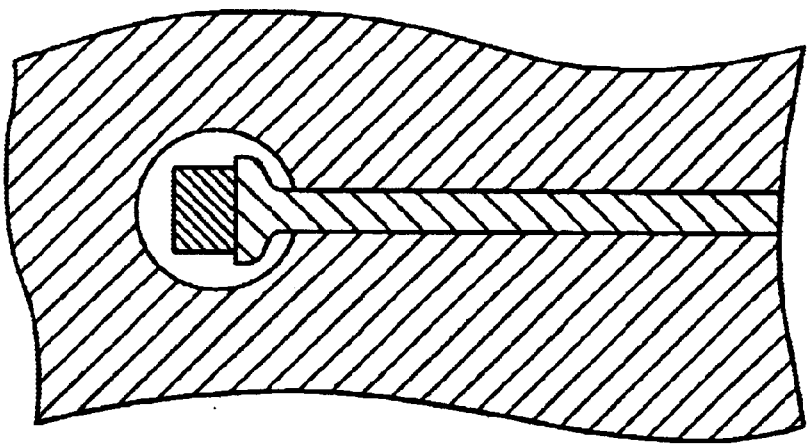
FIGS. 14–17 are top plan views of conductive trace variations in accordance with the present invention.
Figure 15:
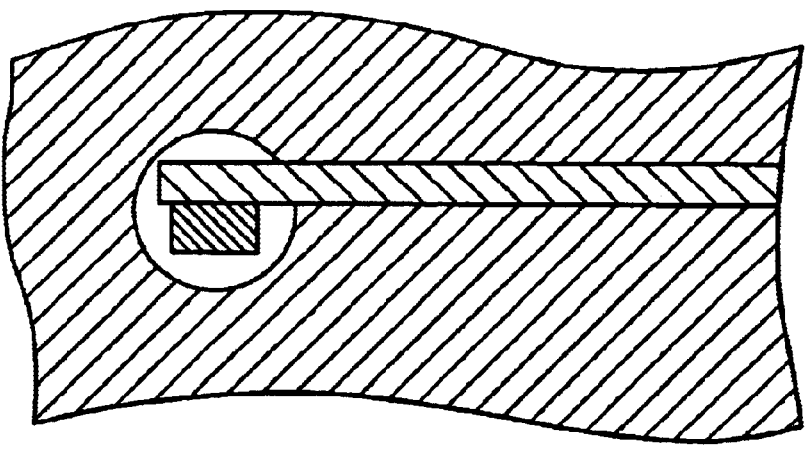
Figure 16:
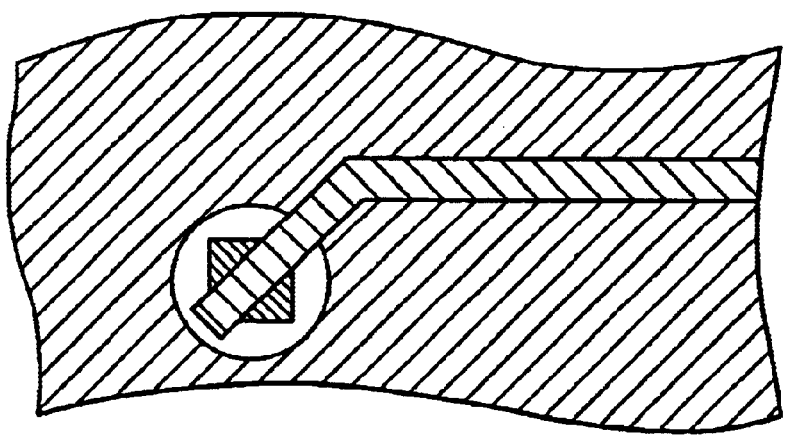
Figure 17:
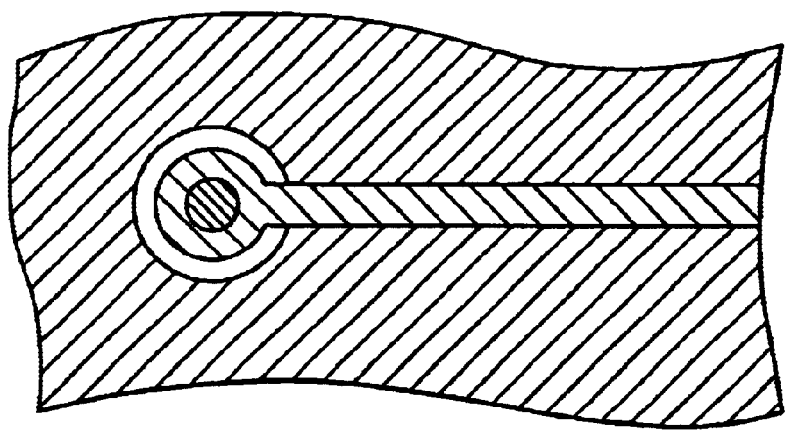

The conductive trace can have various shapes and sizes. The conductive trace can overlap various portions of the pad, such as two opposing peripheral edges and the center of the pad (FIG. 2K), one peripheral edge and the center of the pad (FIG. 6K), one peripheral edge but not the center of the pad (FIG. 10K), three peripheral edges but not the center of the pad (FIGS. 14 and 15), two corners and the center of the pad (FIG. 16) or four peripheral edges but not the center of the pad (FIG. 17).

The conductive trace can be various conductive metals including copper, gold, nickel, silver, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace may function as a signal, power or ground layer depending on the purpose of the associated chip pad. Likewise, the conductive trace can fan-in or fan-out or both, regardless of its shape and the connection joint.

The conductive trace can be formed on the metal base by numerous deposition techniques including electroplating and electroless plating.

The conductive trace can be deposited as a single layer or multiple layers. For instance, the conductive trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. If desired, the conductive trace can be spot plated near the pad to make it compatible with receiving the connection joint. For instance, a copper conductive trace can be spot plated with nickel and then silver to make it compatible with a gold ball bond connection joint and avoid the formation of brittle silver-copper intermetallic compounds.

As another example, the conductive trace can consist of a non-copper layer electroplated on a copper base and a copper layer electroplated on the non-copper layer. Suitable non-copper layers include nickel, gold, palladium and silver. After the conductive trace is attached to the chip by the adhesive, a wet chemical etch can be applied that is highly selective of copper with respect to the non-copper layer to remove the copper base (or the exposed portion of the copper base) without removing the copper or non-copper layers. The non-copper layer provides an etch stop that prevents the wet chemical etch from removing the copper layer. Furthermore, it is understood that in the context of the present invention, the conductive trace and the metal base are different metals (or metallic materials ) even if a multi-layer conductive trace includes a single layer that is similar to the metal base (such as the example described above).

The conductive trace need not necessarily be flat, and a vertically protruding ball, pad, pillar (columnar post), bumped terminal or contact terminal can be deposited on or integral with the conductive trace. A pillar is particularly well-suited for reducing thermal mismatch related stress in the next level assembly, and a bumped terminal is particularly well-suited for providing vertical compliance in the next level assembly. Further details regarding conductive traces with various pillars, bumped terminals and contact terminals are set forth in U.S. application Ser. No. 09/878, 649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/997,973 filed Nov. 29, 2001 by Charles W. C. Lin et al. entitled "Method of Connecting a Bumped Conductive Trace to a Semiconductor Chip," U.S. application Ser. No. 10/156,277 filed May 28, 2002 by Charles W. C. Lin entitled "Method of Making a Pillar in a Laminated Structure for a Semiconductor Chip Assembly," U.S. application Ser. No. 10/156,469 filed May 28, 2002 by Charles W. C. Lin et al. entitled "Method of Making a Bumped Terminal in a Laminated Structure for a Semiconductor Chip Assembly," U.S. application Ser. No. 10/165,483 filed Jun. 6, 2002 by Charles W. C. Lin et al. entitled "Method of Making a Contact Terminal with a Plated Metal Peripheral Sidewall Portion for a Semiconductor Chip Assembly," and U.S. application Ser. No. 10/188,459 filed Jul. 3, 2002 by Charles W. C. Lin et al. entitled "Method of Connecting a Conductive Trace and an Insulative Base to a Semiconductor Chip using Multiple Etch Steps" which are incorporated by reference.

The conductive trace can be formed and attached to the chip by a wide variety of lead-on-chip (LOC) and other connection techniques. See, for instance, the U.S. Applications mentioned in the preceding paragraph.

The metal base can be various metals including copper, copper alloys, iron-nickel alloys, aluminum, and so on.

The metal base need not necessarily be removed. For instance, a portion of the metal base above the pad can be selectively etched to permit formation of the opening in the adhesive, and another portion of the metal base that is disposed within the periphery of the chip can remain intact and provide a heat sink.

The pad can have numerous shapes including a flat rectangular shape and a bumped shape. For instance, a bump-shaped pad may extend into the opening in the adhesive. The pad can either be partially or completely exposed prior to forming the connection joint. The pad can have a length and width that are larger than, equal to, or smaller than the diameter of the opening. Preferably, the pad and opening have the same or similar size, and a substantial portion of the pad is directly beneath the opening. If desired, the pad can be treated to accommodate the connection joint. For instance, the pad can be rendered catalytic to an electroless nickel connection joint by depositing several metal layers, such as chromium/copper/gold or titanium/nickel/gold on the aluminum base, or alternatively, zincating the aluminum base and electrolessly plating a nickel surface layer on the zincated aluminum base.

Numerous adhesives can be applied between the chip and the conductive trace. For instance, the adhesive can be applied as a paste or a liquid applied by screen-printing, spin-on, or spray-on. The adhesive can be a single layer that is applied to the conductive trace then contacted to the chip or a single layer that is applied to the chip and then contacted to the conductive trace. Similarly, the adhesive can be multiple layers with a first layer applied to the conductive trace, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives can also be used.

The opening in the adhesive can be formed with numerous etching techniques. For instance, the opening can be formed by laser ablation followed by plasma etching. Preferably, the laser anisotropically removes a substantial portion of the adhesive that covers the pad and is not sandwiched between the conductive trace and the pad, and then the plasma isotropically removes substantially all of the adhesive that is sandwiched between the conductive trace and the pad. The opening can also be formed by anisotropic plasma etching followed by isotropic plasma etching, either by providing separate plasma etching steps or adjusting in-situ the plasma etching parameters. Preferably, the plasma anisotropically removes a substantial portion of the lo adhesive that covers the pad and is not sandwiched between the conductive trace and the pad, and then the plasma isotropically removes substantially all of the adhesive that is sandwiched between the conductive trace and the pad. The opening can also be formed by isotropic plasma etching. The opening can also be formed by laser ablation followed by isotropic wet chemical etching. Preferably, the laser anisotropically removes a substantial portion of the adhesive that covers the pad and is not sandwiched between the conductive trace and the pad, and then the wet chemical etch isotropically removes substantially all of the adhesive that is sandwiched between the conductive trace and the pad. A suitable wet chemical etch can be provided by a solution containing potassium permanganate. See also, for instance, U.S. Pat. No. 6,334,942. The opening can also be formed by isotropic wet chemical etching.

The opening can be formed by blanket or selective removal techniques, depending for instance on the removal techniques employed and whether portions of the adhesive between the conductive trace and the chip are shielded by the metal base or an insulative base. Thus, the laser ablation may be implemented by laser direct write without a mask or projection laser ablation with a mask, and the subsequent plasma etching may be implemented by blanket plasma etching without a mask or selective plasma etching with a mask. Alternatively, an isotropic plasma etch or wet chemical etch can be selectively applied to form the opening using a mask.

The opening can be formed without forming another opening in another material. Alternatively, the opening can be formed as part of a hole that extends through the adhesive and another material such as an insulative base disposed above the adhesive. For instance, a laminated structure can include the conductive trace and an insulative base, the adhesive can be disposed between the laminated structure and the chip such that the adhesive contacts and is sandwiched between the conductive trace and the chip, the adhesive contacts and is sandwiched between the insulative base and the chip, and the insulative base overlaps the pad, and then the hole can be formed through the insulative base and the adhesive to expose the conductive trace and the pad. In this manner, forming the hole includes forming the opening in the adhesive. The etching techniques mentioned above that can form the opening in the adhesive can also form the hole in the insulative base and the adhesive. These etching techniques, which are highly selective of the adhesive, can also be highly selective of the insulative base, and therefore applied to the insulative base and the adhesive in a similar fashion to the adhesive alone. For instance, the hole can be formed by laser ablation followed by plasma etching. Preferably, the laser anisotropically removes substantial portions of the insulative base and the adhesive that cover the pad but no appreciable amount of the adhesive that is sandwiched between the conductive trace and the pad, and then the plasma isotropically removes substantially all of the adhesive that is sandwiched between the conductive trace and the pad.

The opening can have a circular, ovular, square, rectangular or other shape (as viewed from the top surface of the adhesive). The opening may be aligned with and expose a single pad or a plurality of pads. Furthermore, the opening sidewalls may have a wide variety of shapes and slopes including vertical sidewalls, tapered sidewalls, continuous sidewalls and stepped sidewalls.

The term "anisotropic etching" as used herein refers to etching in which the horizontal etch rate is small compared to the vertical etch rate, and the term "isotropic etching" as used herein refers to etching in which the horizontal etch rate is significant compared to the vertical etch rate. Stated differently, anisotropic etching refers to a high degree of anisotropy, and isotropic etching refers to a low degree of anisotropy. Thus, anisotropic etching includes both complete directional preference and predominant directional preference, and isotropic etching includes both no directional preference and minor directional preference.

The term "removing" the adhesive between the conductive trace and the pad as used herein permits trace amounts of the adhesive on a microscopic scale to remain between the conductive trace and the pad. Similarly, "removing" the adhesive from the pad such that "none" of the adhesive covers the pad as used herein permits trace amounts of the adhesive on a microscopic scale to remain on the pad.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing, conductive adhesive curing and welding, and can have a wide variety of shapes and sizes. The shape and composition of the connection joint depends on the composition of the conductive trace and the pad as well as design and reliability considerations. Preferably, a deposited connection joint fills substantially all of is the gap between the conductive trace and the pad.

Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

A welded connection joint can be formed by numerous metallurgical bonding techniques including thermocompression bonding, thermosonic bonding, ultrasonic bonding, laser bonding and other approaches in which the conductive trace is welded to the pad using a combination of heat, pressure and/or vibration without using material other than the materials of the conductive trace and the pad. It is understood that incidental amounts of other materials such as surface preparation agents, reaction products and contaminants such as oxide coatings and the like may be present in or around the welded connection joint. Welded connection joints can be formed one at a time with a single-point bonder or simultaneously with a gang bonder. Furthermore, if desired, the bonding tool can break a frangible portion of the conductive trace that overlaps the opening in the adhesive as it engages the conductive trace. See, for instance, U.S. Pat. No. 6,012,224.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip. For instance, a glob-top coating can be deposited on the chip after mechanically attaching the chip to the conductive trace, and then the encapsulant can be formed on the glob-top coating.

An insulative base can be formed over the conductive trace either before or after the connection joint is formed in order to provide enhanced mechanical strength and protection from unwanted solder reflow during the next level assembly. The insulative base may be rigid or flexible, and can be various dielectric films formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof.

Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper.

After the connection joint is formed, further encapsulation can be performed if desired to enhance the mechanical strength of the assembly in the event the encapsulant and/or insulative base are particularly thin or omitted. Likewise, further encapsulation can be used to cover the connection joint if the insulative base is omitted.

After the connection joint is formed, a soldering material or solder ball can be deposited over the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted, rotated or slanted. Likewise, the conductive trace is shown above the chip and the metal base is shown above the conductive trace with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The adhesive and/or insulative base protects the chip from handling damage and provides a known dielectric barrier for the conductive trace. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder joints, although the process is flexible enough to accommodate these techniques if desired. The process is highly versatile and permits a wide variety of mature connection joint technologies to be used in a unique and improved manner. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another; then removing the adhesive between the conductive trace and the pad; and then forming a connection joint that contacts and electrically connects the conductive trace and the pad.

2. The method of claim 1, wherein disposing the adhesive includes contacting the adhesive to the conductive trace and the chip and then curing the adhesive.

3. The method of claim 1, wherein disposing the adhesive includes contacting the adhesive to an insulative base and the chip such that the adhesive contacts and is sandwiched between the insulative base and the pad.

4. The method of claim 1, wherein removing the adhesive includes applying a plasma etch, thereby forming an opening in the adhesive that exposes the pad.

5. The method of claim 1, wherein removing the adhesive includes applying a plasma etch after forming an opening in the adhesive by laser ablation that exposes the pad.

6. The method of claim 1, wherein forming the connection joint includes depositing the connection joint on the conductive trace and the pad.

7. The method of claim 6, wherein the connection joint is an electroplated metal, an electrolessly plated metal, a ball bond, solder or conductive adhesive.

8. The method of claim 1, wherein the forming the connection joint includes welding the conductive trace to the pad.

9. The method of claim 8, wherein the welding is performed by thermocompression bonding, thermosonic bonding or ultrasonic bonding.

10. The method of claim 1, wherein the adhesive is a thermosetting or thermoplastic adhesive.

11. The method of claim 1, wherein the adhesive is silicone, polyimide or epoxy.

12. The method of claim 1, wherein the adhesive is coplanar with and adjacent to a surface of the conductive trace that overlaps and faces away from the pad after mechanically attaching the conductive trace to the chip and before removing the adhesive.

13. The method of claim 1, wherein the adhesive contacts and is sandwiched between the conductive trace and the chip after removing the adhesive between the conductive trace and the pad.

14. The method of claim 1, wherein the conductive trace overlaps a center of the pad after mechanically attaching the conductive trace to the chip.

15. The method of claim 1, wherein the conductive trace does not overlap a center of the pad after mechanically attaching the conductive trace to the chip.

16. The method of claim 1, wherein the conductive trace overlaps only one peripheral edge of the pad after mechanically attaching the conductive trace to the chip.

17. The method of claim 1, wherein the conductive trace overlaps only two peripheral edges of the pad, and the two peripheral edges are opposite one another, after mechanically attaching the conductive trace to the chip.

18. The method of claim 1, wherein the conductive trace overlaps only three peripheral edges of the pad, and two of the three peripheral edges are opposite one another, after mechanically attaching the conductive trace to the chip.

19. The method of claim 1, wherein the connection joint contacts a surface of the conductive trace that overlaps and faces away from the pad.

20. The method of claim 1, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

21. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps and is spaced from the pad, the adhesive contacts and is sandwiched between the conductive trace and the pad and covers all of the pad, and the conductive trace and the pad are electrically isolated from one another; then removing a first portion of the adhesive that covers the pad, thereby forming a gap between the conductive trace and the pad and exposing the pad such that the adhesive covers none of the pad and a second portion of the adhesive remains intact and contacts and is sandwiched between the conductive trace and the chip; and then forming a connection joint that contacts and electrically connects the conductive trace and the pad.

22. The method of claim 21, wherein removing the first portion of the adhesive includes applying a plasma that etches the adhesive, thereby removing substantially all of the adhesive that covers the pad.

23. The method of claim 21, wherein removing the first portion of the adhesive includes applying a laser that ablates the adhesive, thereby removing substantially all of the adhesive that covers the pad and is not sandwiched between the conductive trace and the pad, and then applying a plasma that etches the adhesive, thereby removing substantially all of the adhesive that is sandwiched between the conductive trace and the pad.

24. The method of claim 21, wherein forming the connection joint includes depositing the connection joint on the conductive trace and the pad, and the connection joint is an electroplated metal, an electrolessly plated metal, a ball bond, solder or conductive adhesive.

25. The method of claim 21, wherein the forming the connection joint includes advancing the conductive trace towards the pad and welding the conductive trace to the pad, and the welding is performed by thermocompression bonding, thermosonic bonding or ultrasonic bonding.

26. The method of claim 21, wherein the adhesive is coplanar with and adjacent to a surface of the conductive trace that overlaps and faces away from the pad after mechanically attaching the conductive trace to the chip and before removing the first portion of the adhesive.

27. The method of claim 21, wherein the adhesive contacts a surface of the conductive trace that overlaps and faces towards the pad and opposing peripheral sidewalls of the conductive trace that overlap the pad after mechanically attaching the conductive trace to the chip and before removing the first portion of the adhesive.

28. The method of claim 21, wherein the connection joint fills substantially all of the gap.

29. The method of claim 21, wherein the connection joint contacts a surface of the conductive trace that overlaps and faces away from the pad.

30. The method of claim 21, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

31. A method of connecting a conductive trace to a semiconductor chip, comprising:

providing a semiconductor chip with upper and lower surfaces, wherein the upper surface includes a conductive pad;

providing a conductive trace with first and second surfaces that are opposite one another and a peripheral sidewall between the first and second surfaces; then disposing an insulative adhesive between the conductive trace and the chip, thereby mechanically attaching the conductive trace to the chip such that the first and second surfaces and the peripheral sidewall overlap the pad, the first surface faces away from the pad, the second surface faces towards the pad, the adhesive contacts the second surface, the peripheral sidewall and the pad, is sandwiched between the second surface and the pad and covers all of the pad, and the conductive trace and the pad are electrically isolated from one another; then removing a first portion of the adhesive that covers the pad and contacts portions of the second surface and the peripheral sidewall that overlap the pad such the adhesive covers none of the pad and a second portion of the adhesive remains intact and contacts and is sandwiched between the conductive trace and the chip; and then forming a connection joint that contacts and electrically connects the conductive trace and the pad.

32. The method of claim 31, wherein removing the first portion of the adhesive includes applying a plasma that etches the adhesive, thereby removing substantially all of the adhesive that covers the pad.

33. The method of claim 31, wherein removing the first portion of the adhesive includes applying a laser that ablates the adhesive, thereby removing substantially all of the adhesive that covers the pad and is not sandwiched between the conductive trace and the pad, and then applying a plasma that etches the adhesive, thereby removing substantially all of the adhesive that is sandwiched between the conductive trace and the pad.

34. The method of claim 31, wherein forming the connection joint includes depositing the connection joint on the conductive trace and the pad, and the connection joint is an electroplated metal, an electrolessly plated metal, a ball bond, solder or conductive adhesive.

35. The method of claim 31, wherein the forming the connection joint includes advancing the conductive trace towards the pad and welding the conductive trace to the pad, and the welding is performed by thermocompression bonding, thermosonic bonding or ultrasonic bonding.

36. The method of claim 31, wherein the adhesive is coplanar with and adjacent to the first surface of the conductive trace after mechanically attaching the conductive trace to the chip and before removing the first portion of the adhesive.

37. The method of claim 31, wherein the adhesive contacts substantially none of a portion of the first surface that overlaps the pad and substantially all of the portions of the second surface and the peripheral sidewall that overlap the pad after mechanically attaching the conductive trace to the chip and before removing the first portion of the adhesive.

38. The method of claim 31, wherein the conductive trace overlaps a center of the pad after mechanically attaching the conductive trace to the chip.

39. The method of claim 31, wherein the connection joint contacts the first surface of the conductive trace.

40. The method of claim 31, wherein the connection joint contacts the first and second surfaces and the peripheral sidewall of the conductive trace.

41. A method of connecting a conductive trace to a semiconductor chip, comprising:
   providing a semiconductor chip with upper and lower surfaces, wherein the upper surface includes a conductive pad;
   providing a conductive trace with first and second surfaces that are opposite one another and peripheral sidewalls that are opposite one another and between the first and second surfaces; then
   disposing an insulative adhesive between the conductive trace and the chip, thereby mechanically attaching the conductive trace to the chip such that the first and second surfaces and the peripheral sidewalls overlap the pad, the first surface faces away from the pad, the second surface faces towards the pad, the adhesive contacts the second surface, the peripheral sidewalls and the pad, is sandwiched between the second surface and the pad and covers all of the pad, and the conductive trace and the pad are electrically isolated from one another; then
   removing a first portion of the adhesive that covers the pad and contacts portions of the second surface and the peripheral sidewalls that overlap the pad such the adhesive covers none of the pad and a second portion of the adhesive remains intact and contacts and is sandwiched between the conductive trace and the chip; and then forming a connection joint that contacts and electrically connects the conductive trace and the pad.

42. The method of claim 41, wherein removing the first portion of the adhesive includes applying a plasma that etches the adhesive, thereby removing substantially all of the adhesive that covers the pad.

43. The method of claim 41, wherein removing the first portion of the adhesive includes applying a laser that ablates the adhesive, thereby removing substantially all of the adhesive that covers the pad and is not sandwiched between the conductive trace and the pad, and then applying a plasma that etches the adhesive, thereby removing substantially all of the adhesive that is sandwiched between the conductive trace and the pad.

44. The method of claim 41, wherein forming the connection joint includes depositing the connection joint on the conductive trace and the pad, and the connection joint is an electroplated metal, an electrolessly plated metal, a ball bond, solder or conductive adhesive.

45. The method of claim 41, wherein the forming the connection joint includes advancing the conductive trace towards the pad and welding the conductive trace to the pad, and the welding is performed by thermocompression bonding, thermosonic bonding or ultrasonic bonding.

46. The method of claim 41, wherein the adhesive is coplanar with and adjacent to the first surface of the conductive trace after mechanically attaching the conductive trace to the chip and before removing the first portion of the adhesive.

47. The method of claim 41, wherein the adhesive contacts substantially none of a portion of the first surface that overlaps the pad and substantially all of the portions of the second surface and the peripheral sidewalls that overlap the pad after mechanically attaching the conductive trace to the chip and before removing the first portion of the adhesive.

48. The method of claim 41, wherein the conductive trace overlaps a center of the pad after mechanically attaching the conductive trace to the chip.

49. The method of claim 41, wherein the connection joint contacts the first surface of the conductive trace.

50. The method of claim 41, wherein the connection joint contacts the first and second surfaces and the peripheral sidewalls of the conductive trace.

51. A method of connecting a conductive trace to a semiconductor chip, comprising:
   providing a semiconductor chip with upper and lower surfaces, wherein the upper surface includes a conductive pad;
   providing a conductive trace; then
   providing an insulative adhesive that contacts and is sandwiched between the conductive trace and the pad and covers all of the pad; then
   removing all of the adhesive that covers the pad, thereby forming a gap between the conductive trace and the pad and exposing the pad while the adhesive contacts and is sandwiched between the conductive trace and the chip; and then
   forming a connection joint that contacts and electrically connects the conductive trace and the pad.

52. The method of claim 51, wherein removing the adhesive consists of applying a plasma etch to the adhesive.

53. The method of claim 51, wherein removing the adhesive consists of applying laser ablation to the adhesive and then a plasma etch to the adhesive.

54. The method of claim 51, wherein removing the adhesive exposes a surface of the conductive trace that faces towards and overlaps the pad.

55. The method of claim 51, wherein removing the adhesive exposes a peripheral sidewall of the conductive trace that is orthogonal to and overlaps the pad.

56. The method of claim 51, wherein removing the adhesive exposes opposing peripheral sidewalls of the conductive trace that are orthogonal to and overlap the pad.

57. The method of claim 51, wherein removing the adhesive exposes a surface of the conductive trace that faces towards and overlaps the pad and opposing peripheral sidewalls of the conductive trace that are orthogonal to and overlap the pad.

58. The method of claim 51, wherein the adhesive is silicone, polyimide or epoxy.

59. The method of claim 51, wherein the adhesive contacts and is sandwiched between the conductive trace and the chip after forming the connection joint.

60. The method of claim 51, wherein the adhesive is a single-piece adhesive.

61. A method of connecting a conductive trace to a semiconductor chip, comprising:
   providing a semiconductor chip with upper and lower surfaces, wherein the upper surface includes a conductive pad;
   attaching a conductive trace to a metal base; then
   disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another; then etching the metal base, thereby removing a portion of the metal base that overlaps the pad and exposing the conductive trace and the adhesive; then removing the adhesive that covers the pad, thereby forming a gap between the conductive trace and the pad and exposing the pad while the adhesive contacts and is sandwiched between the conductive trace and the chip; and then forming a connection joint that contacts and electrically connects the conductive trace and the pad.

62. The method of claim 61, wherein removing the adhesive includes applying a plasma that etches the adhesive, thereby removing substantially all of the adhesive that covers the pad.

63. The method of claim 61, wherein removing the adhesive includes applying a laser that ablates the adhesive, thereby removing substantially all of the adhesive that covers the pad and is not sandwiched between the conductive trace and the pad, and then applying a plasma that etches the adhesive, thereby removing substantially all of the adhesive that is sandwiched between the conductive trace and the pad.

64. The method of claim 61, wherein forming the connection joint includes depositing the connection joint on the conductive trace and the pad, and the connection joint is an electroplated metal, an electrolessly plated metal, a ball bond, solder or conductive adhesive.

65. The method of claim 61, wherein the forming the connection joint includes advancing the conductive trace towards the pad and welding the conductive trace to the pad, and the welding is performed by thermocompression bonding, thermosonic bonding or ultrasonic bonding.

66. The method of claim 61, wherein the adhesive is coplanar with and adjacent to a surface of the conductive trace that overlaps and faces away from the pad after mechanically attaching the conductive trace to the chip and before removing the adhesive.

67. The method of claim 61, wherein the adhesive contacts a surface of the conductive trace that overlaps and faces towards the pad and opposing peripheral sidewalls of the conductive trace that overlap the pad after mechanically attaching the conductive trace to the chip and before removing the adhesive.

68. The method of claim 61, wherein the connection joint fills substantially all of the gap.

69. The method of claim 61, wherein the connection joint contacts a surface of the conductive trace that overlaps and faces away from the pad.

70. The method of claim 61, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

71. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another; then anisotropically removing a first portion of the adhesive that overlaps the pad such that the adhesive still contacts and is sandwiched between the conductive trace and the pad; then isotropically removing a second portion of the adhesive that overlaps the pad such that the adhesive no longer contacts and is sandwiched between the conductive trace and the pad; and then forming a connection joint that contacts and electrically connects the conductive trace and the pad.

72. The method of claim 71, wherein disposing the adhesive includes contacting the adhesive to the conductive trace and the chip and then curing the adhesive.

73. The method of claim 71, wherein disposing the adhesive includes contacting the adhesive to an insulative base and the chip such that the adhesive contacts and is sandwiched between the insulative base and the pad.

74. The method of claim 71, wherein anisotropically removing the first portion of the adhesive includes applying a laser that ablates the adhesive.

75. The method of claim 71, wherein isotropically removing the second portion of the adhesive includes applying a plasma that etches the adhesive.

76. The method of claim 71, wherein forming the connection joint includes depositing the connection joint on the conductive trace and the pad.

77. The method of claim 76, wherein the connection joint is an electroplated metal, an electrolessly plated metal, a ball bond, solder or conductive adhesive.

78. The method of claim 71, wherein the forming the connection joint includes welding the conductive trace to the pad.

79. The method of claim 78, wherein the welding is performed by thermocompression bonding, thermosonic bonding or ultrasonic bonding.

80. The method of claim 71, wherein the adhesive is a thermosetting or thermoplastic adhesive.

81. The method of claim 71, wherein the adhesive is silicone, polyimide or epoxy.

82. The method of claim 71, wherein the adhesive is coplanar with and adjacent to a surface of the conductive trace that overlaps and faces away from the pad after mechanically attaching the conductive trace to the chip and before anisotropically removing the first portion of the adhesive.

83. The method of claim 71, wherein the adhesive contacts and is sandwiched between the conductive trace and the chip after isotropically removing the second portion of the adhesive.

84. The method of claim 71, wherein the conductive trace overlaps a center of the pad after mechanically attaching the conductive trace to the chip.

85. The method of claim 71, wherein the conductive trace does not overlap a center of the pad after mechanically attaching the conductive trace to the chip.

86. The method of claim 71, wherein the conductive trace overlaps only one peripheral edge of the pad after mechanically attaching the conductive trace to the chip.

87. The method of claim 71, wherein the conductive trace overlaps only two peripheral edges of the pad, and the two peripheral edges are opposite one another, after mechanically attaching the conductive trace to the chip.

88. The method of claim 71, wherein the conductive trace overlaps only three peripheral edges of the pad, and two of the three peripheral edges are opposite one another, after mechanically attaching the conductive trace to the chip.

89. The method of claim 71, wherein the connection joint contacts a surface of the conductive trace that overlaps and faces away from the pad.

90. The method of claim 71, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

91. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps the pad, the adhesive contacts and is sandwiched between the conductive trace and the pad and covers all of the pad, and the conductive trace and the pad are electrically isolated from one another; then anisotropically removing a first portion of the adhesive such that the adhesive covers some but not all of the pad, the adhesive contacts and is sandwiched between the conductive trace and the pad, and the pad is partially exposed; then isotropically removing a second portion of the adhesive such that adhesive covers none of the pad, the adhesive contacts and is sandwiched between the conductive trace and the chip, and the pad is fully exposed; and then forming a connection joint that contacts and electrically connects the conductive trace and the pad.

92. The method of claim 91, wherein anisotropically removing the first portion of the adhesive includes applying a laser that ablates the adhesive, and isotropically removing the second portion of the adhesive includes applying a plasma that etches the adhesive.

93. The method of claim 91, wherein anisotropically removing the first portion of the adhesive includes applying a laser that ablates the adhesive, thereby removing substantially all of the adhesive that covers the pad and is not sandwiched between the conductive trace and the pad, and isotropically removing the second portion of the adhesive includes applying a plasma that etches the adhesive, thereby removing substantially all of the adhesive that is sandwiched between the conductive trace and the pad.

94. The method of claim 91, wherein forming the connection joint includes depositing the connection joint on the conductive trace and the pad, and the connection joint is an electroplated metal, an electrolessly plated metal, a ball bond, solder or conductive adhesive.

95. The method of claim 91, wherein the forming the connection joint includes advancing the conductive trace towards the pad and welding the conductive trace to the pad, and the welding is performed by thermocompression bonding, thermosonic bonding or ultrasonic bonding.

96. The method of claim 91, wherein the adhesive is coplanar with and adjacent to a surface of the conductive trace that overlaps and faces away from the pad after mechanically attaching the conductive trace to the chip and before anisotropically removing the first portion of the adhesive.

97. The method of claim 91, wherein the adhesive contacts a surface of the conductive trace that overlaps and faces towards the pad and opposing peripheral sidewalls of the conductive trace that overlap the pad after mechanically attaching the conductive trace to the chip and before anisotropically removing the first portion of the adhesive.

98. The method of claim 91, wherein the conductive trace overlaps a center of the pad after mechanically attaching the conductive trace to the chip.

99. The method of claim 91, wherein the connection joint contacts a surface of the conductive trace that overlaps and faces away from the pad.

100. The method of claim 91, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

101. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another; then removing most or all of the adhesive between the conductive trace and the pad; and then forming a connection joint that contacts and electrically connects the conductive trace and the pad.

102. The method of claim 101, wherein disposing the adhesive includes contacting the adhesive to the conductive trace and the chip and then curing the adhesive.

103. The method of claim 101, wherein disposing the adhesive includes contacting the adhesive to an insulative base and the chip such that the adhesive contacts and is sandwiched between the insulative base and the pad.

104. The method of claim 101, wherein removing the adhesive includes applying a plasma etch, thereby forming an opening in the adhesive that exposes the pad.

105. The method of claim 101, wherein removing the adhesive includes applying a plasma etch after forming an opening in the adhesive by laser ablation that exposes the pad.

106. The method of claim 101, wherein forming the connection joint includes depositing the connection joint on the conductive trace and the pad.

107. The method of claim 106, wherein the connection joint is an electroplated metal, an electrolessly plated metal, a ball bond, solder or conductive adhesive.

108. The method of claim 101, wherein the forming the connection joint includes welding the conductive trace to the pad.

109. The method of claim 108, wherein the welding is performed by thermocompression bonding, thermosonic bonding or ultrasonic bonding.

110. The method of claim 101, wherein the adhesive is a thermosetting or thermoplastic adhesive.

111. The method of claim 101, wherein the adhesive is silicone, polyimide or epoxy.

112. The method of claim 101, wherein the adhesive is coplanar with and adjacent to a surface of the conductive trace that overlaps and faces away from the pad after mechanically attaching the conductive trace to the chip and before removing the adhesive.

113. The method of claim 101, wherein the adhesive contacts and is sandwiched between the conductive trace and the chip after removing the adhesive between the conductive trace and the pad.

114. The method of claim 101, wherein the conductive trace overlaps a center of the pad after mechanically attaching the conductive trace to the chip.

115. The method of claim 101, wherein the conductive trace does not overlap a center of the pad after mechanically attaching the conductive trace to the chip.

116. The method of claim 101, wherein the conductive trace overlaps only one peripheral edge of the pad after mechanically attaching the conductive trace to the chip.

117. The method of claim 101, wherein the conductive trace overlaps only two peripheral edges of the pad, and the two peripheral edges are opposite one another, after mechanically attaching the conductive trace to the chip.

118. The method of claim 101, wherein the conductive trace overlaps only three peripheral edges of the pad, and two of the three peripheral edges are opposite one another, after mechanically attaching the conductive trace to the chip.

119. The method of claim 101, wherein the connection joint contacts a surface of the conductive trace that overlaps and faces away from the pad.

120. The method of claim 101, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

121. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps and is spaced from the pad, the adhesive contacts and is sandwiched between the conductive trace and the pad and covers all of the pad, and the conductive trace and the pad are electrically isolated from one another; then removing a first portion of the adhesive that covers a portion of the pad, thereby forming a gap between the conductive trace and the pad and exposing the pad such that the gap occupies most or all space between the conductive trace and the pad and a second portion of the adhesive remains intact and contacts and is sandwiched between the conductive trace and the chip; and then forming a connection joint that contacts and electrically connects the conductive trace and the pad.

122. The method of claim 121, wherein removing the first portion of the adhesive includes applying a plasma that etches the adhesive, thereby removing most or all of the adhesive that covers the pad.

123. The method of claim 121, wherein removing the first portion of the adhesive includes applying a laser that ablates the adhesive, thereby removing some or all of the adhesive that covers the pad and is not sandwiched between the conductive trace and the pad, and then applying a plasma that etches the adhesive, thereby removing most or all of the adhesive that is sandwiched between the conductive trace and the pad.

124. The method of claim 121, wherein forming the connection joint includes depositing the connection joint on the conductive trace and the pad, and the connection joint is an electroplated metal, an electrolessly plated metal, a ball bond, solder or conductive adhesive.

125. The method of claim 121, wherein the forming the connection joint includes advancing the conductive trace towards the pad and welding the conductive trace to the pad, and the welding is performed by thermocompression bonding, thermosonic bonding or ultrasonic bonding.

126. The method of claim 121, wherein the adhesive is coplanar with and adjacent to a surface of the conductive trace that overlaps and faces away from the pad after mechanically attaching the conductive trace to the chip and before removing the first portion of the adhesive.

127. The method of claim 121, wherein the adhesive contacts a surface of the conductive trace that overlaps and faces towards the pad and opposing peripheral sidewalls of the conductive trace that overlap the pad after mechanically attaching the conductive trace to the chip and before removing the first portion of the adhesive.

128. The method of claim 121, wherein the connection joint fills substantially all of the gap.

129. The method of claim 121, wherein the connection joint contacts a surface of the conductive trace that overlaps and faces away from the pad.

130. The method of claim 121, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

131. A method of connecting a conductive trace to a semiconductor chip, comprising:

providing a semiconductor chip with upper and lower surfaces, wherein the upper surface includes a conductive pad;

providing a conductive trace with first and second surfaces that are opposite one another and a peripheral sidewall between the first and second surfaces; then disposing an insulative adhesive between the conductive trace and the chip, thereby mechanically attaching the conductive trace to the chip such that the first and second surfaces and the peripheral sidewall overlap the pad, the first surface faces away from the pad, the second surface faces towards the pad, the adhesive contacts the second surface, the peripheral sidewall and the pad, is sandwiched between the second surface and the pad and covers all of the pad, and the conductive trace and the pad are electrically isolated from one another; then removing a first portion of the adhesive that covers substantially all of the pad and contacts substantially all of portions of the second surface and the peripheral sidewall that overlap the pad such the adhesive covers substantially none of the pad and a second portion of the adhesive remains intact and contacts and is sandwiched between the conductive trace and the chip; and then forming a connection joint that contacts and electrically connects the conductive trace and the pad.

132. The method of claim 131, wherein removing the first portion of the adhesive includes applying a plasma that etches the adhesive, thereby removing substantially all of the adhesive that covers the pad.

133. The method of claim 131, wherein removing the first portion of the adhesive includes applying a laser that ablates the adhesive, thereby removing some or all of the adhesive that covers the pad and is not sandwiched between the conductive trace and the pad, and then applying a plasma that etches the adhesive, thereby removing most or all of the adhesive that is sandwiched between the conductive trace and the pad.

134. The method of claim 131, wherein forming the connection joint includes depositing the connection joint on the conductive trace and the pad, and the connection joint is an electroplated metal, an electrolessly plated metal, a ball bond, solder or conductive adhesive.

135. The method of claim 131, wherein the forming the connection joint includes advancing the conductive trace towards the pad and welding the conductive trace to the pad, and the welding is performed by thermocompression bonding, thermosonic bonding or ultrasonic bonding.

136. The method of claim 131, wherein the adhesive is coplanar with and adjacent to the first surface of the conductive trace after mechanically attaching the conductive trace to the chip and before removing the first portion of the adhesive.

137. The method of claim 131, wherein the adhesive contacts substantially none of a portion of the first surface that overlaps the pad and substantially all of the portions of the second surface and the peripheral sidewall that overlap the pad after mechanically attaching the conductive trace to the chip and before removing the first portion of the adhesive.

138. The method of claim 131, wherein the conductive trace overlaps a center of the pad after mechanically attaching the conductive trace to the chip.

139. The method of claim 131, wherein the connection joint contacts the first surface of the conductive trace.

140. The method of claim 131, wherein the connection joint contacts the first and second surfaces and the peripheral sidewall of the conductive trace.

141. A method of connecting a conductive trace to a semiconductor chip, comprising:
providing a semiconductor chip with upper and lower surfaces, wherein the upper surface includes a conductive pad;
providing a conductive trace with first and second surfaces that are opposite one another and peripheral sidewalls that are opposite one another and between the first and second surfaces; then
disposing an insulative adhesive between the conductive trace and the chip, thereby mechanically attaching the conductive trace to the chip such that the first and second surfaces and the peripheral sidewalls overlap the pad, the first surface faces away from the pad, the second surface faces towards the pad, the adhesive contacts the second surface, the peripheral sidewalls and the pad, is sandwiched between the second surface and the pad and covers all of the pad, and the conductive trace and the pad are electrically isolated from one another; then
removing a first portion of the adhesive that covers substantially all of the pad and contacts substantially all of portions of the second surface and the peripheral sidewalls that overlap the pad such the adhesive covers substantially none of the pad and a second portion of the adhesive remains intact and contacts and is sandwiched between the conductive trace and the chip; and then forming a connection joint that contacts and electrically connects the conductive trace and the pad.

142. The method of claim 141, wherein removing the first portion of the adhesive includes applying a plasma that etches the adhesive, thereby removing substantially all of the adhesive that covers the pad.

143. The method of claim 141, wherein removing the first portion of the adhesive includes applying a laser that ablates the adhesive, thereby removing some or all of the adhesive that covers the pad and is not sandwiched between the conductive trace and the pad, and then applying a plasma that etches the adhesive, thereby removing most or all of the adhesive that is sandwiched between the conductive trace and the pad.

144. The method of claim 141, wherein forming the connection joint includes depositing the connection joint on the conductive trace and the pad, and the connection joint is an electroplated metal, an electrolessly plated metal, a ball bond, solder or conductive adhesive.

145. The method of claim 141, wherein the forming the connection joint includes advancing the conductive trace towards the pad and welding the conductive trace to the pad, and the welding is performed by thermocompression bonding, thermosonic bonding or ultrasonic bonding.

146. The method of claim 141, wherein the adhesive is coplanar with and adjacent to the first surface of the conductive trace after mechanically attaching the conductive trace to the chip and before removing the first portion of the adhesive.

147. The method of claim 141, wherein the adhesive contacts substantially none of a portion of the first surface that overlaps the pad and substantially all of the portions of the second surface and the peripheral sidewalls that overlap the pad after mechanically attaching the conductive trace to the chip and before removing the first portion of the adhesive.

148. The method of claim 141, wherein the conductive trace overlaps a center of the pad after mechanically attaching the conductive trace to the chip.

149. The method of claim 141, wherein the connection joint contacts the first surface of the conductive trace.

150. The method of claim 141, wherein the connection joint contacts the first and second surfaces and the peripheral sidewalls of the conductive trace.

151. A method of connecting a conductive trace to a semiconductor chip, comprising:
providing a semiconductor chip with upper and lower surfaces, wherein the upper surface includes a conductive pad;
providing a conductive trace; then providing an insulative adhesive that contacts and is sandwiched between the conductive trace and the pad and covers all of the pad; then
removing substantially all of the adhesive between the conductive trace and the pad, thereby forming a gap between the conductive trace and the pad and exposing the pad while the adhesive contacts and is sandwiched between the conductive trace and the chip; and then
forming a connection joint that contacts and electrically connects the conductive trace and the pad.

152. The method of claim 151, wherein removing the adhesive consists of applying a plasma etch to the adhesive.

153. The method of claim 151, wherein removing the adhesive consists of applying laser ablation to the adhesive and then a plasma etch to the adhesive.

154. The method of claim 151, wherein removing the adhesive exposes a surface of the conductive trace that faces towards and overlaps the pad.

155. The method of claim 151, wherein removing the adhesive exposes a peripheral sidewall of the conductive trace that is orthogonal to and overlaps the pad.

156. The method of claim 151, wherein removing the adhesive exposes opposing peripheral sidewalls of the conductive trace that are orthogonal to and overlap the pad.

157. The method of claim 151, wherein removing the adhesive exposes a surface of the conductive trace that faces towards and overlaps the pad and opposing peripheral sidewalls of the conductive trace that are orthogonal to and overlap the pad.

158. The method of claim 151, wherein the adhesive is silicone, polyimide or epoxy.

159. The method of claim 151, wherein the adhesive contacts and is sandwiched between the conductive trace and the chip after forming the connection joint.

160. The method of claim 151, wherein the adhesive is a single-piece adhesive.

161. A method of connecting a conductive trace to a semiconductor chip, comprising:

providing a semiconductor chip with upper and lower surfaces, wherein the upper surface includes a conductive pad;

attaching a conductive trace to a metal base; then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another; then etching the metal base, thereby removing a portion of the metal base that overlaps the pad and exposing the conductive trace and the adhesive; then removing substantially all of the adhesive between the conductive trace and the pad, thereby forming a gap between the conductive trace and the pad and exposing the pad while the adhesive contacts and is sandwiched between the conductive trace and the chip; and then forming a connection joint that contacts and electrically connects the conductive trace and the pad.

162. The method of claim 161, wherein removing the adhesive includes applying a plasma that etches the adhesive, thereby removing substantially all of the adhesive that covers the pad.

163. The method of claim 161, wherein removing the adhesive includes applying a laser that ablates the adhesive, thereby removing some or all of the adhesive that covers the pad and is not sandwiched between the conductive trace and the pad, and then applying a plasma that etches the adhesive, thereby removing most or all of the adhesive that is sandwiched between the conductive trace and the pad.

164. The method of claim 161, wherein forming the connection joint includes depositing the connection joint on the conductive trace and the pad, and the connection joint is an electroplated metal, an electrolessly plated metal, a ball bond, solder or conductive adhesive.

165. The method of claim 161, wherein the forming the connection joint includes advancing the conductive trace towards the pad and welding the conductive trace to the pad, and the welding is performed by thermocompression bonding, thermosonic bonding or ultrasonic bonding.

166. The method of claim 161, wherein the adhesive is coplanar with and adjacent to a surface of the conductive trace that overlaps and faces away from the pad after mechanically attaching the conductive trace to the chip and before removing the adhesive.

167. The method of claim 161, wherein the adhesive contacts a surface of the conductive trace that overlaps and faces towards the pad and opposing peripheral sidewalls of the conductive trace that overlap the pad after mechanically attaching the conductive trace to the chip and before removing the adhesive.

168. The method of claim 161, wherein the connection joint fills substantially all of the gap.

169. The method of claim 161, wherein the connection joint contacts a surface of the conductive trace that overlaps and faces away from the pad.

170. The method of claim 161, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

171. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps the pad, the adhesive contacts and is sandwiched between the conductive trace and the pad, and the conductive trace and the pad are electrically isolated from one another; then anisotropically removing a first portion of the adhesive that overlaps the pad such that most or all of the adhesive that contacts and is sandwiched between the conductive trace and the pad remains intact; then isotropically removing a second portion of the adhesive that overlaps the pad such that little or none of the adhesive that contacts and is sandwiched between the conductive trace and the pad remains intact; and then forming a connection joint that contacts and electrically connects the conductive trace and the pad.

172. The method of claim 171, wherein disposing the adhesive includes contacting the adhesive to the conductive trace and the chip and then curing the adhesive.

173. The method of claim 171, wherein disposing the adhesive includes contacting the adhesive to an insulative base and the chip such that the adhesive contacts and is sandwiched between the insulative base and the pad.

174. The method of claim 171, wherein anisotropically removing the first portion of the adhesive includes applying a laser that ablates the adhesive.

175. The method of claim 171, wherein isotropically removing the second portion of the adhesive includes applying a plasma that etches the adhesive.

176. The method of claim 171, wherein forming the connection joint includes depositing the connection joint on the conductive trace and the pad.

177. The method of claim 176, wherein the connection joint is an electroplated metal, an electrolessly plated metal, a ball bond, solder or conductive adhesive.

178. The method of claim 171, wherein the forming the connection joint includes welding the conductive trace to the pad.

179. The method of claim 178, wherein the welding is performed by thermocompression bonding, thermosonic bonding or ultrasonic bonding.

180. The method of claim 171, wherein the adhesive is a thermosetting or thermoplastic adhesive.

181. The method of claim 171, wherein the adhesive is silicone, polyimide or epoxy.

182. The method of claim 171, wherein the adhesive is coplanar with and adjacent to a surface of the conductive trace that overlaps and faces away from the pad after mechanically attaching the conductive trace to the chip and before anisotropically removing the first portion of the adhesive.

183. The method of claim 171, wherein the adhesive contacts and is sandwiched between the conductive trace and the chip after isotropically removing the second portion of the adhesive.

184. The method of claim 171, wherein the conductive trace overlaps a center of the pad after mechanically attaching the conductive trace to the chip.

185. The method of claim 171, wherein the conductive trace does not overlap a center of the pad after mechanically attaching the conductive trace to the chip.

186. The method of claim 171, wherein the conductive trace overlaps only one peripheral edge of the pad after mechanically attaching the conductive trace to the chip.

187. The method of claim 171, wherein the conductive trace overlaps only two peripheral edges of the pad, and the two peripheral edges are opposite one another, after mechanically attaching the conductive trace to the chip.

188. The method of claim 171, wherein the conductive trace overlaps only three peripheral edges of the pad, and two of the three peripheral edges are opposite one another, after mechanically attaching the conductive trace to the chip.

189. The method of claim 171, wherein the connection joint contacts a surface of the conductive trace that overlaps and faces away from the pad.

190. The method of claim 171, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

191. A method of connecting a conductive trace to a semiconductor chip, comprising:

providing a semiconductor chip with upper and lower surfaces, wherein the upper surface includes a conductive pad;

providing a conductive trace; then disposing an insulative adhesive between the conductive trace and the chip, thereby mechanically attaching the conductive trace to the chip such that the conductive trace overlaps the pad, the adhesive contacts and is sandwiched between the conductive trace and the pad and covers all of the pad, and the conductive trace and the pad are electrically isolated from one another; then anisotropically removing a first portion of the adhesive such that the adhesive covers some but not all of the pad, and the adhesive contacts and is sandwiched between the conductive trace and the pad; then isotropically removing a second portion of the adhesive such that adhesive covers little or none of the pad, the adhesive contacts and is sandwiched between the conductive trace and the chip, and the pad is exposed; and then forming a connection joint that contacts and electrically connects the conductive trace and the pad.

192. The method of claim 191, wherein anisotropically removing the first portion of the adhesive includes applying a laser that ablates the adhesive, and isotropically removing the second portion of the adhesive includes applying a plasma that etches the adhesive.

193. The method of claim 191, wherein anisotropically removing the first portion of the adhesive includes applying a laser that ablates the adhesive, thereby removing some or all of the adhesive that covers the pad and is not sandwiched between the conductive trace and the pad, and isotropically removing the second portion of the adhesive includes applying a plasma that etches the adhesive, thereby removing most or all of the adhesive that is sandwiched between the conductive trace and the pad.

194. The method of claim 191, wherein forming the connection joint includes depositing the connection joint on the conductive trace and the pad, and the connection joint is an electroplated metal, an electrolessly plated metal, a ball bond, solder or conductive adhesive.

195. The method of claim 191, wherein the forming the connection joint includes advancing the conductive trace towards the pad and welding the conductive trace to the pad, and the welding is performed by thermocompression bonding, thermosonic bonding or ultrasonic bonding.

196. The method of claim 191, wherein the adhesive is coplanar with and adjacent to a surface of the conductive trace that overlaps and faces away from the pad after mechanically attaching the conductive trace to the chip and before anisotropically removing the first portion of the adhesive.

197. The method of claim 191, wherein the adhesive contacts a surface of the conductive trace that overlaps and faces towards the pad and opposing peripheral sidewalls of the conductive trace that overlap the pad after mechanically attaching the conductive trace to the chip and before anisotropically removing the first portion of the adhesive.

198. The method of claim 191, wherein the conductive trace overlaps a center of the pad after mechanically attaching the conductive trace to the chip.

199. The method of claim 191, wherein the connection joint contacts a surface of the conductive trace that overlaps and faces away from the pad.

200. The method of claim 191, wherein the connection joint contacts a first surface of the conductive trace that overlaps and faces away from the pad, a second surface of the conductive trace that overlaps and faces towards the pad, and opposing peripheral sidewalls of the conductive trace between the first and second surfaces that overlap the pad.

* * * * *

UNITED STATES PATENT AND TRADEMARK OFFICE
CERTIFICATE OF CORRECTION

PATENT NO. : 6,699,780 B1
DATED : March 2, 2004
INVENTOR(S) : Chiang et al.

It is certified that error appears in the above-identified patent and that said Letters Patent is hereby corrected as shown below:

Column 13,
Line 50, change "1A" to -- 11A --.

Column 14,
Line 4, change "1A" to -- 10A --.

Column 22,
Line 35, delete "the" after "wherein".

Column 23,
Line 52, delete "the" after "wherein".

Column 24,
Line 56, delete "the" after "wherein".

Column 25,
Line 58, delete "the" after "wherein".

Column 27,
Line 31, delete "the" after "wherein".

Column 28,
Line 34, delete "the" after "wherein".

Column 29,
Line 56, delete "the" after "wherein".

Column 30,
Line 56, delete "the" after "wherein".

Column 32,
Line 9, delete "the" after "wherein".

Column 33,
Line 16, delete "the" after "wherein".

UNITED STATES PATENT AND TRADEMARK OFFICE
CERTIFICATE OF CORRECTION

PATENT NO. : 6,699,780 B1
DATED : March 2, 2004
INVENTOR(S) : Chiang et al.

It is certified that error appears in the above-identified patent and that said Letters Patent is hereby corrected as shown below:

Column 34,
Line 20, delete "the" after "wherein".
Lines 50-53, "providing an insulative adhesive . . . of the pad; then" is a subparagraph.

Column 35,
Line 58, delete "the" after "wherein".

Column 36,
Line 60, delete "the" after "wherein".

Column 38,
Line 27, delete "the" after "wherein".

Signed and Sealed this

Fifteenth Day of June, 2004

JON W. DUDAS
*Acting Director of the United States Patent and Trademark Office*